US012796247B2

(12) United States Patent
Shim et al.

(10) Patent No.: US 12,796,247 B2
(45) Date of Patent: Nov. 10, 2026

(54) DISPLAY APPARATUS

(71) Applicant: Samsung Display Co., Ltd., Yongin-si (KR)

(72) Inventors: Jongsik Shim, Yongin-si (KR); Sujin Kim, Yongin-si (KR); Minwoo Byun, Yongin-si (KR); Donghwan Jeon, Yongin-si (KR); Minjoo Kim, Yongin-si (KR); Kyonghwan Oh, Yongin-si (KR); Seoni Jeong, Yongin-si (KR); Sungchan Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 358 days.

(21) Appl. No.: 18/405,309

(22) Filed: Jan. 5, 2024

(65) Prior Publication Data

US 2024/0324337 A1 Sep. 26, 2024

(30) Foreign Application Priority Data

Mar. 21, 2023 (KR) ........................ 10-2023-0036938
May 4, 2023 (KR) ........................ 10-2023-0058767

(51) Int. Cl.
*H10K 59/121* (2023.01)
*H10K 59/123* (2023.01)
*H10K 59/131* (2023.01)

(52) U.S. Cl.
CPC ....... *H10K 59/131* (2023.02); *H10K 59/1216* (2023.02); *H10K 59/123* (2023.02)

(58) Field of Classification Search
CPC ............. H10K 59/131; H10K 59/1216; H10K 59/121; H10K 59/123
See application file for complete search history.

(56) References Cited

U.S. PATENT DOCUMENTS

| | | | | |
|---|---|---|---|---|
| 10,263,060 | B2 * | 4/2019 | Noh | H10D 86/421 |
| 10,559,261 | B2 | 2/2020 | Chang et al. | |
| 11,430,849 | B2 | 8/2022 | Park et al. | |
| 11,470,729 | B2 | 10/2022 | Kim et al. | |
| 2008/0309653 | A1 | 12/2008 | Takahashi et al. | |
| 2014/0291636 | A1 | 10/2014 | Kim et al. | |
| 2018/0033849 | A1 * | 2/2018 | Noh | H10D 86/421 |

(Continued)

FOREIGN PATENT DOCUMENTS

| | | |
|---|---|---|
| KR | 10-2008-0029849 | 4/2008 |
| KR | 10-2018-0003707 | 1/2018 |

(Continued)

OTHER PUBLICATIONS

International Search Report corresponding to International Application No. PCT/KR2024/002283, dated Jun. 27, 2024.

*Primary Examiner* — Nikolay K Yushin
(74) *Attorney, Agent, or Firm* — Harness, Dickey & Pierce, P.L.C.

(57) ABSTRACT

A display apparatus includes a first electrode and a second electrode that are spaced apart from each other, a third electrode disposed on the first electrode and overlapping the first electrode and the second electrode, a fourth electrode disposed on the third electrode and overlapping the third electrode, and a fifth electrode disposed on the fourth electrode, overlapping the fourth electrode, and electrically connected to the third electrode.

20 Claims, 52 Drawing Sheets

(56) References Cited

U.S. PATENT DOCUMENTS

| | | | |
|---|---|---|---|
| 2019/0148477 | A1 | 5/2019 | Park et al. |
| 2022/0366849 | A1 | 11/2022 | Lee et al. |
| 2022/0366852 | A1 | 11/2022 | Jeong et al. |
| 2023/0009113 | A1 | 1/2023 | Son et al. |

FOREIGN PATENT DOCUMENTS

| | | |
|---|---|---|
| KR | 10-2018-0078109 | 7/2018 |
| KR | 10-1970570 | 4/2019 |
| KR | 10-2066096 | 2/2020 |
| KR | 10-2020-0077677 | 7/2020 |
| KR | 10-2279392 | 7/2021 |
| KR | 10-2022-0014366 | 2/2022 |
| KR | 10-2414276 | 6/2022 |
| KR | 10-2022-0155541 | 11/2022 |
| KR | 10-2023-0009249 | 1/2023 |
| KR | 10-2486663 | 1/2023 |

* cited by examiner

DISPLAY APPARATUS

CROSS-REFERENCE TO RELATED APPLICATION(S)

This application claims priority under 35 U.S.C. § 119 to Korean Patent Application No. 10-2023-0036938, filed on Mar. 21, 2023, and Korean Patent Application No. 10-2023-0058767, filed on May 4, 2023, in the Korean Intellectual Property Office, the entire contents of which are incorporated herein by reference.

BACKGROUND

1. Technical Field

One or more embodiments relate to a pixel and a display apparatus including the pixel.

2. Description of the Related Art

Recently, display apparatuses have been diversified in usage. As the display apparatuses become thinner and lighter, the range of usage of the display apparatuses has become widespread.

As display apparatuses are used in various ways, various methods may be used to design the shapes of the display apparatuses, and functions, which are associated or linked to a display apparatus, have increased.

SUMMARY

One or more embodiments include a display apparatus capable of improving display quality.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a first electrode and a second electrode that are spaced apart from each other, a third electrode disposed on the first electrode and overlapping the first electrode and the second electrode, a fourth electrode disposed on the third electrode and overlapping the third electrode, and a fifth electrode disposed on the fourth electrode, overlapping the fourth electrode, and electrically connected to the third electrode.

In an embodiment, the first electrode may be connected to a first driving voltage line providing a voltage of a first level, and the second electrode may be connected to a second driving voltage line providing a voltage of a second level lower than the first level.

In an embodiment, the display apparatus may further include a thin-film transistor including a semiconductor layer and a gate electrode, and the third electrode may be connected to the semiconductor layer of the thin-film transistor.

In an embodiment, the semiconductor layer of the thin-film transistor may be disposed on a layer between the third electrode and the fourth electrode.

In an embodiment, an area of the first electrode overlapping the third electrode may be different from an area of the second electrode overlapping the third electrode.

In an embodiment, the display apparatus may further include a sixth electrode spaced apart from the first electrode, and electrically connected to the fourth electrode, the sixth electrode and the first electrode disposed on a same layer, and the third electrode may overlap the sixth electrode.

In an embodiment, the sixth electrode may be connected to the gate electrode of the thin-film transistor.

According to one or more embodiments, a display apparatus may include a substrate including a first circuit area in which a pixel circuit of a first pixel is arranged and a second circuit area in which a pixel circuit of a second pixel is arranged, a first electrode, a second electrode, and a third electrode that are arranged in the first circuit area of the substrate and spaced apart from each other, a fourth electrode disposed on the first electrode and overlapping the first electrode, the second electrode, and the third electrode, a fifth electrode disposed on the fourth electrode, overlapping the fourth electrode, and electrically connected to the first electrode, and a sixth electrode disposed on the fifth electrode, overlapping the fifth electrode, and electrically connected to the fourth electrode.

In an embodiment, the second electrode may be connected to a first driving voltage line providing a voltage of a first level, and the third electrode may be connected to a second driving voltage line providing a voltage of a second level lower than the first level.

In an embodiment, the display apparatus may further include a thin-film transistor including a semiconductor layer and a gate electrode, the first electrode may be connected to the gate electrode of the thin-film transistor, and the fourth electrode may be connected to the semiconductor layer of the thin-film transistor.

In an embodiment, the semiconductor layer of the thin-film transistor may be disposed on a layer between the fourth electrode and the fifth electrode.

In an embodiment, an area of the second electrode overlapping the fourth electrode may be different from an area of the third electrode overlapping the fourth electrode.

In an embodiment, the display apparatus may further include a seventh electrode and an eighth electrode that are arranged in the second circuit area of the substrate and spaced apart from each other, a ninth electrode disposed on the seventh electrode and overlapping the seventh electrode and the eighth electrode, a tenth electrode disposed on the ninth electrode, overlapping the ninth electrode, and electrically connected to the seventh electrode, and an eleventh electrode disposed on the tenth electrode, overlapping the tenth electrode, and electrically connected to the ninth electrode.

In an embodiment, the seventh electrode may be connected to the second electrode, and the eighth electrode may be connected to the third electrode.

In an embodiment, the ninth electrode and the fourth electrode may be disposed on a same layer, the tenth electrode and the fifth electrode may be disposed on a same layer, and the eleventh electrode and the sixth electrode may be disposed on a same layer.

In an embodiment, an area of the seventh electrode overlapping the ninth electrode may be different from an area of the second electrode overlapping the fourth electrode, and an area of the eighth electrode overlapping the ninth electrode may be different from an area of the third electrode overlapping the fourth electrode.

According to one or more embodiments, a display apparatus may include a plurality of pixels, wherein each of the plurality of pixels includes a light-emitting diode including a pixel electrode and an opposite electrode overlapping the pixel electrode, a driving transistor including a semiconductor layer including a first end portion electrically connected to a first driving voltage line and a second end portion electrically connected to the pixel electrode, a first capacitor electrically connected to a gate electrode of the driving transistor and the second end portion of the semiconductor layer of the driving transistor, a second capacitor electrically connected to the first driving voltage line and the second end portion of the semiconductor layer of the driving transistor, and a third capacitor electrically connected to a second driving voltage line and the second end portion of the semiconductor layer of the driving transistor, wherein the second driving voltage line may be electrically connected to the opposite electrode, wherein each of the plurality of pixels further includes at least one of a first control transistor and a second control transistor, the first control transistor that controls an electrical connection of the second capacitor between the first capacitor and the first driving voltage line, the second control transistor that controls an electrical connection of the third capacitor between the first capacitor and the second driving voltage line.

In an embodiment, the plurality of pixels may include a first pixel emitting light of a first color and a second pixel emitting light of a second color, a capacitance of the first capacitor of the first pixel may be different from a capacitance of the first capacitor of the second pixel, a capacitance of the second capacitor of the first pixel may be different from a capacitance of the second capacitor of the second pixel, and the capacitance of the third capacitor of the first pixel may be different from a capacitance of the third capacitor of the second pixel.

In an embodiment, at least one of the second capacitor and the third capacitor may include a plurality of sub-capacitors connected in series.

In an embodiment, at least one of the second capacitor and the third capacitor may include a plurality of sub-capacitors connected in parallel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
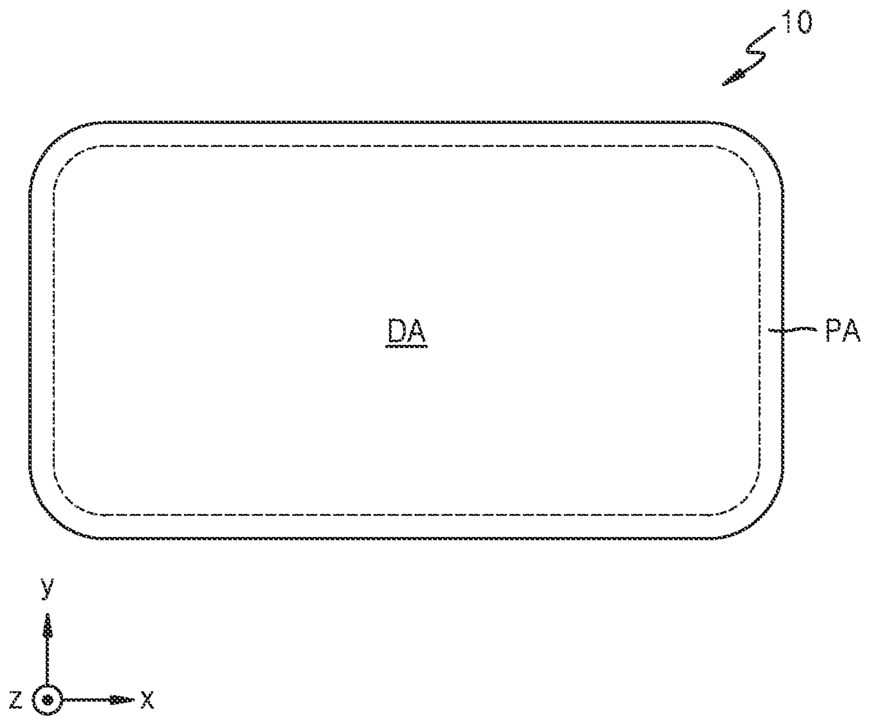
FIGS. 1A and 1B are schematic diagrams each illustrating a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

In the following embodiments, "on" used in connection with a device state may refer to an activated state of the device, and "off" may refer to a deactivated state of the device. "On" used in connection with a signal received by a device may refer to a signal that activates the device, and "off" may refer to a signal that deactivates the device. The device may be activated by a high-level voltage or a low-level voltage. For example, a P-channel transistor (P-type transistor) is activated by a low-level voltage, and an N-channel transistor (N-type transistor) is activated by a high-level voltage. Accordingly, it should be understood that "on" voltages for the P-type and N-type transistors are opposite (low versus high) voltage levels.

A display apparatus according to embodiments may be an apparatus that displays a video or a still image, which may be a portable electronic device, such as a mobile phone, a smart phone, a tablet personal computer (PC), a mobile communication terminal, an electronic notebook, an electronic book, a portable multimedia player (PMP), a navigation device, an Ultra Mobile PC (UMPC), or the like, and may also be used as a display screen of various products, such as a television, a laptop computer, a monitor, an advertisement board, an Internet of things (IoT) device, or the like. For example, the display apparatus according to an embodiment may be used as a wearable device, such as a smart watch, a watch phone, a glasses-type display, and a head-mounted display (HMD). For example, the display apparatus according to an embodiment may be used as a dashboard of a vehicle, a center fascia of a vehicle or a center information display (CID) disposed on a dashboard, a rear-view mirror display replacing a side mirror of a vehicle, and a display screen disposed on a back surface of a front seat as entertainment for a passenger in a back seat of a vehicle. For example, the display apparatus may be a flexible apparatus.

Figure 1B:
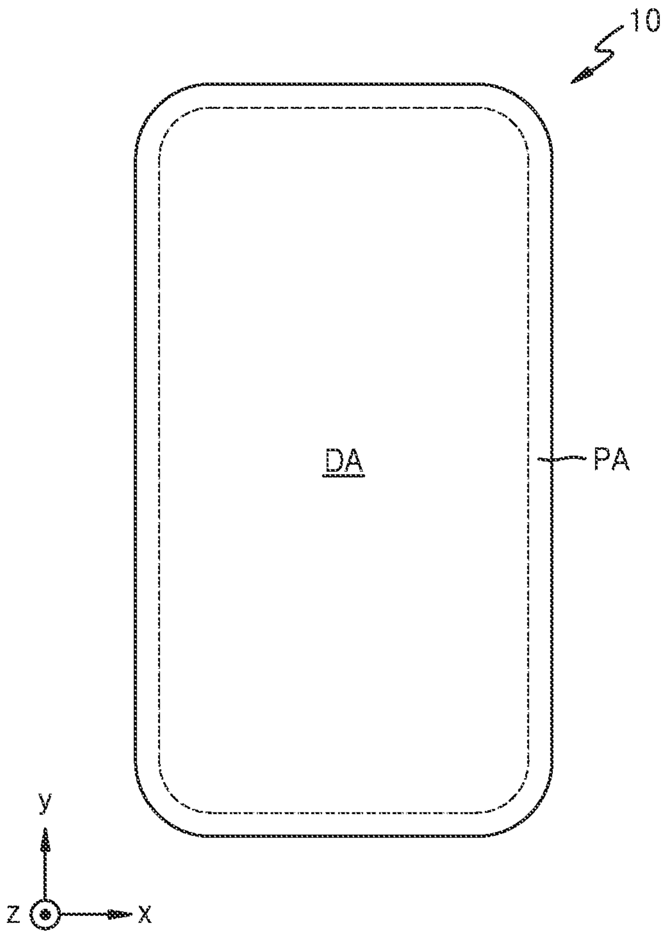
Figure 2:
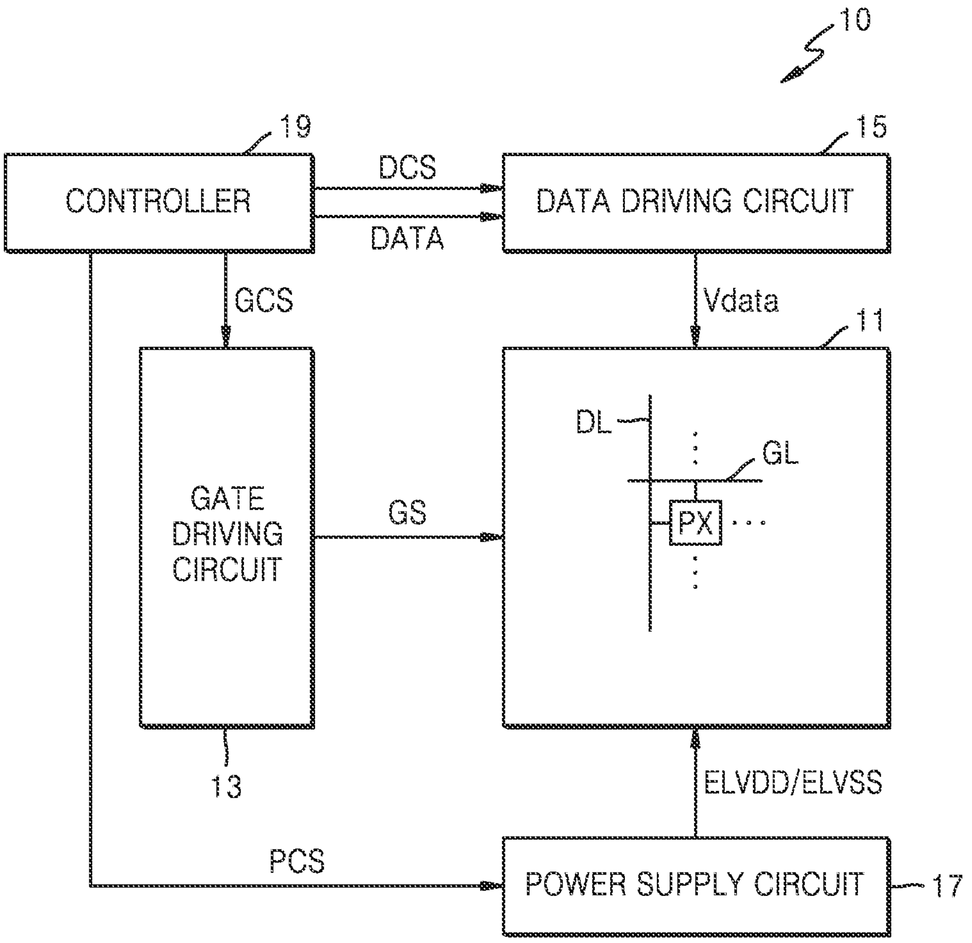
FIG. 2 is a schematic diagram illustrating a display apparatus according to an embodiment.
Figure 3A:
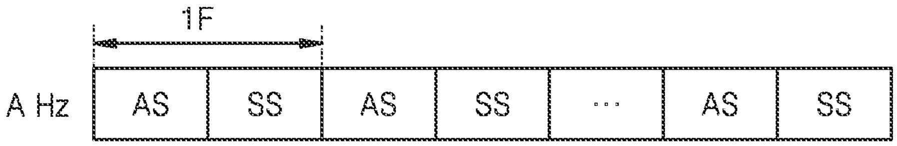
FIGS. 3A and 3B are schematic diagrams for explaining a method of driving a display apparatus according to a driving frequency.
Figure 3B:
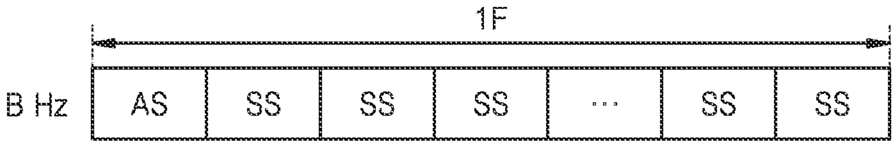

FIGS. 1A and 1B are schematic diagrams each illustrating a display apparatus according to an embodiment. FIG. 2 is a schematic diagram illustrating a display apparatus according to an embodiment. FIGS. 3A and 3B are schematic diagrams for explaining a method of driving a display apparatus according to a driving frequency.

Referring to FIGS. 1A and 1B, a display apparatus 10 may include a display area DA displaying an image and a peripheral area PA outside the display area DA. The display area DA may be surrounded (e.g., entirely surrounded) by the peripheral area PA.

In a plan view, the display area DA may have a rectangular shape. As another example, the display area DA may have a polygonal shape such as a triangular shape, a pentagonal shape, a hexagonal shape, or the like, or a circular shape, an elliptical shape, an atypical shape, or the like. A corner of an edge portion of the display area DA may have a round shape. In an embodiment, the display apparatus 10 may have a display area DA having a shape in which a length in an x-axis direction is greater than a length in a y-axis direction, as shown in FIG. 1A. In another example, the display apparatus 10 may have a display area DA having a shape in which a length in an x-axis direction is less than a length in a y-axis direction, as shown in FIG. 1B.

Referring to FIG. 2, the display apparatus 10 according to an embodiment may include a pixel unit 11, a gate driving circuit 13, a data driving circuit 15, a power supply circuit 17, and a controller 19.

The pixel unit 11 may be provided in the display area DA. Various conductive lines transferring electrical signals to be applied to the display area DA, outer circuits electrically connected to pixel circuits, and pads to which a printed circuit board or a driver integrated circuit (IC) chip is attached may be positioned in the peripheral area PA. For example, the gate driving circuit 13, the data driving circuit 15, the power supply circuit 17, and the controller 19 may be provided in the peripheral area PA.

As shown in FIG. 2, gate lines GL, data lines DL, and pixels PX connected thereto may be provided in the display area DA. The pixels PX may be arranged in various forms, such as a stripe arrangement, a PenTile™ arrangement (e.g., diamond arrangement), a mosaic arrangement, or the like, to implement an image. Each of the pixels PX may include an organic light-emitting diode OLED as a display element (e.g., light-emitting element), and the organic light-emitting diode OLED may be connected to a pixel circuit. The pixel circuit may include transistors and one capacitor. The pixel PX may emit, for example, red light, green light, blue light, or white light through the organic light-emitting diode OLED. Each pixel PX may be connected to at least one corresponding gate line among the gate lines GL and a corresponding data line among the data lines DL.

Each of the gate lines GL may extend in an x-axis direction (e.g., row direction) and be connected to the pixels PX positioned in the same row. Each of the gate lines GL may transfer a gate signal to the pixels PX in the same row. Each of the data lines DL may extend in a y-axis direction (e.g., column direction) and be connected to the pixels PX positioned in the same column. Each of the data lines DL may transfer a data signal to each of the pixels PX in the same column in synchronization with the gate signal.

In an embodiment, the peripheral area PA may be a non-display area in which the pixels PX are not arranged. In another example, a portion of the peripheral area PA may be implemented as the display area DA. For example, the pixels PX may be arranged at at least one corner of the peripheral area PA to overlap the gate driving circuit 13. Accordingly, a dead area, in which an image is not displayed, may be reduced and the display area DA may be expanded.

The gate driving circuit 13 may be connected to the gate lines GL, generate a gate signal in response to a control signal GCS from the controller 19, and sequentially supply the gate signal to the gate lines GL. The gate line GL may be connected to a gate of a transistor included in the pixel PX. The gate signal may be a gate control signal controlling turn-on and turn-off of a transistor having a gate connected to the gate line GL. The gate signal may be a square wave signal including an on-voltage at which the transistor may be turned on and an off-voltage at which the transistor may be turned off.

Although FIG. 2 illustrates that the pixel PX is connected to one gate line GL, this is an example. The pixel PX may be connected to two or more gate lines, and the gate driving circuit 13 may supply two or more gate signals having different timings at which turn-on voltages are applied to corresponding gate lines.

The data driving circuit 15 may be connected to the data lines DL, and may supply a data signal to the data lines DL in response to a control signal DCS from the controller 19. The data signal supplied to the data line DL may be supplied to the pixel PX to which the gate signal is supplied. The data driving circuit 15 may convert input image data DATA having a gray level from the controller 19 into a data signal in the form of voltage or current. FIG. 2 shows an example in which the data driving circuit 15 outputs a data signal Vdata in the form of voltage.

The power supply circuit 17 may generate voltages for driving the pixel PX in response to a control signal PCS from the controller 19. The power supply circuit 17 may generate a first driving voltage ELVDD and a second driving voltage ELVSS and supply them to the pixels PX. The first driving voltage ELVDD may be a high-level voltage provided to a first electrode (e.g., pixel electrode or anode) of a display element included in the pixel PX. The second driving voltage ELVSS may be a low-level voltage provided to a second electrode (e.g., opposite electrode or cathode) of a display element included in the pixel PX.

The controller 19 may generate the control signals GCS, DCS, and PCS based on signals input from the outside and respectively supply the control signals GCS, DCS, and PCS to the gate driving circuit 13, the data driving circuit 15, and the power supply circuit 17, respectively. The control signal GCS, which is output to the gate driving circuit 13, may include clock signals and a gate start signal. The control signal DCS, which is output to the data driving circuit 15, may include a source start signal and clock signals.

The display apparatus 10 may include a display panel, and the display panel may include a substrate. The pixels PX may be arranged in the display area DA of the substrate. A portion or the entirety of the gate driving circuit 13 may be formed (e.g., directly formed) in the peripheral area PA of the substrate during a process of forming a transistor including a pixel circuit in the display area DA of the substrate. The data driving circuit 15, the power supply circuit 17, and the controller 19 may each be formed in the form of a separate IC chip or may be formed in one IC chip to be disposed on a flexible printed circuit board (FPCB) electrically connected to a pad arranged on a side of the substrate. In another example, the data driving circuit 15, the power supply circuit 17, and the controller 19 may be disposed (e.g., directly disposed) on the substrate by using a method of chip on glass (COG) or chip on plastic (COP).

The display apparatus 10 may support a variable refresh rate (VRR). A refresh rate may be a frequency at which a data signal is actually written to a driving transistor of the pixel PX, which is referred to as a screen scanning rate or a screen reproduction rate, and may indicate the number of image frames reproduced for one second. In an embodiment, the refresh rate may be an output frequency of the gate driving circuit 13 and/or the data driving circuit 15. A frequency corresponding to the refresh rate may be a driving frequency. The display apparatus 10 may adjust, according to the driving frequency, the output frequency of the gate driving circuit 13 and the output frequency of the data driving circuit 15 corresponding thereto. The display apparatus 10 supporting the variable refresh rate (VRR) may operate by changing a driving frequency within a range of a maximum driving frequency and a minimum driving frequency. For example, in case that the refresh rate is about 60 Hz, a gate signal for writing a data signal from the gate driving circuit 13 may be supplied to each horizontal line (e.g., row) 60 times per second. The display apparatus 10 may display an image according to changing a driving frequency according to a refresh rate.

According to the driving frequency, one frame 1F may include a first scan period AS and one or more second scan periods SS. For example, as shown in FIG. 3A, in the display apparatus 10 operating at a driving frequency of A Hz, one frame 1F may include one first scan period AS and one second scan period SS. As shown in FIG. 3B, in the display apparatus 10 operating at a driving frequency of B Hz less than the driving frequency of A Hz, one frame 1F may include one first scan period AS and two or more second scan periods SS. As the driving frequency is lowered, one frame 1F may be longer. In another example, one frame 1F may also include only one first scan period AS.

The first scan period AS may be defined as an address scan period in which a data signal is written to the pixel PX in response to a first gate signal GW (refer to FIG. 6) and the pixel PX emits light accordingly. An operation of writing a data signal to the pixel PX from the data line DL may also be referred to as a data programming operation. The second scan period SS may be defined as a self-scan period in which the first gate signal GW is not applied to the pixel PX and no data signal is written. During the second scan period SS, the data signal written in the first scan period AS may be maintained, and the pixel PX may emit light. A length of the second scan period SS may be substantially equal to a length of the first scan period AS.

Figure 4:
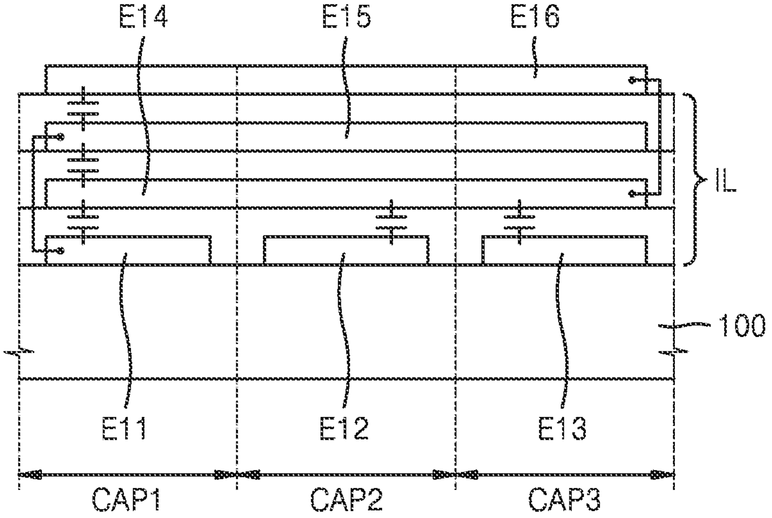
FIGS. 4 and 5 are schematic diagrams each illustrating a capacitor according to an embodiment.
Figure 5:
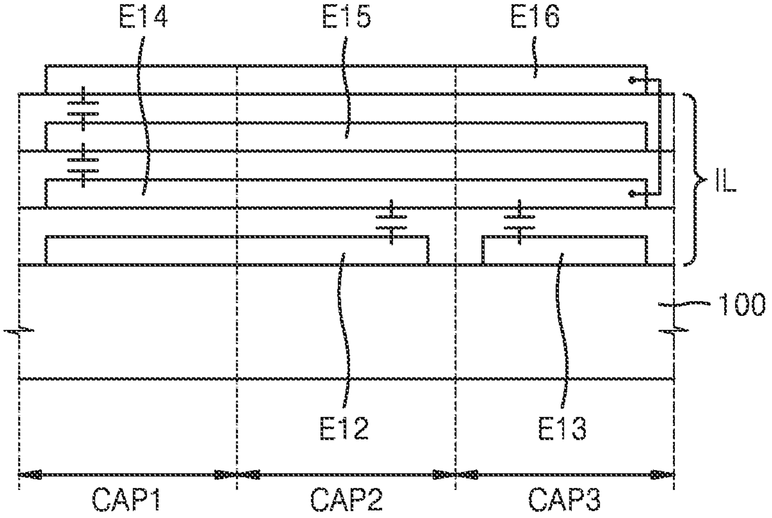

FIGS. 4 and 5 are schematic diagrams each illustrating a capacitor according to an embodiment.

The pixel PX may be disposed on a substrate 100. The pixel PX may include a pixel circuit and a light-emitting element as a display element connected to the pixel circuit. Referring to FIG. 4, the pixel circuit may include a first capacitor CAP1, a second capacitor CAP2, and a third capacitor CAP3.

A first electrode E11, a second electrode E12, and a third electrode E13 may be spaced apart each other on the substrate 100. A fourth electrode E14 overlapping the first electrode E11, the second electrode E12, and the third electrode E13 may be disposed on the first electrode E11, the second electrode E12, and the third electrode E13. A fifth electrode E15 overlapping the fourth electrode E14 may be disposed on the fourth electrode E14. A sixth electrode E16 overlapping the fifth electrode E15 may be disposed on the fifth electrode E15. The fifth electrode E15 may be connected (e.g., electrically connected) to the first electrode E11. The sixth electrode E16 may be connected (e.g., electrically connected) to the fourth electrode E14.

At least one insulating layer IL may be arranged between the fourth electrode E14 and the first electrode E11, the second electrode E12, and the third electrode E13. At least one insulating layer IL may be arranged between the fourth electrode E14 and the fifth electrode E15. At least one insulating layer IL may be arranged between the fifth electrode E15 and the sixth electrode E16. The insulating layer IL may include one or more inorganic insulating layers and/or organic insulating layers.

The first capacitor CAP1 may include the first electrode E11, a portion of the fourth electrode E14, the portion overlapping the first electrode E11, a portion of the fifth electrode E15, the portion overlapping the first electrode E11, and a portion of the sixth electrode E16, the portion overlapping the first electrode E11. A capacitance of the first capacitor CAP1 may be a sum of a capacitance formed by the first electrode E11 and the fourth electrode E14, a capacitance formed by the fourth electrode E14 and the fifth electrode E15, and a capacitance formed by the fifth electrode E15 and the sixth electrode E16.

The second capacitor CAP2 may include the second electrode E12 and a portion of the fourth electrode E14, the portion overlapping the second electrode E12. A capacitance of the second capacitor CAP2 may be a capacitance formed by the second electrode E12 and the fourth electrode E14. In an embodiment, the second electrode E12 may receive the first driving voltage ELVDD.

The third capacitor CAP3 may include the third electrode E13 and a portion of the fourth electrode E14, the portion overlapping the third electrode E13. A capacitance of the third capacitor CAP3 may be a capacitance formed by the third electrode E13 and the fourth electrode E14. In an embodiment, the third electrode E13 may receive the second driving voltage ELVSS.

In another example, as shown in FIG. 5, the first electrode E11 may be omitted. The first capacitor CAP1 may include a portion of the fourth electrode E14, a portion of the fifth electrode E15, the portion overlapping the fourth electrode E14, and a portion of the sixth electrode E16, the portion overlapping the fourth electrode E14. A capacitance of the first capacitor CAP1 may be a sum of a capacitance formed by the fourth electrode E14 and the fifth electrode E15 and a capacitance formed by the fifth electrode E15 and the sixth electrode E16.

Figure 6:
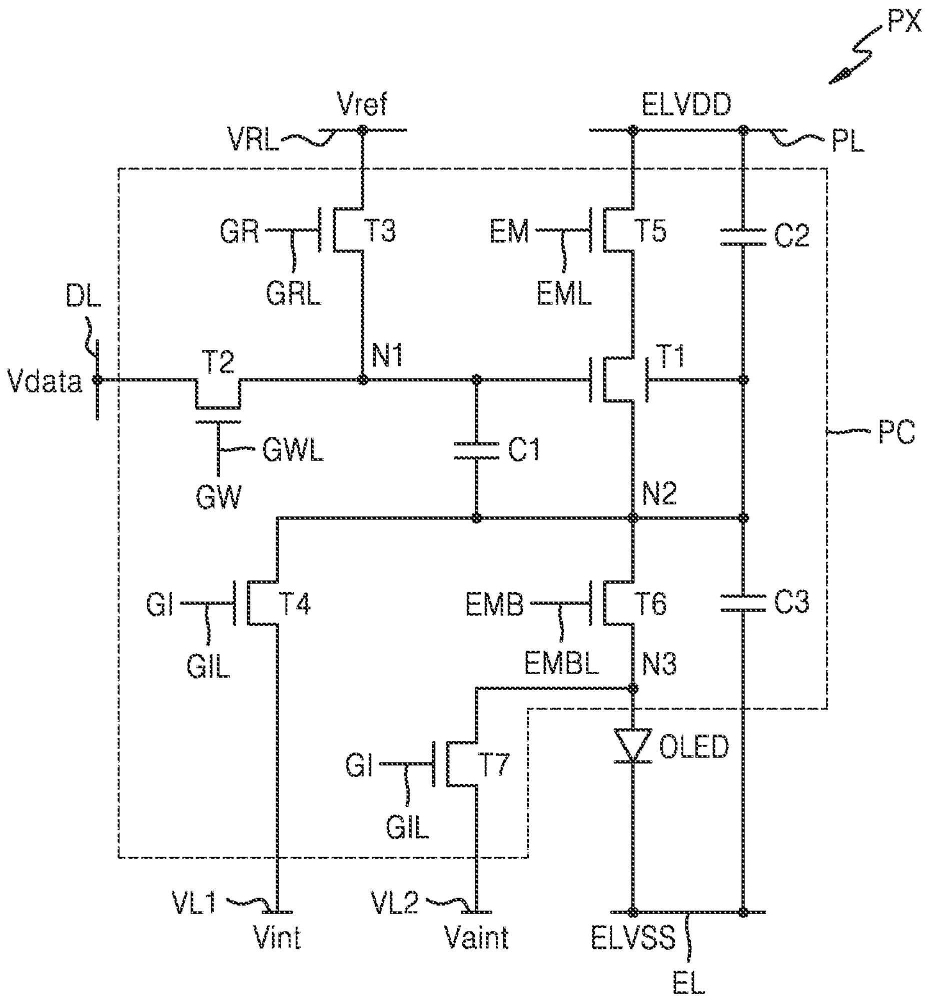
FIG. 6 is a schematic diagram of an equivalent circuit of a pixel according to an embodiment.
Figure 7:
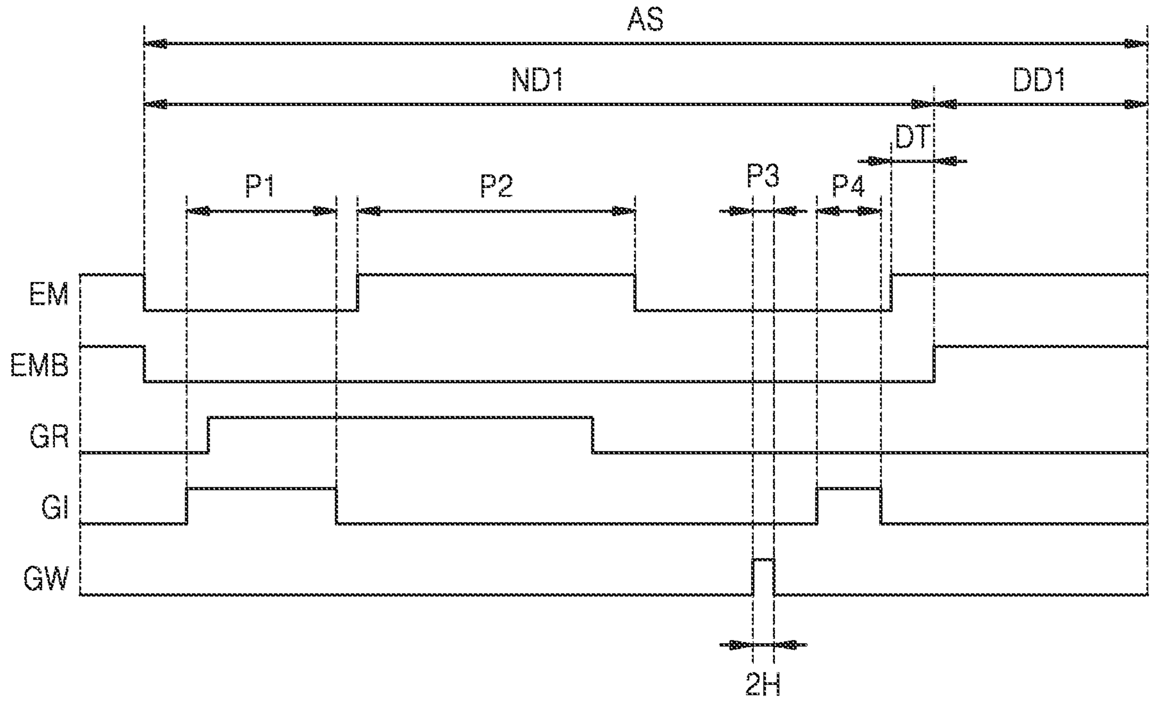
FIGS. 7 and 8 are schematic diagrams each illustrating signals for explaining an operation of the pixel shown in FIG. 6.
Figure 8:
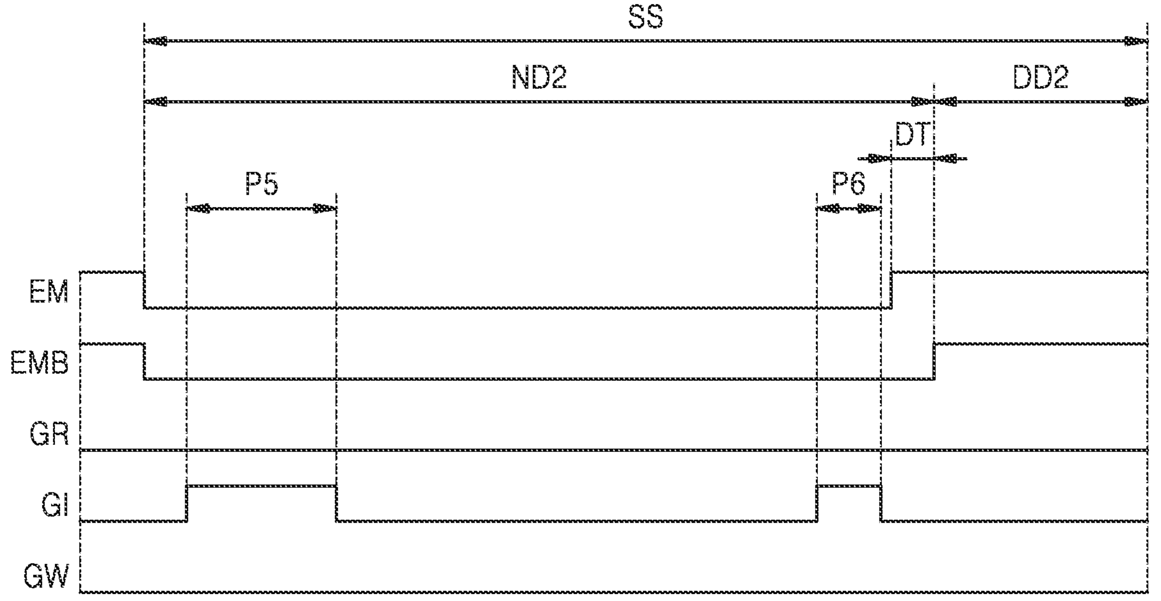

FIG. 6 is a schematic diagram of an equivalent circuit of a pixel according to an embodiment. FIGS. 7 and 8 are schematic diagrams each illustrating signals for explaining an operation of the pixel shown in FIG. 6.

Referring to FIG. 6, the pixel PX may include the organic light-emitting diode OLED as a display element and a pixel circuit PC connected to the organic light-emitting diode OLED.

The pixel PX may be connected to a first gate line GWL transferring the first gate signal GW, a second gate line GIL transferring a second gate signal GI, a third gate line GRL transferring a third gate signal GR, a fourth gate line EML transferring a fourth gate signal EM, a fifth gate line EMBL transferring a fifth gate signal EMB, and a data line DL transferring a data signal Vdata. Because light emission of the pixel PX is controlled by the fourth gate signal EM and the fifth gate signal EMB, the fourth gate signal EM and the fifth gate signal EMB may be referred to as emission control signals, and the fourth gate line EML and the fifth gate line EMBL may be referred to emission control lines.

For example, the pixel PX may be connected to a first driving voltage line PL transferring the first driving voltage ELVDD, a reference voltage line VRL transferring a reference voltage Vref, a first initialization voltage line VL1 transferring a first initialization voltage Vint, and a second initialization voltage line VL2 transferring a second initialization voltage Vaint.

A voltage level of the first driving voltage ELVDD may be higher than a voltage level of the second driving voltage ELVSS. A voltage level of the reference voltage Vref may be lower than the voltage level of the first driving voltage ELVDD. A voltage level of the first initialization voltage Vint may be lower than the voltage level of the second driving voltage ELVSS. A voltage level of the second initialization voltage Vaint may be higher than the voltage level of the first initialization voltage Vint. The voltage level of the second initialization voltage Vaint may be substantially equal to the voltage level of the second driving voltage ELVSS or higher than the voltage level of the second driving voltage ELVSS.

The pixel circuit PC may include first, second, third, fourth, fifth, sixth, and seventh transistors T1, T2, T3, T4, T5, T6, and T7 and first, second, and third capacitors C1, C2, and C3. The first to seventh transistors T1 to T7 may be N-type oxide thin-film transistors. The first transistor T1 may be a driving transistor that outputs a driving current corresponding to a data signal, and the second to seventh transistors T2 to T7 may be switching transistors transferring signals. A first terminal (e.g., first electrode) and a second terminal (e.g., second electrode) of each of the first to seventh transistors T1 to T7 may be a source or a drain according to voltages of the first terminal and the second terminal. For example, according to the voltages of the first terminal and the second terminal, the first terminal may be a drain and the second terminal may be a source, or the first terminal may be a source and the second terminal may be a drain.

A node connected to a first gate of the first transistor T1 may be defined as a first node N1, and a node connected to the second terminal of the first transistor T1 may be defined as a second node N2.

The first transistor T1 may be connected between the first driving voltage line PL and the organic light-emitting diode OLED. The first transistor T1 may be connected between the fifth transistor T5 and the sixth transistor T6. The first transistor T1 may include a gate, the first terminal, and the second terminal connected to the second node N2. The gate of the first transistor T1 may include the first gate connected to the first node N1 and a second gate connected to the second node N2. The first gate and the second gate may be disposed on different layers to face each other. For example, the first gate and the second gate of the first transistor T1 may be positioned to face each other with a semiconductor layer therebetween. Hereinafter, the gate of the first transistor T1 means the first gate involved in turning on and off the first transistor T1.

The first gate of the first transistor T1 may be connected to a second terminal of the second transistor T2, a first terminal of the third transistor T3, and the first capacitor C1. The second gate of the first transistor T1 may be connected to a first terminal of the sixth transistor T6, the first capacitor C1, and the second capacitor C2. The first terminal of the first transistor T1 may be connected to the first driving voltage line PL via the fifth transistor T5, and the second terminal of the first transistor T1 may be connected to a pixel electrode of the organic light-emitting diode OLED via the sixth transistor T6. The second terminal of the first transistor T1 may be connected to a first terminal of the fourth transistor T4, the first terminal of the sixth transistor T6, the first capacitor C1, and the second capacitor C2. The first transistor T1 may receive the data signal Vdata according to a switching operation of the second transistor T2 and control an amount of a driving current flowing to the organic light-emitting diode OLED.

The second transistor T2 (e.g., a write transistor) may be connected to the data line DL and the first gate of the first transistor T1. The second transistor T2 may include a gate connected to the first gate line GWL, a first terminal connected to the data line DL, and a second terminal connected to the first node N1. The second terminal of the second transistor T2 may be connected to the first gate of the first transistor T1, a first terminal of the third transistor T3, and the first capacitor C1. The second transistor T2 may be turned on by the first gate signal GW transferred to the first gate line GWL to electrically connect the data line DL and the first node N1, and the data signal Vdata transferred to the data line DL may be transferred to the first node N1.

The third transistor T3 (e.g., a first initialization transistor) may be connected to the first gate of the first transistor T1 and the reference voltage line VRL. The third transistor T3 may include a gate connected to the third gate line GRL, the first terminal connected to the first node N1, and a second terminal connected to the reference voltage line VRL. The first terminal of the third transistor T3 may be connected to the first gate of the first transistor T1, the second terminal of the second transistor T2, and the first capacitor C1. The third transistor T3 may be turned on by the third gate signal GR transferred to the third gate line GRL that transfers the reference voltage Vref transferred to the reference voltage line VRL to the first node N1.

The fourth transistor T4 (e.g., a second initialization transistor) may be connected to the first transistor T1 and the first initialization voltage line VL1. The fourth transistor T4 may include a gate connected to the second gate line GIL, a first terminal connected to the second node N2, and a second terminal connected to the first initialization voltage line VL1. The first terminal of the fourth transistor T4 may be connected to the second terminal of the first transistor T1, a first terminal of the sixth transistor T6, the first capacitor C1, and the second capacitor C2. The fourth transistor T4 may be turned on by the second gate signal GI transferred to the second gate line GIL such that the first initialization voltage Vint transferred to the first initialization voltage line VL1 to the second node N2 is transferred.

The fifth transistor T5 (e.g., a first emission control transistor) may be connected to the first driving voltage line PL and the first transistor T1. The fifth transistor T5 may include a gate connected to the fourth gate line EML, a first terminal connected to the first driving voltage line PL, a second terminal connected to the first terminal of the first transistor T1. The fifth transistor T5 may be turned on or off according to the fourth gate signal EM transferred to the fourth gate line EML.

The sixth transistor T6 (e.g., a second emission control transistor) may be connected to the first transistor T1 and the organic light-emitting diode OLED. The sixth transistor T6 may be connected between the second node N2 and a third node N3. The sixth transistor T6 may include a gate connected to the fifth gate line EMBL, a first terminal connected to the second node N2, and a second terminal connected to the third node N3. The first terminal of the sixth transistor T6 may be connected to the second terminal of the first transistor T1, the first terminal of the fourth transistor T4, the first capacitor C1, and the second capacitor C2. The second terminal of the sixth transistor T6 may be connected to a first terminal of the seventh transistor T7 and the pixel electrode of the organic light-emitting diode OLED. The sixth transistor T6 may be turned on or off according to the fifth gate signal EMB transferred to the fifth gate line EMBL.

The seventh transistor T7 (e.g., a third initialization transistor or a reset transistor) may be connected to the organic light-emitting diode OLED and the second initialization voltage line VL2. The seventh transistor T7 may be connected to the sixth transistor T6 and the second initialization voltage line VL2. The seventh transistor T7 may include a gate connected to the second gate line GIL, a first terminal connected to the third node N3, and a second terminal connected to the second initialization voltage line VL2. The first terminal of the seventh transistor T7 may be connected to the second terminal of the sixth transistor T6 and the pixel electrode of the organic light-emitting diode OLED. The seventh transistor T7 may be turned on by the second gate signal GI transferred to the second gate line GIL such that the second initialization voltage Vaint transferred to the second initialization voltage line VL2 may be transferred to the third node N3.

The first capacitor C1 may be connected between the first gate of the first transistor T1 and the second terminal of the first transistor T1. A first electrode of the first capacitor C1 may be connected to the first node N1, and a second electrode the first capacitor C1 may be connected to the second node N2. The first electrode of the first capacitor C1 may be connected to the first gate of the first transistor T1, the second terminal of the second transistor T2, and the first terminal of the third transistor T3. The second electrode of the first capacitor C1 may be connected to the second terminal of the first transistor T1 and the second gate of the first transistor T1, a second electrode of the second capacitor C2, the first terminal of the fourth transistor T4, and the first terminal of the sixth transistor T6. The first capacitor C1 may be a storage capacitor, which stores a threshold voltage of the first transistor T1 and a voltage corresponding to the data signal Vdata. The first capacitor C1 may be the first capacitor CAP1 shown in FIGS. 4 and 5.

The second capacitor C2 may be connected between the first driving voltage line PL and the second node N2. A first electrode of the second capacitor C2 may be connected to the first driving voltage line PL. The second electrode of the second capacitor C2 may be connected to the second terminal and the second gate of the first transistor T1, the second electrode of the first capacitor C1, the first terminal of the fourth transistor T4, and the first terminal of the sixth transistor T6. The second capacitor C2 may be the second capacitor CAP2 shown in FIGS. 4 and 5.

The third capacitor C3 may be connected between the second node N2 and a second driving voltage line EL to which the second driving voltage ELVSS is supplied. A first electrode of the third capacitor C3 may be connected to the second driving voltage line EL. A second electrode of the third capacitor C3 may be connected to the second terminal and the second gate of the first transistor T1, the second electrode of the first capacitor C1, the second electrode of the second capacitor C2, the first terminal of the fourth transistor T4, and the first terminal of the sixth transistor T6. The third capacitor C3 may be the third capacitor CAP3 shown in FIGS. 4 and 5.

A capacitance of each of the first capacitor C1, the second capacitor C2, and the third capacitor C3 may vary according to the color of light emitted by the pixel PX.

The organic light-emitting diode OLED may be connected to the first transistor T1 through the sixth transistor T6. The organic light-emitting diode OLED may include the pixel electrode (e.g., anode) connected to the third node N3 and an opposite electrode (e.g., cathode) facing the pixel electrode, and the opposite electrode may receive the second driving voltage ELVSS. The opposite electrode may be a common electrode which is common to the pixels PX. The opposite electrode may be connected (e.g., electrically connected) to the second driving voltage line EL in the display area DA.

In an embodiment, the pixel PX may be driven in one first scan period AS and one second scan period SS during one frame 1F. Most of the first scan period AS and the second scan period SS may be emission periods.

Each of the first gate signal GW, the second gate signal GI, the third gate signal GR, the fourth gate signal EM, and the fifth gate signal EMB may have a high-level voltage (e.g., first level voltage) in some periods, and may have a low-level voltage (e.g., second level voltage) in some periods. For example, the high-level voltage may be a gate-on voltage turning on a transistor, and the low-level voltage may be a gate-off voltage turning off the transistor.

As shown in FIG. 7, the first scan period AS may include a first non-emission period ND1 in which the pixel PX does not emit light and a first emission period DD1 in which the pixel PX emits light. The first non-emission period ND1 may include a first period P1, a second period P2, a third period P3, and a fourth period P4.

The first period P1 may be a first initialization period that initializes the first node N1 and the second node N2 to which the first transistor T1 is connected, and the third node N3 to which the pixel electrode of the organic light-emitting diode OLED is connected. In the first period P1, the second gate signal GI of a gate-on voltage may be supplied (or applied) to the second gate line GIL. For example, the third gate signal GR of a gate-on voltage may be supplied to the third gate line GRL. The first gate signal GW, the fourth gate signal EM, and the fifth gate signal EMB may be supplied as gate-off voltages. A timing of applying the gate-on voltage of the third gate signal GR may be delayed by certain time from a timing of applying the gate-on voltage of the second gate signal GI.

The fourth transistor T4 and the seventh transistor T7 may be turned on by the second gate signal GI, and the third transistor T3 may be turned on by the third gate signal GR.

The second node N2, e.g., the second terminal of the first transistor T1, may be initialized to the first initialization voltage Vint by the turned-on fourth transistor T4. The first node N1, e.g., the first gate of the first transistor T1, may be initialized to the reference voltage Vref by the turned-on third transistor T3. The third node N3, e.g., the pixel electrode of the organic light-emitting diode OLED, may be initialized to the second initialization voltage Vaint by the turned-on seventh transistor T7.

The second period P2 may be a compensation period, during which the threshold voltage of the first transistor T1 is compensated. In the second period P2, the third gate signal GR of the gate-on voltage may be supplied to the third gate line GRL, and the fourth gate signal EM may be supplied to the fourth gate line EML. For example, the first gate signal GW, the second gate signal GI, and the fifth gate signal EMB may be supplied as gate-off voltages.

The third transistor T3 may be turned on by the third gate signal GR, and the fifth transistor T5 may be turned on the fourth gate signal EM. Accordingly, the reference voltage Vref may be supplied to the first node N1, and the first driving voltage ELVDD may be supplied to the first terminal of the first transistor T1 so that the first transistor T1 may be turned on. In case that a voltage of the second terminal of the first transistor T1 reaches to a difference (Vref-Vth) between the reference voltage Vref and a threshold voltage Vth of the first transistor T1, the first transistor T1 may be turned off. For example, a voltage corresponding to the threshold voltage Vth of the first transistor T1 may be stored in the first capacitor C1 so that the threshold voltage Vth of the first transistor T1 may be compensated.

The third period P3 may be a write period in which a data signal is supplied to a pixel. In the third period P3, the first gate signal GW of the gate-on voltage may be supplied to the first gate line GWL. In an embodiment, the gate-on voltage of the first gate signal GW may have a width of approximately two horizontal periods 2H. For example, the second gate signal GI, the third gate signal GR, the fourth gate signal EM, and the fifth gate signal EMB may be supplied as gate-off voltages.

The second transistor T2 may be turned on by the first gate signal GW. The turned-on second transistor T2 may transfer the data signal Vdata from the data line DL to the first gate of the first transistor T1. Accordingly, a voltage of the first node N1 may be changed from the reference voltage Vref to a voltage corresponding to the data signal Vdata. At this time, the voltage of the second node N2 may be changed in correspondence to an amount of change in a voltage of the first node N1. The voltage of the second node N2 may be a voltage $(Vref-Vth+\alpha\times(Vdata-Vref))$ changed according to a capacitance ratio $(\alpha=C1/(C1+C2+C3))$ of the first capacitor C1, the second capacitor C2, and the third capacitor C3. Accordingly, a voltage corresponding to the threshold voltage Vth of the first transistor T1 and the data signal Vdata may be charged in the first capacitor C1.

The fourth period P4 may be a second initialization period of initializing the second node N2 to which the first transistor T1 is connected and the third node N3 to which the pixel electrode of the organic light-emitting diode OLED is connected, before the first emission period DD1 after data is written. In the fourth period P4, the second gate signal GI of the gate-on voltage may be supplied (or applied) to the second gate line GIL. For example, the first gate signal GW, the third gate signal GR, the fourth gate signal EM, and the fifth gate signal EMB may be supplied with off voltages.

The fourth transistor T4 and the seventh transistor T7 may be turned on by the second gate signal GI. The first initialization voltage Vint may be transferred to the second terminal of the first transistor T1 by the turned-on fourth transistor T4. The second initialization voltage Vaint may be transferred to the pixel electrode of the organic light-emitting diode OLED by the turned-on seventh transistor T7.

In case that displaying low gradation (e.g., 11 to 31 gradations), a change in brightness may occur due to a voltage remaining in the organic light-emitting diode OLED. As the third node N3 is initialized during the fourth period P4 after data writing and before pixel emission, a change in brightness of the organic light-emitting diode OLED may be minimized in case of displaying low gradation to further improve image quality. For example, as a voltage different from the first initialization voltage Vint, for example, a voltage greater than the first initialization voltage Vint, is used as the second initialization voltage Vaint, a voltage change time of the pixel electrode may be minimized, thereby minimizing a screen flicker phenomenon.

The first emission period DD1 may be a period in which the organic light-emitting diode OLED emits light. In the first emission period DD1, the fourth gate signal EM of the gate-on voltage may be provided to the fourth gate line EML, and the fifth gate signal EMB of the gate-on voltage may be provided to the fifth gate line EMBL. For example, the first gate signal GW, the second gate signal GI, and the third gate signal GR may be gate-off voltages.

In the first emission period DD1, the fifth transistor T5 may be turned on by the fourth gate signal EM, and the first driving voltage ELVDD may be supplied to the first terminal of the first transistor T1 by the turned-on fifth transistor T5. The first transistor T1 may output voltage corresponding to the data signal Vdata stored in the first capacitor C1, e.g., a driving current $(Id\propto(Vgs-Vth)^2)$ having a magnitude corresponding to a voltage $Vgs-Vth$ obtained by subtracting the threshold voltage Vth of the first transistor T1 from a gate-source voltage Vgs of the first transistor T1, the driving current may flow to the organic light-emitting diode OLED through the sixth transistor T6 turned on by the fifth gate signal EMB, and the organic light-emitting diode OLED may emit light with brightness corresponding to the magnitude of the driving current.

As shown in FIG. 8, the second scan period SS may include a second non-emission period ND2 in which the pixel PX does not emit light and a second emission period DD2 in which the pixel PX emits light. The second non-emission period ND2 may include a fifth period P5 and a sixth period P6. The second scan period SS may not include a compensation period corresponding to the second period P2 of the first scan period AS and a write period corresponding to the third period P3 of the first scan period AS.

The fifth period P5 may be a third initialization period of initializing the third node N3 connected to the pixel electrode of the organic light-emitting diode OLED. The fifth period P5 may correspond to the first period P1 of the first scan period AS. In the fifth period P5, the second gate signal GI of the gate-on voltage may be supplied to the second gate line GIL. The first gate signal GW, the third gate signal GR, the fourth gate signal EM, and the fifth gate signal EMB may be supplied as gate-off voltages. The fourth transistor T4 and the seventh transistor T7 may be turned on by the second gate signal GI. The second terminal of the first transistor T1 may be initialized to the first initialization voltage Vint by the turned-on fourth transistor T4. The pixel electrode of the organic light-emitting diode OLED may be initialized to the second initialization voltage Vaint by the turned-on seventh transistor T7.

The sixth period P6 may be a fourth initialization period of initializing the third node N3 to which the pixel electrode of the organic light-emitting diode OLED is connected, before the second emission period DD2. The sixth period P6 may correspond to the fourth period P4 of the first scan period AS. In the sixth period P6, the second gate signal GI of the gate-on voltage may be supplied to the second gate line GIL. The first gate signal GW, the third gate signal GR, the fourth gate signal EM, and the fifth gate signal EMB may be supplied as gate-off voltages. The fourth transistor T4 and the seventh transistor T7 may be turned on by the second gate signal GI. The second terminal of the first transistor T1 may be initialized to the first initialization voltage Vint by the turned-on fourth transistor T4. The pixel electrode of the organic light-emitting diode OLED may be initialized to the second initialization voltage Vaint by the turned-on seventh transistor T7.

The second emission period DD2 may be a period in which the organic light-emitting diode OLED emits light. The second emission period DD2 may correspond to the first emission period DD1 of the first scan period AS. In the second emission period DD2, the fourth gate signal EM of the gate-on voltage may be supplied to the fourth gate line EML, and the fifth gate signal EMB of the gate-on voltage may be supplied to the fifth gate line EMBL. For example, the first gate signal GW, the second gate signal GI, and the third gate signal GR may be gate-off voltages.

In the second emission period DD2, the first driving voltage ELVDD may be supplied to the first terminal of the first transistor T1 by the fifth transistor T5 turned on by the fourth gate signal EM. The first transistor T1 may operate according to a voltage stored in the first capacitor C1, and may flow a driving current having a magnitude corresponding to the data signal Vdata. The driving current may flow to the organic light-emitting diode OLED through the sixth transistor T6 turned on by the fifth gate signal EMB, and the organic light-emitting diode OLED may emit light with brightness corresponding to the magnitude of the driving current. In the second emission period DD2, the data signal Vdata stored in the first capacitor C1 may be a signal in which a data signal supplied to the pixel in the third period P3 of the first scan period AS is maintained.

In a state where the second node N2 and the third node N3, e.g., the first terminal and the second terminal of the sixth transistor T6, are respectively applied with the first initialization voltage Vint and the second initialization voltage Vaint in the fourth period P4 and the sixth period P6, in case that the gate-on voltages of the fourth gate signal EM and the fifth gate signal EMB are applied at the same timing, a voltage of the third node N3 may be changed to a voltage less than the second initialization voltage Vaint due to a voltage difference between the first terminal and the second terminal of the sixth transistor T6. Accordingly, an effect of minimizing a flicker phenomenon due to an initialization of the third node N3 to the second initialization voltage Vaint greater than the first initialization voltage Vint, may be reduced. In an embodiment, in each of the first emission period DD1 and the second emission period DD2, a timing of applying the gate-on voltage of the fifth gate signal EMB may be delayed by certain time DT from a timing of applying the gate-on voltage of the fourth gate signal EM. As the gate-on voltage of the fourth gate signal EM is firstly applied to increase a voltage level of a voltage applied to the first terminal of the sixth transistor T6, and then the gate-on voltage of the fifth gate signal EMB is applied, a voltage difference between the first terminal and the second terminal of the sixth transistor T6 may be reduced to minimize a change in voltage of the third node N3 and minimize a flicker phenomenon. FIGS. 7 and 8 show that emission periods DD1 and DD2 starts from the time when both of the fourth gate signal EM and the fifth gate signal EMB are gate-on voltages, but it may also be understood that the emission periods DD1 and DD2 starts at a timing when the fourth gate signal EM of the gate-on voltage is applied.

For example, in an embodiment, as initialization of the pixel electrode is performed twice in the second scan period SS similar to the first scan period AS, in case that one or more second scan periods SS are included in one frame, a brightness deviation according to a driving speed may be minimized.

In the above embodiment, during one frame, threshold voltage compensation of a transistor and data writing may be each performed once, so that the first gate signal GW and the third gate signal GR may be only supplied in the first scan period AS. The second gate signal GI, the fourth gate signal EM, and the fifth gate signal EMB may each be supplied in the first scan period AS and the second scan period SS. For example, during one frame, a period of the first gate signal GW and the third gate signal GR may be one cycle, and a period of the second gate signal GI, the fourth gate signal EM, and the fifth gate signal EMB may be two cycles. For example, the fourth gate signal EM may be supplied in the second period P2 (e.g., the compensation period) of the first scan period AS, and may not be supplied in a period corresponding to the second period P2 of the second scan period SS. However, in case that the fourth gate signal EM is considered as an emission control signal, the fourth gate signal EM may be supplied to each of the first emission period DD1 of the first scan period AS and the second emission period DD2 of the second scan period SS, and thus it is interpreted that the fourth gate signal EM has two cycles during one frame.

The first gate signal GW may be supplied to a pixel only once in the third period P3 of the first scan period AS, and may be supplied to the pixel at a period of one cycle per frame. The second gate signal GI may be supplied twice in the first period P1 and the fourth period P4 of the first scan period AS and is supplied twice in the fifth period P5 and the sixth period P6 of the second scan period SS, and may be supplied to the pixel at a period of two cycles per frame. The third gate signal GR may be continuously supplied to a pixel only once in the first period P1 and the second period P2 of the first scan period AS, and may be supplied to the pixel at a period of one cycle per frame. The fourth gate signal EM may be supplied to the pixel once in the first emission period DD1 of the first scan period AS and once in the second emission period DD2 of the second scan period SS, and may be supplied to the pixel at a period of two cycles per frame. For example, a case where the fourth gate signal EM is supplied to the second period P2 of the first scan period AS is omitted. The fifth gate signal EMB may be supplied to the pixel once in the first emission period DD1 of the first scan period AS and once in the second emission period DD2 of the second scan period SS, and may be supplied to the pixel at a period of two cycles per frame.

In another example, the fourth period P4 of the first scan period AS and the sixth period P6 of the second scan period SS may be omitted. For example, the second gate signal GI may be supplied to the pixel once in the first period P1 of the first scan period AS and once in the fifth period P5 of the second scan period SS, and may be supplied to the pixel at a period of two cycles per frame.

Figure 9:
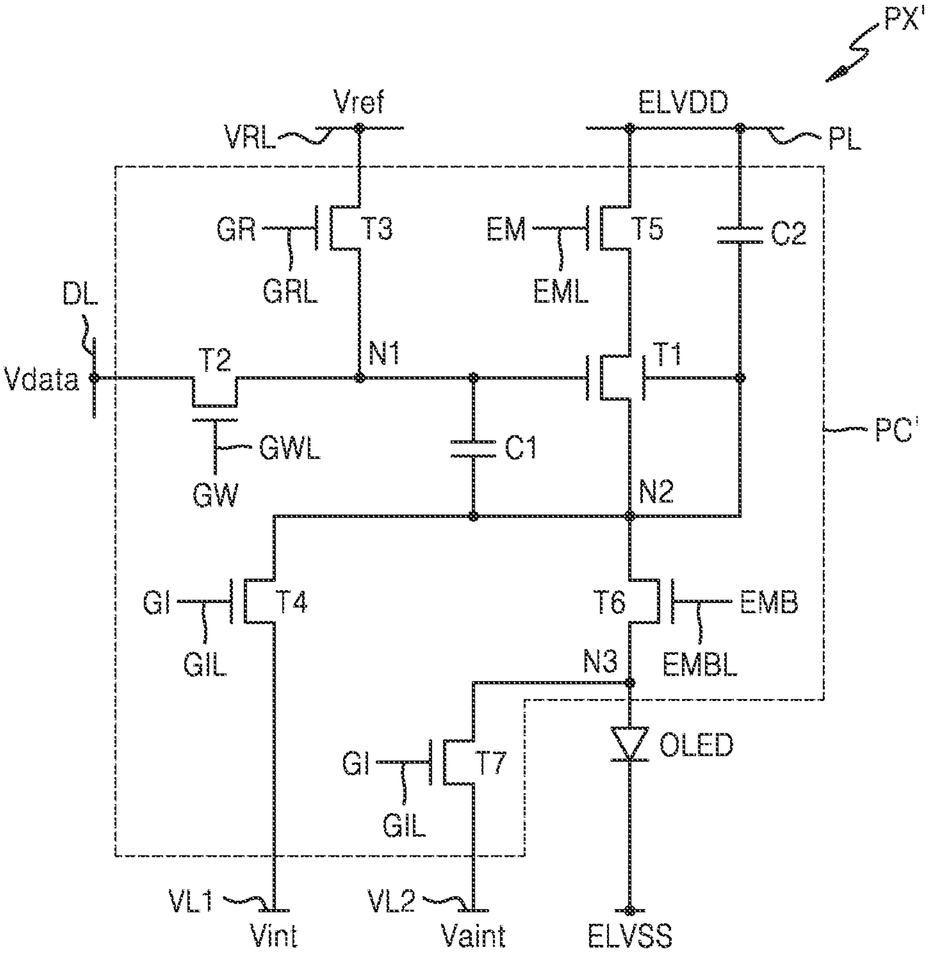
FIG. 9 is a schematic diagram of an equivalent circuit of a pixel according to a comparative example 1.
Figure 10:
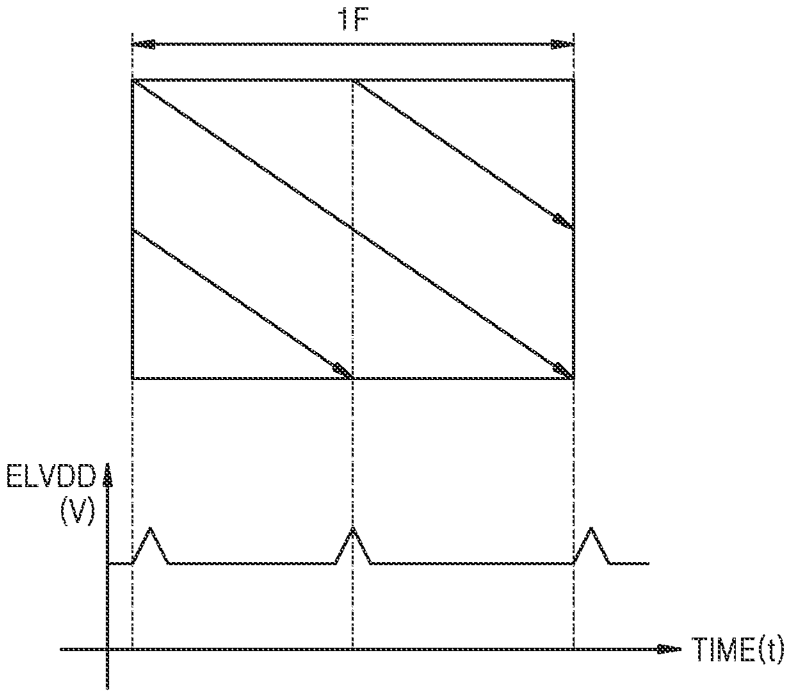
FIG. 10 is a schematic diagram illustrating a change in first driving voltage over time in a panel to which the pixel shown in FIG. 9 is applied.
Figure 11:
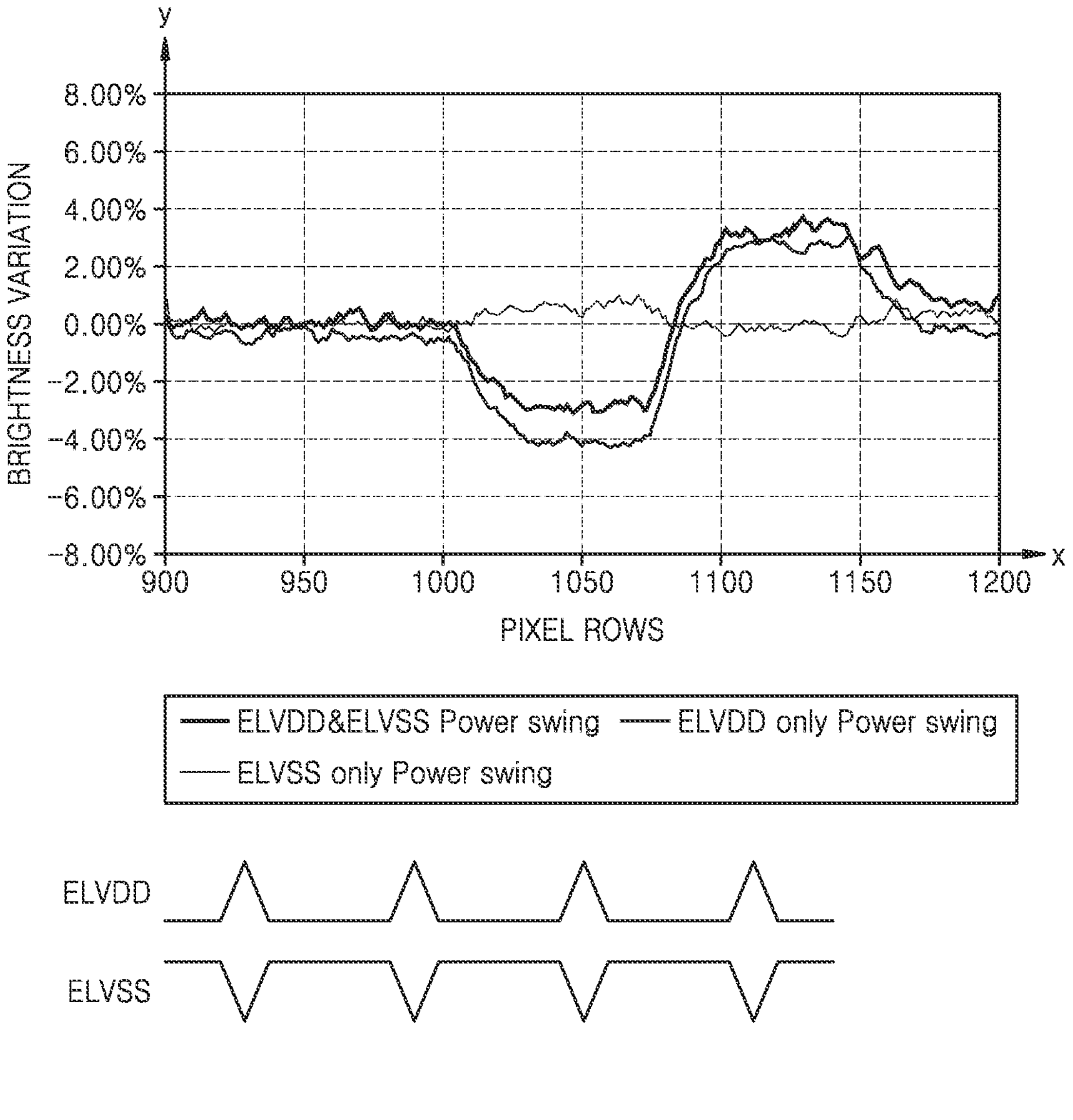
FIG. 11 is a schematic diagram illustrating a change in brightness of a panel to which the pixel shown in FIG. 9 is applied, according to a change in first driving voltage and second driving voltage in the panel.
Figure 12:
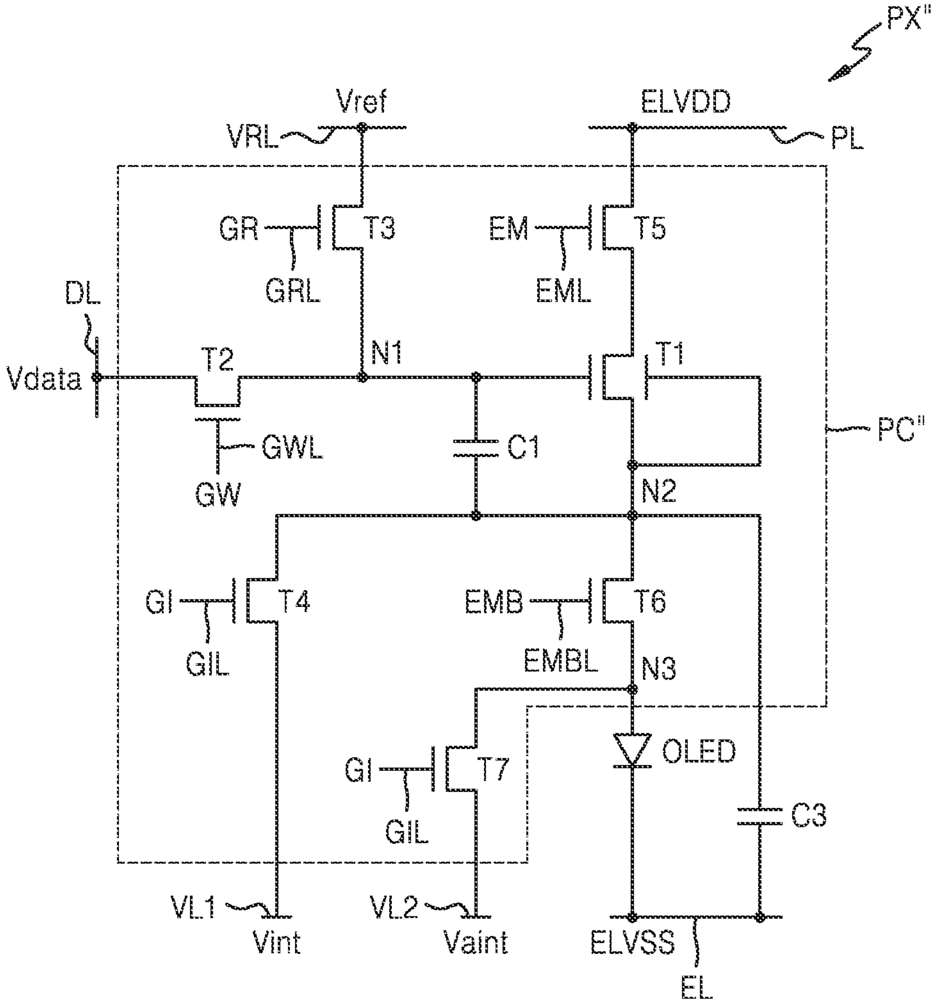
FIG. 12 is a schematic diagram of an equivalent circuit of a pixel according to a comparative example 2.
Figure 13:
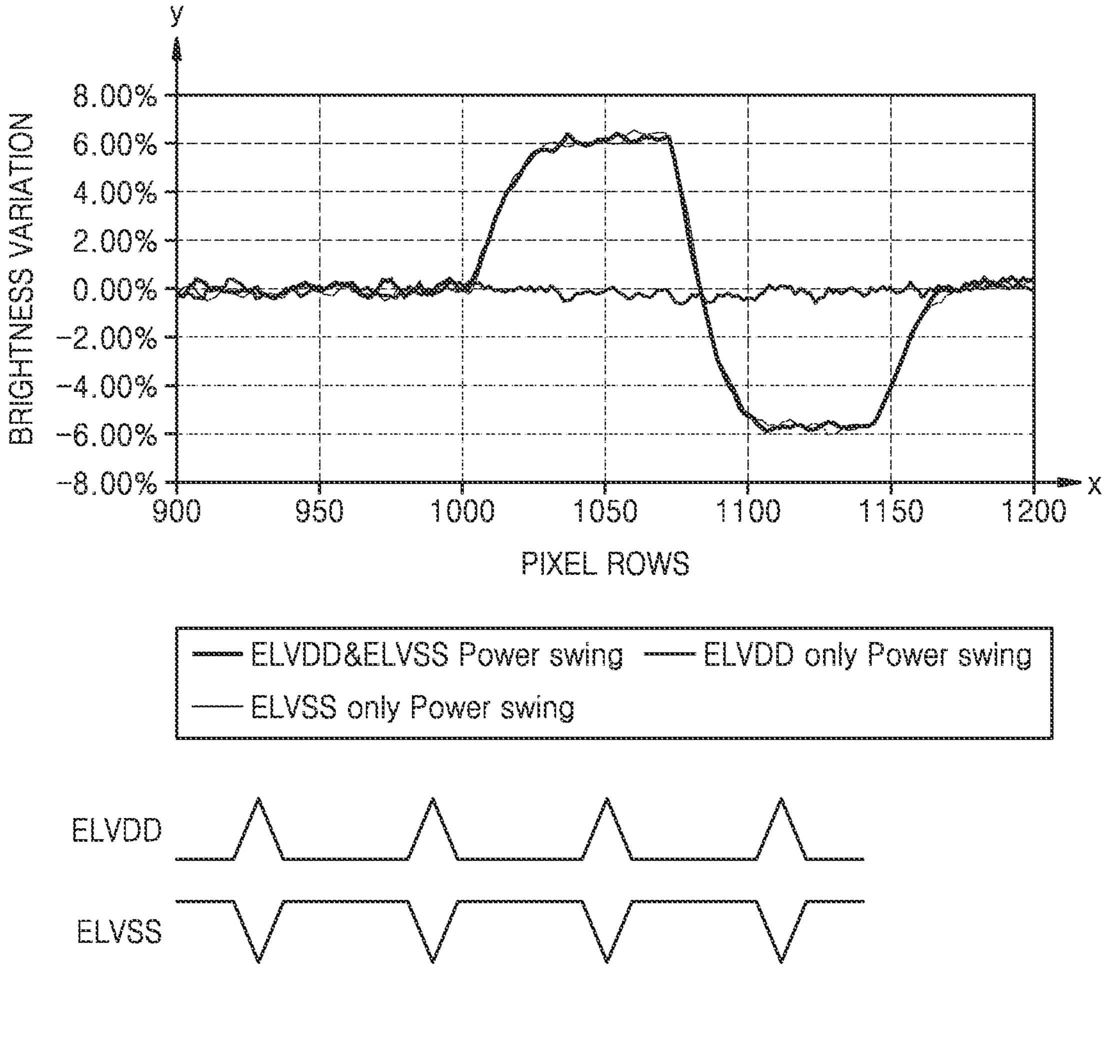
FIG. 13 is a schematic diagram illustrating a change in brightness of a panel to which the pixel shown in FIG. 12 is applied, according to a change in first driving voltage and second driving voltage in the panel.
Figure 14:
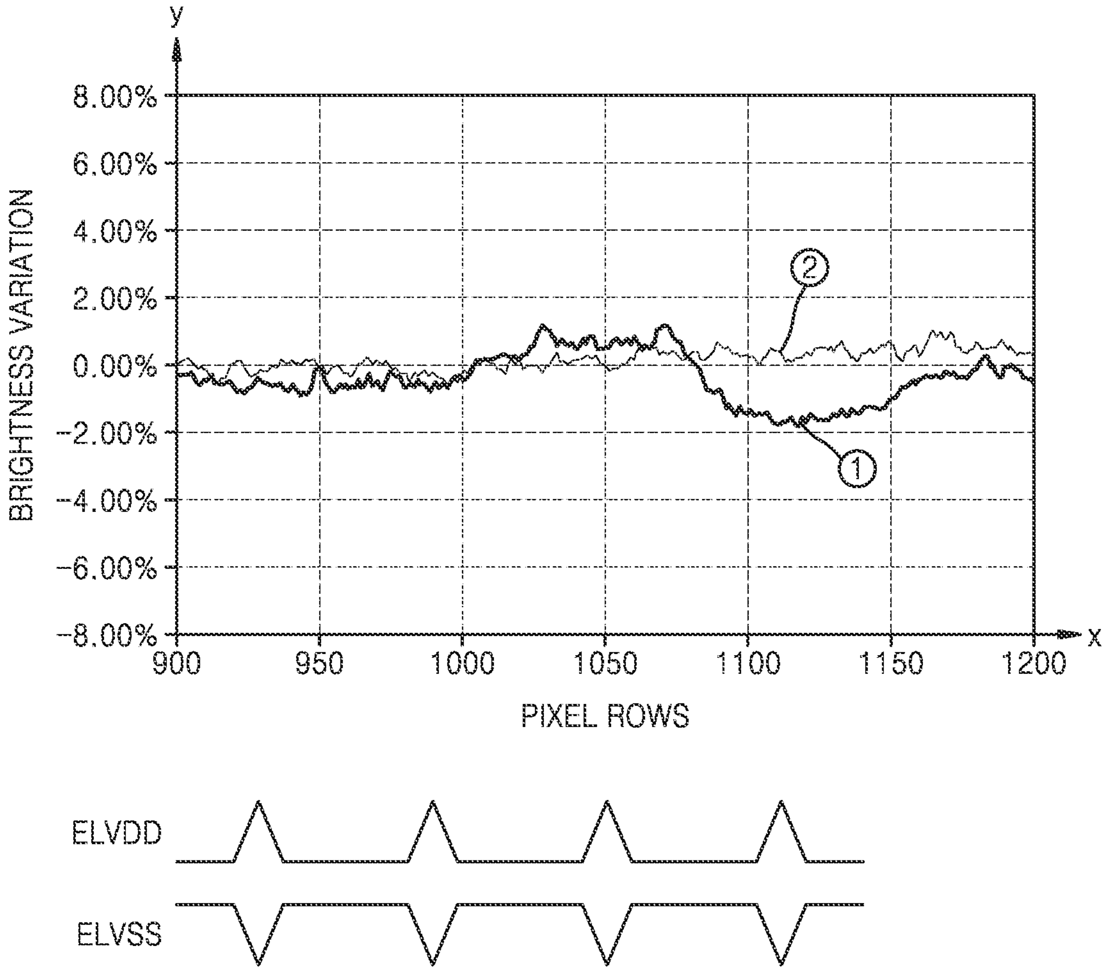
FIG. 14 is a schematic diagram illustrating a change in brightness of a panel to which the pixel shown in FIG. 6 is applied, according to a change in first driving voltage and second driving voltage in the panel.

FIG. 9 is a schematic diagram of an equivalent circuit of a pixel according to a comparative example 1. FIG. 10 is a schematic diagram illustrating a change in the first driving voltage ELVDD over time in a panel to which the pixel shown in FIG. 9 is applied. FIG. 11 is a schematic diagram illustrating a change in brightness according to a change in the first driving voltage ELVDD and the second driving voltage ELVSS in a panel to which the pixel shown in FIG. 9 is shown. FIG. 12 is a schematic diagram of an equivalent circuit of a pixel according to a comparative example 2. FIG. 13 is a schematic diagram illustrating a change in brightness according to a change in the first driving voltage ELVDD and the second driving voltage ELVSS in a panel to which the pixel shown in FIG. 12 is shown. FIG. 14 is a schematic diagram illustrating a change in brightness according to a change in the first driving voltage ELVDD and the second driving voltage ELVSS in a panel to which the pixel shown in FIG. 6 is shown.

A pixel circuit PC' of a pixel PX' shown in FIG. 9 is a comparative example 1 in which the third capacitor C3 is omitted from the pixel PX shown in FIG. 6. As shown in FIGS. 6 and 7, during one frame, the fourth gate signal EM may be sequentially applied to the display area DA from a first line to a last line. In each pixel, in case that the fourth gate signal EM is applied as a gate-on voltage, the first driving voltage ELVDD may decrease, and in case that the fourth gate signal EM is applied as a gate-off voltage, the first driving voltage ELVDD may increase. In case that the fourth gate signal EM of a gate-on voltage is applied to the pixel PX' displaying white, a drop in the first driving voltage ELVDD is large, and in case that the fourth gate signal EM of a gate-on voltage is applied to the pixel PX' displaying black, the drop in the first driving voltage ELVDD may be small.

FIG. 10 shows a change in the first driving voltage ELVDD over time t, which is measured for an entire panel as the fourth gate signal EM is applied at a period of two cycles during one frame. As shown in FIG. 10, as the fourth gate signal EM is applied at a period of two cycles during one frame, a voltage change in the first driving voltage ELVDD may appear at the beginning and in the middle of one frame. Accordingly, each pixel PX' of the display area DA may be affected by the decrease and increase of the first driving voltage ELVDD according to an operating state, and mura may occur in an image. For example, in case that the first driving voltage ELVDD has a falling slope, the pixel PX' in a latter portion of the second period P2, e.g., in an operating state before the third gate signal GR transitions from a gate-on voltage to a gate-off voltage, may be displayed as a dark portion due to a drop in the voltage of the second terminal of the first transistor T1 due to a voltage change in a second capacitor C2. For example, in case that the first driving voltage ELVDD has a rising slope, the pixel PX' before the third period P3, e.g., in an operating state before applying the first gate signal GW of an gate-on voltage in case that the fourth gate signal EM of an gate-off voltage is applied, may be displayed as a bright portion due to a rise in the voltage of the second terminal of the first transistor T1 due to the voltage change in the second capacitor C2.

In FIG. 11, an x axis represents a pixel line (e.g., row), and a y axis represents a change in brightness with respect to a standard brightness of a panel. FIG. 11 shows a change in brightness according to a variation of the second driving voltage ELVSS in correspondence to change in the voltage of the first driving voltage ELVDD as shown in FIG. 10. The first driving voltage ELVDD and the second driving voltage ELVSS may be swingable in a method in which the second driving voltage ELVSS decreases in case that the first driving voltage ELVDD increases, and the second driving voltage ELVSS increases in case that the first driving voltage ELVDD decreases. As shown in a lower end portion of the graph of FIG. 11, in case that both the first driving voltage ELVDD and the second driving voltage ELVSS swing and in case that only the first driving voltage ELVDD swings, the pixels PX' arranged in some rows may be displayed as dark portions or bright portions.

A pixel circuit PC" of a pixel PX" shown in FIG. 12 shows a comparative example 2 in which the second capacitor C2 is omitted from the pixel PX shown in FIG. 6. As shown in a lower end portion of the graph of FIG. 13, in case that both the first driving voltage ELVDD and the second driving voltage ELVSS swing and in case that only the second driving voltage ELVSS swings, the pixels PX" corresponding to the pixels PX' displayed as dark portions in the graph of FIG. 11 are displayed as bright portions, and the pixels PX" corresponding to the pixels PX' displayed as bright portions are displayed as dark portions.

The pixel PX according to an embodiment may include the second capacitor C2 connected to the first driving voltage line PL and the third capacitor C3 connected to the second driving voltage line EL as capacitors for maintaining a gate-source voltage Vgs of the first transistor T1. As the second driving voltage ELVSS varies in response to the change in the first driving voltage ELVDD by the third capacitor C3, a voltage change of the second node N2 may be compensated, and the occurrence of image mura may be minimized.

In FIG. 14, the graph (1) is a case where a ratio of a capacitance of the second capacitor C2 and a capacitance of the third capacitor C3 is 1:1, and the graph (2) is a case where a ratio of the capacitance of the second capacitor C2 and the capacitance of the third capacitor C3 is 2:1. As shown in a lower end portion of the graph of FIG. 14, in case that both the first driving voltage ELVDD and the second driving voltage ELVSS swing, a change in the graph (1) and the graph (2) of FIG. 14 is small as compared to the graphs shown in FIGS. 11 and 13.

A pixel to which the second capacitor C2 and the third capacitor C3 according to an embodiment are applied is not limited to the pixel PX shown in FIG. 6. In another example, transistors of the pixel PX may be P-channel transistors, or some transistors may be N-channel transistors and some transistors may be P-channel transistors. For example, a hold capacitor for maintaining the gate-source voltage Vgs of a driving transistor may have a structure in which a capacitor including an electrode receiving the first driving voltage ELVDD and a capacitor including an electrode receiving the second driving voltage ELVSS are connected to each other in a method of sharing another electrode (e.g., a source of the driving transistor).

Figure 15:
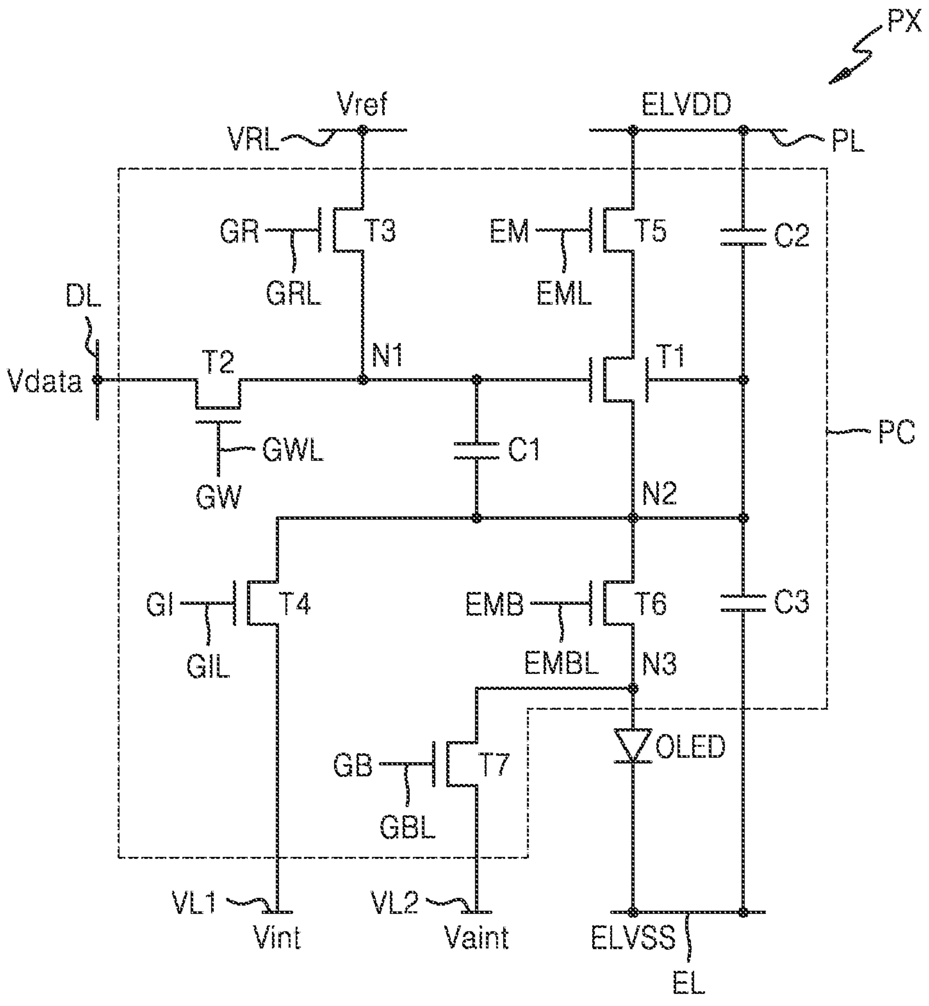
FIG. 15 is a schematic diagram of an equivalent circuit of a pixel according to an embodiment.
Figure 16:
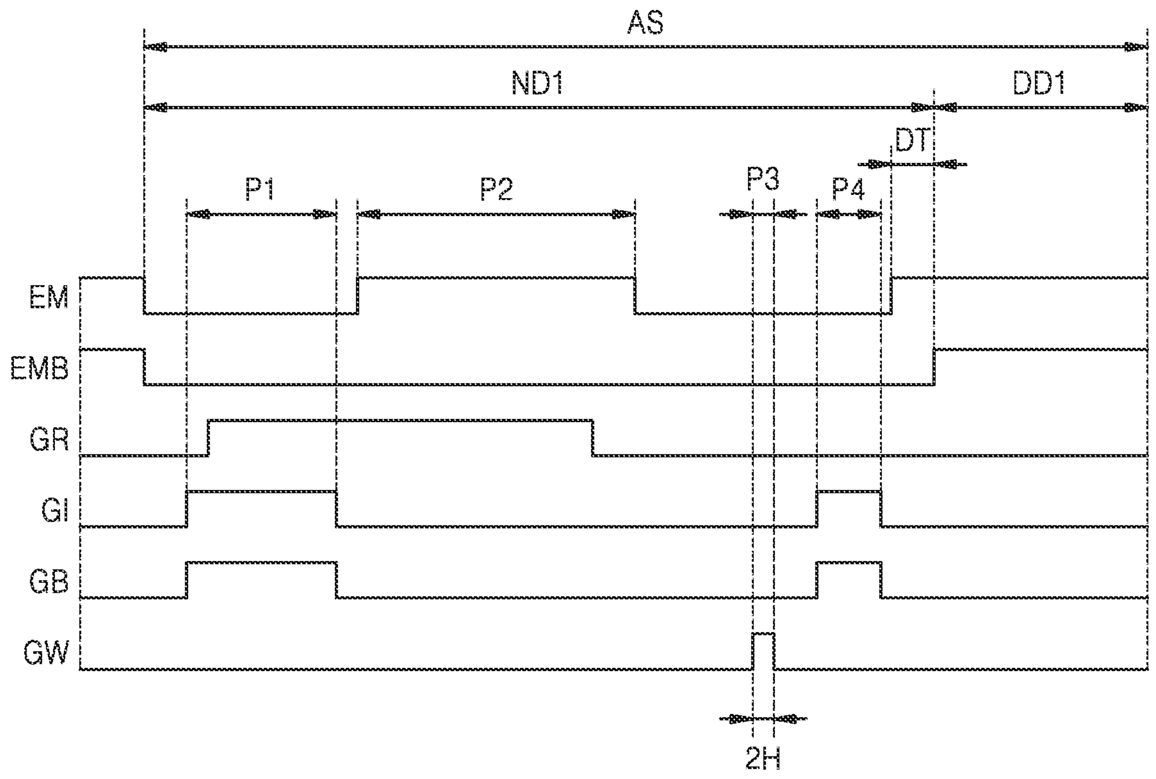
FIGS. 16 and 17 are diagrams illustrating gate signals supplied to the pixel shown in FIG. 15.
Figure 17:
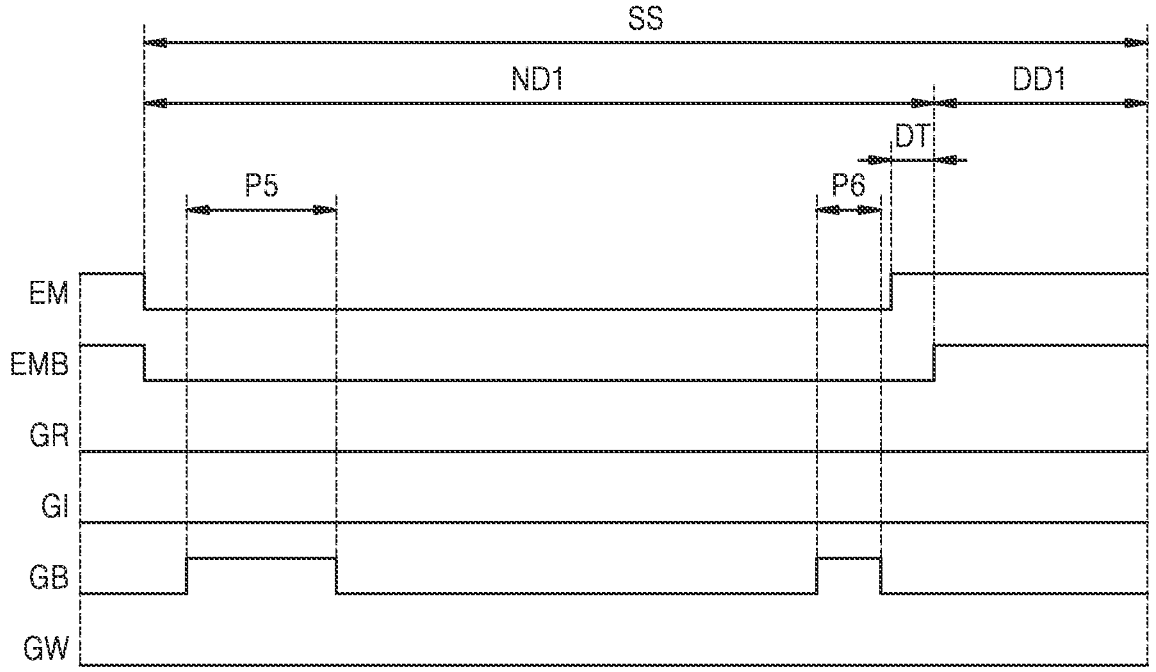

FIG. 15 is a schematic diagram of an equivalent circuit of a pixel according to an embodiment. FIGS. 16 and 17 are schematic diagrams illustrating gate signals supplied to the pixel shown in FIG. 15.

A pixel PX shown in FIG. 15 is different from the pixel PX shown in FIG. 6 in that a gate of the seventh transistor T7 is connected to a sixth gate line GBL to receive a sixth gate signal GB. The pixel PX shown in FIG. 15 may operate in the first scan period AS according to FIG. 16 and one or more second scan periods SS according to FIG. 17 during one frame.

Referring to FIG. 16, in the first scan period AS, the sixth gate signal GB and the second gate signal GI may be supplied to the pixel PX at the same timing. Referring to FIG. 17, in the second scan period SS, the second gate signal GI may be supplied as a gate-off voltage, and the sixth gate signal GB may be supplied as a gate-on voltage in each of the fifth period P5 and the sixth period P6.

Figure 18:
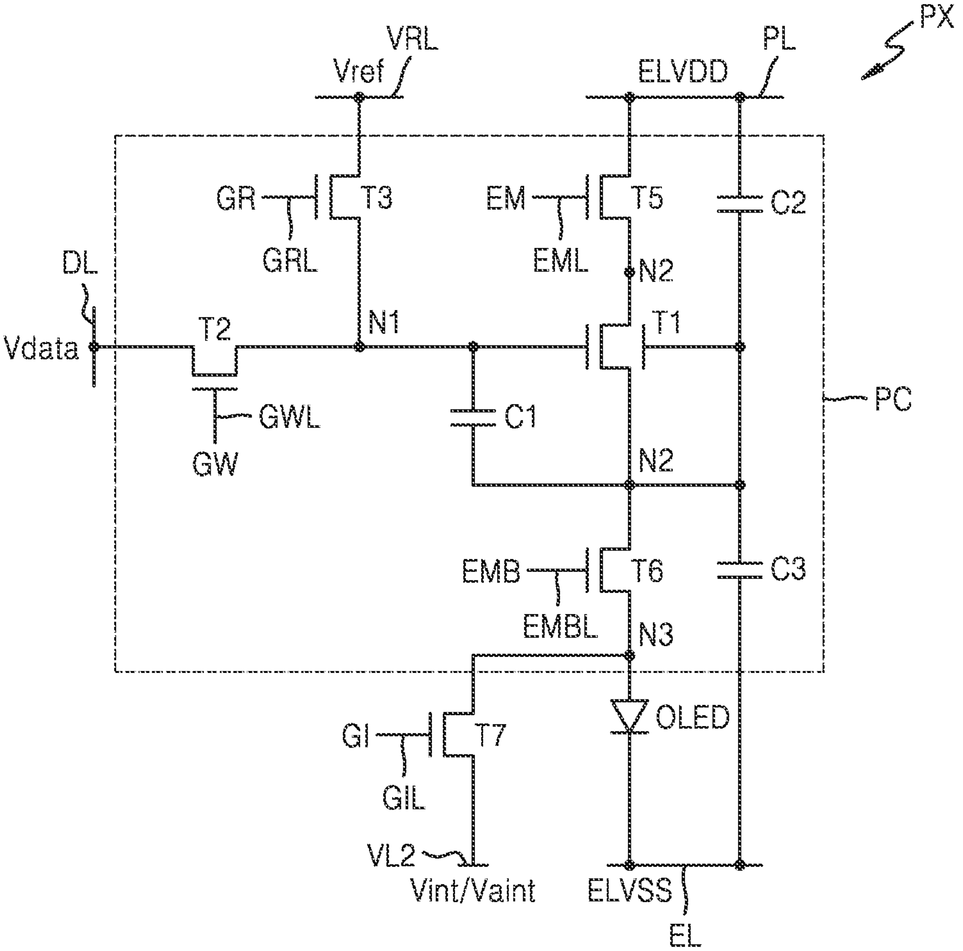
FIG. 18 is a schematic diagram of an equivalent circuit of a pixel according to an embodiment.

FIG. 18 is a schematic diagram of an equivalent circuit of a pixel according to an embodiment.

A pixel PX shown in FIG. 18 may differ from the pixel PX shown in FIG. 6 in that the fourth transistor T4 is omitted. The first initialization voltage Vint or the second initialization voltage Vaint may be supplied to the second initialization voltage line VL2 of the seventh transistor T7. Other configurations and operations of the pixel PX shown in FIG. 18 are the same as those of the pixel PX shown in FIGS. 6 to 8.

Figure 19:
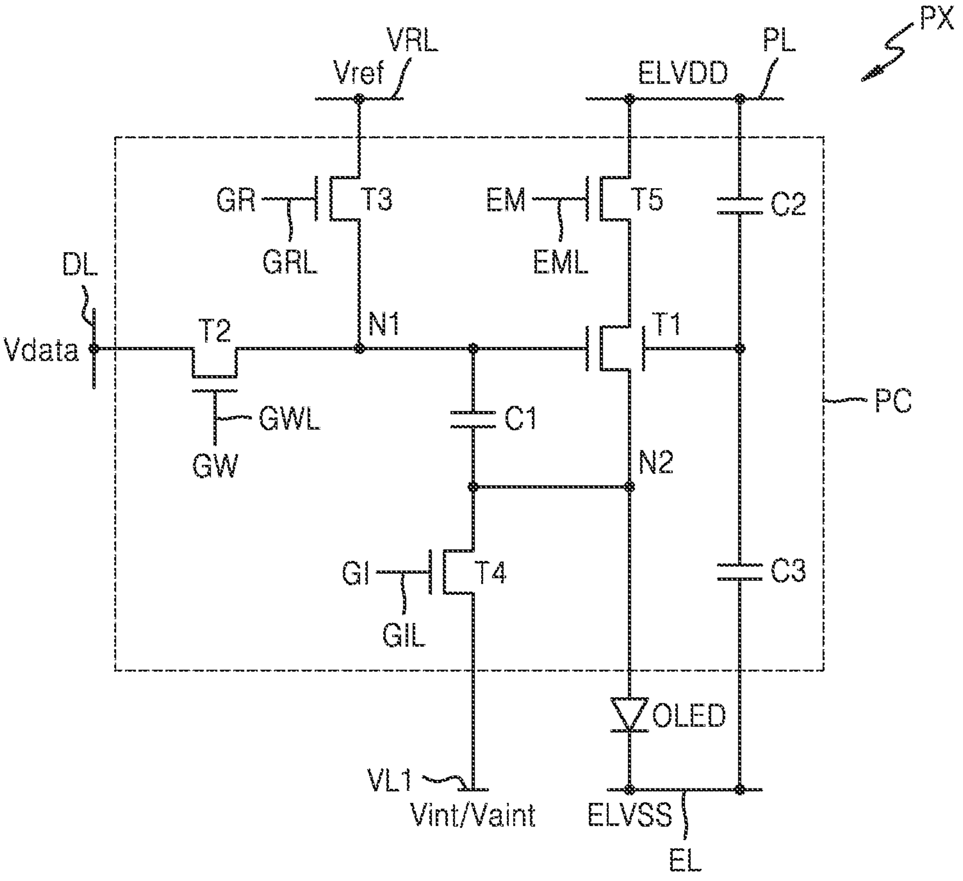
FIG. 19 is a schematic diagram of an equivalent circuit of a pixel according to an embodiment.
Figure 20:
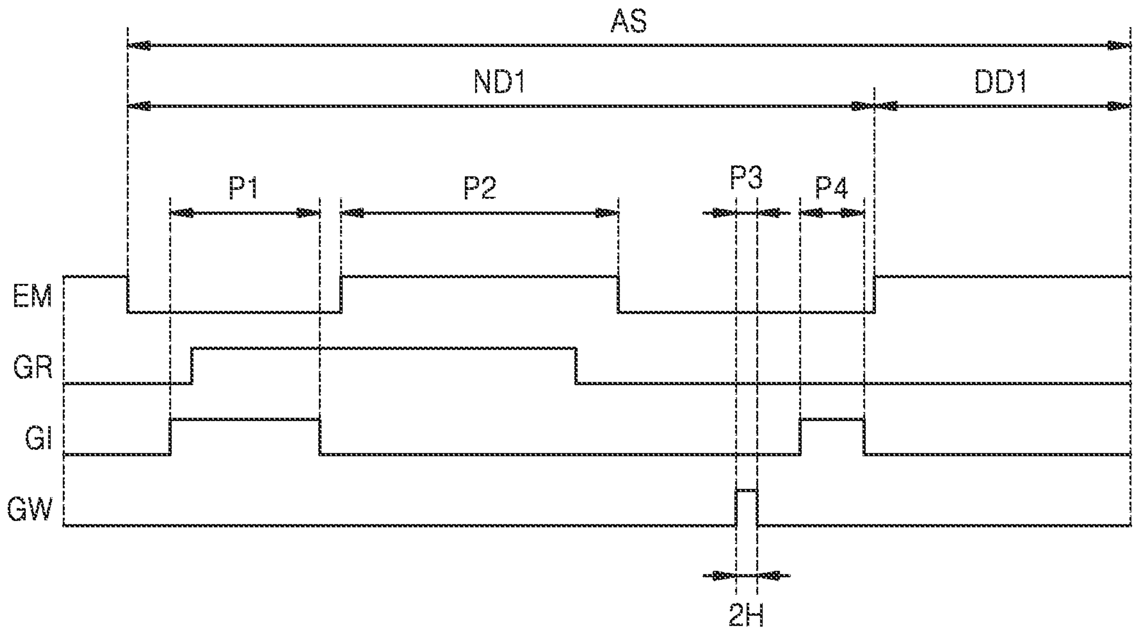
FIGS. 20 and 21 are schematic diagrams illustrating gate signals supplied to the pixel shown in FIG. 19.
Figure 21:
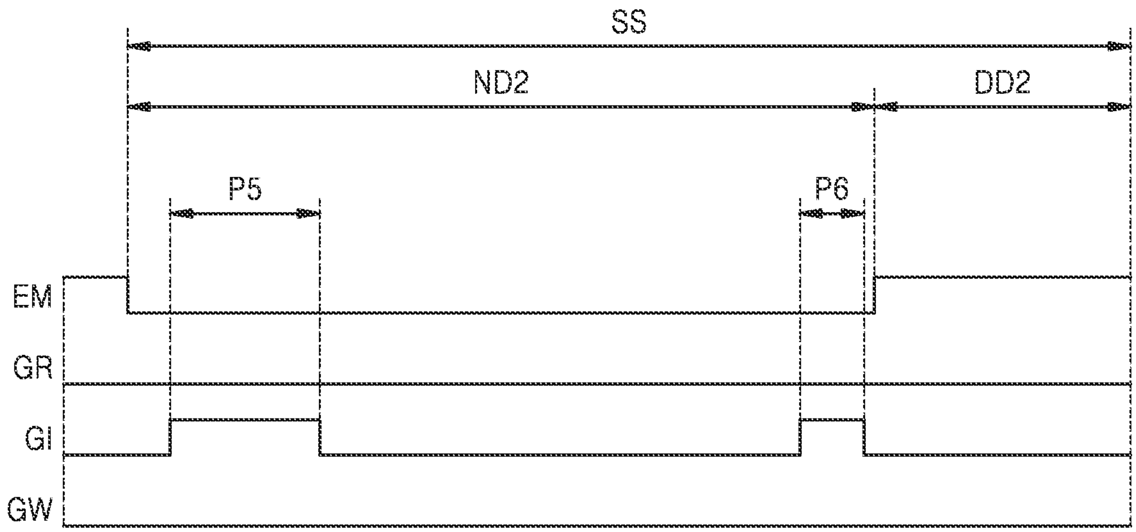

FIG. 19 is a schematic diagram of an equivalent circuit of a pixel according to an embodiment. FIGS. 20 and 21 are schematic diagrams illustrating gate signals supplied to the pixel shown in FIG. 19.

A pixel PX shown in FIG. 19 may differ from the pixel PX shown in FIG. 6 in that the sixth transistor T6 and the seventh transistor T7 are omitted. The pixel PX shown in FIG. 19 may operate in the first scan period AS according to FIG. 20 and one or more second scan periods SS according to FIG. 21 during one frame. Referring to FIGS. 20 and 21, except for the fact that the fifth gate signal EMB is omitted, operations in the first scan period AS and the second scan period SS are the same as those of the first scan period AS and the second scan period SS shown in FIGS. 7 and 8.

Figure 22:
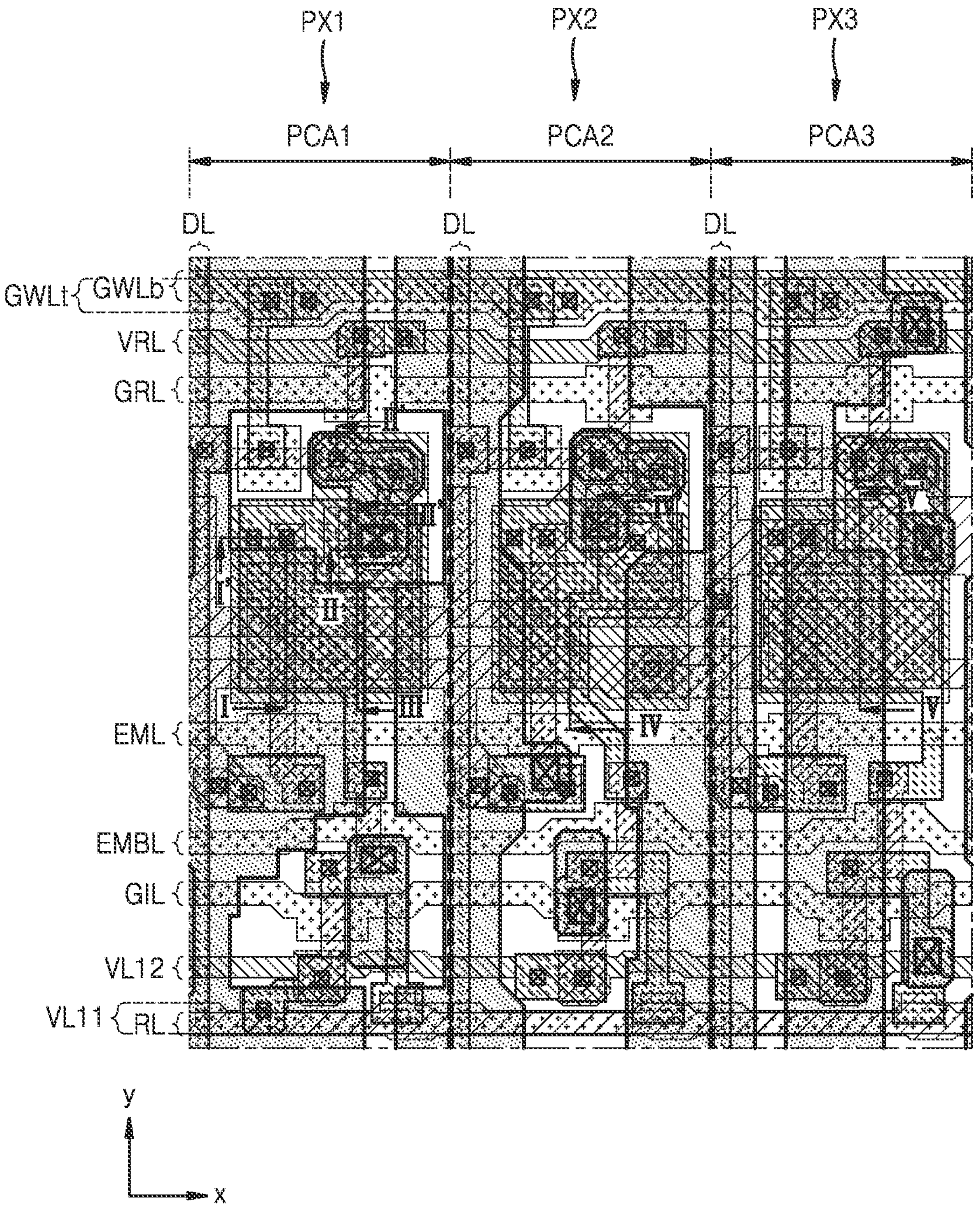
FIG. 22 is a layout diagram illustrating positions of transistors and capacitors of pixels according to an embodiment.

FIG. 22 is a layout diagram illustrating positions of transistors and capacitors of pixels according to an embodiment. FIGS. 23 to 33 are layout diagrams illustrating elements of the pixel shown in FIG. 6 for each layer. FIG. 34 shows schematic cross-sectional views respectively taken along lines I-I' and II-II' of FIGS. 22 and 32.

Although FIG. 22 shows an example of a pixel circuit of the pixel shown in FIG. 18, the pixel circuit shown in FIG. 22 may be similarly applied to the pixel circuits of the pixels shown in FIGS. 6, 15, and 19, and positions of corresponding transistors and capacitors may be similar.

The pixels PX arranged in the display area DA may include a first pixel PX1 emitting light in a first color, a second pixel PX2 emitting light in a second color, and a third pixel PX3 emitting light in a third color. For example, the first pixel PX1 may be a red pixel, the second pixel PX2 may be a green pixel, and the third pixel PX3 may be a blue pixel. The first pixel PX1, the second pixel PX2, and the third pixel PX3 may be repeatedly arranged according to a certain pattern in an x-axis direction and a y-axis direction. Each of the first pixel PX1, the second pixel PX2, and the third pixel PX3 may include a pixel circuit and the organic light-emitting diode OLED as a display element electrically connected to the pixel circuit.

The display area DA defined in the substrate 100 may include circuit areas where rows and columns intersect and pixel circuits are arranged. In an embodiment, a unit circuit area including two or more adjacent circuit areas in the x-axis direction may be defined in the substrate 100. For example, a unit circuit area PCAu (refer to FIG. 31) may include three circuit areas including a first circuit area PCA1, a second circuit area PCA2, and a third circuit area PCA3, which are adjacent in the x-axis direction. The first circuit area PCA1 may be an area in which a pixel circuit of the first pixel PX1 is arranged. The second circuit area PCA2 may be an area in which a pixel circuit of the second pixel PX2 is arranged. The third circuit area PCA3 may be an area in which a pixel circuit of the third pixel PX3 is arranged.

Each of the pixel circuits PC arranged in the first circuit area PCA1, the second circuit area PCA2, and the third circuit area PCA3 may correspond to the pixel circuit PC of the pixel shown in FIG. 18. The pixel circuits PC arranged in the first circuit area PCA1, the second circuit area PCA2, and the third circuit area PCA3 may be respectively electrically connected to display elements emitting different colors. The pixel circuits PC arranged in the first circuit area PCA1, the second circuit area PCA2, and the third circuit area PCA3 may respectively drive the display elements electrically connected thereto. For example, a display element electrically connected to a pixel circuit arranged in the first circuit area PCA1 may emit red light. A display element electrically connected to a pixel circuit arranged in the second circuit area PCA2 may emit green light. A display element electrically connected to a pixel circuit arranged in the third circuit area PCA3 may emit blue light.

In an embodiment, by considering emission characteristics of the first pixel PX1, the second pixel PX2, and the third pixel PX3, different first initialization voltages Vint may be supplied to the first pixel PX1, the second pixel PX2, and the third pixel PX3. For example, the pixel circuit PC of the first pixel PX1 may be connected to a first-first initialization voltage line VL11, and the pixel circuit PC of the second pixel PX2 and the pixel circuit PC of the third pixel PX3 may be connected to a first-second initialization voltage line VL12. A first initialization voltage supplied to the first-first initialization voltage line VL11 may be different from a first initialization voltage supplied to the first-second initialization voltage line VL12.

The same elements may be arranged on each layer of the first circuit area PCA1, the second circuit area PCA2, and the third circuit area PCA3. Hereinafter, for convenience of illustration and description, reference numerals are given to the elements of the pixel circuit PC arranged in the first circuit area PCA1, descriptions are made with respect to the first circuit area PCA1, and descriptions of the same elements may be substantially equally applied to the elements of the second circuit area PCA2 and the third circuit area PCA3. Hereinafter, descriptions are made with reference to FIGS. 23 to 34 together.

Figure 23:
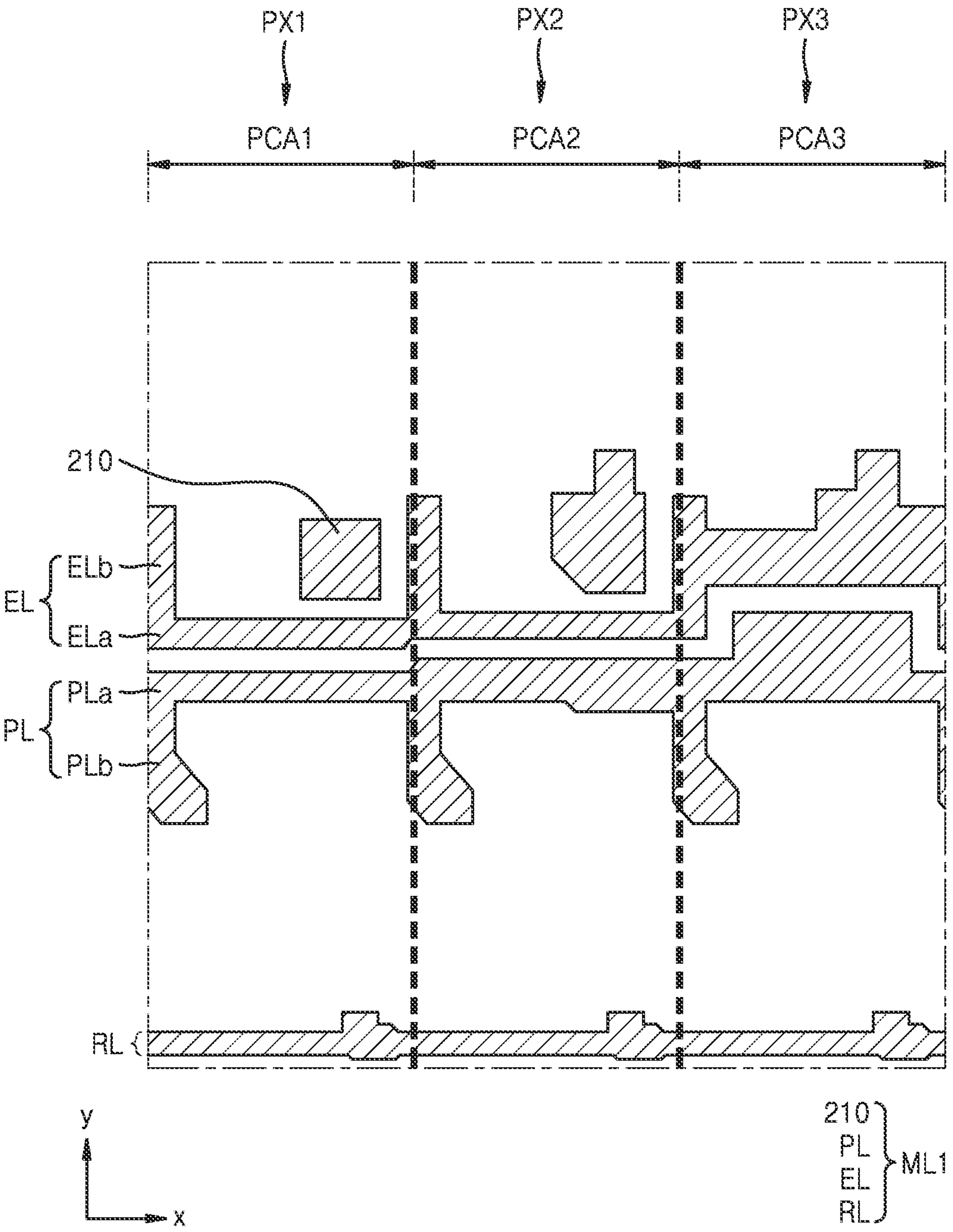
FIGS. 23, 24, 25, 26, 27, 28, 29, 30, 31, 32, and 33 are layout diagrams illustrating elements of the pixel shown in FIG. 6 for each layer.

A first conductive layer ML1 may be disposed on the substrate 100. As shown in FIG. 23, the first conductive layer ML1 may include a first electrode layer 210, the first driving voltage line PL, the second driving voltage line EL, and a repair line RL.

The substrate 100 may include a glass material, a ceramic material, a metal material, or a flexible or bendable material. The substrate 100 may have a single-layered structure of an organic layer or a multi-layered structure of an organic layer and an inorganic layer. For example, the substrate 100 may have a stacked structure of a first base layer/barrier layer/second base layer. The first base layer and the second base layer may each include a polymer resin. The first base layer and the second base layer may each include a transparent polymer resin. The barrier layer may be a barrier layer preventing penetration of external foreign materials, and may include a single layer or a multi-layer, each including an inorganic material such as silicon nitride ($SiN_x$) or silicon oxide ($SiO_x$). In another example, a barrier layer may be further arranged between the substrate 100 and the first conductive layer ML1.

The first electrode layer 210 may be formed in an island type. The first electrode layer 210 may be arranged adjacent to the second driving voltage line EL in the first circuit area PCA1 and the second circuit area PCA2, and may not be arranged in the third circuit area PCA3. The first electrode layer 210 may include a lower first electrode C11*b* (refer to FIG. 35A) of the first capacitor C1.

The first driving voltage line PL may extend in an x-axis direction, and may be arranged to cross the first circuit area PCA1, the second circuit area PCA2, and the third circuit area PCA3. In each circuit area, the first driving voltage line PL may include a main line PLa extending in the x-axis direction and a protruding portion PLb protruding in a −y-axis direction from the main line PLa. The main line PLa of the first driving voltage line PL may include a first electrode C11*b* (refer to FIG. 35A) of the second capacitor C2. A width of the main line PLa of the first driving voltage line PL in a y-axis direction in the third circuit area PCA3 may be greater than a width of the main line PLa of the first driving voltage line PL in the y-axis direction in the first circuit area PCA1 and a width of the main line PLa of the first driving voltage line PL in the y-axis direction in the second circuit area PCA2.

The second driving voltage line EL may extend in the x-axis direction, and may be arranged to cross the first circuit area PCA1, the second circuit area PCA2, and the third circuit area PCA3. The second driving voltage line EL may be arranged in parallel to the first driving voltage line PL. In each circuit area, the second driving voltage line EL may include a main line ELa extending in the x-axis direction and a protruding portion ELb protruding in a positive y-axis direction from the main line ELa. The main line ELa of the second driving voltage line EL may include a first electrode C31 (refer to FIG. 35A) of the third capacitor C3. A width of the main line ELa of the second driving voltage line EL in the y-axis direction in the third circuit area PCA3 may be greater than a width of the main line ELa of the second driving voltage line EL in the y-axis direction in the first circuit area PCA1 and a width of the main line ELa of the second driving voltage line EL in the y-axis direction in the second circuit area PCA2.

The repair line RL may extend in the x-axis direction, and may be arranged to cross the first circuit area PCA1, the second circuit area PCA2, and the third circuit area PCA3.

Figure 24:
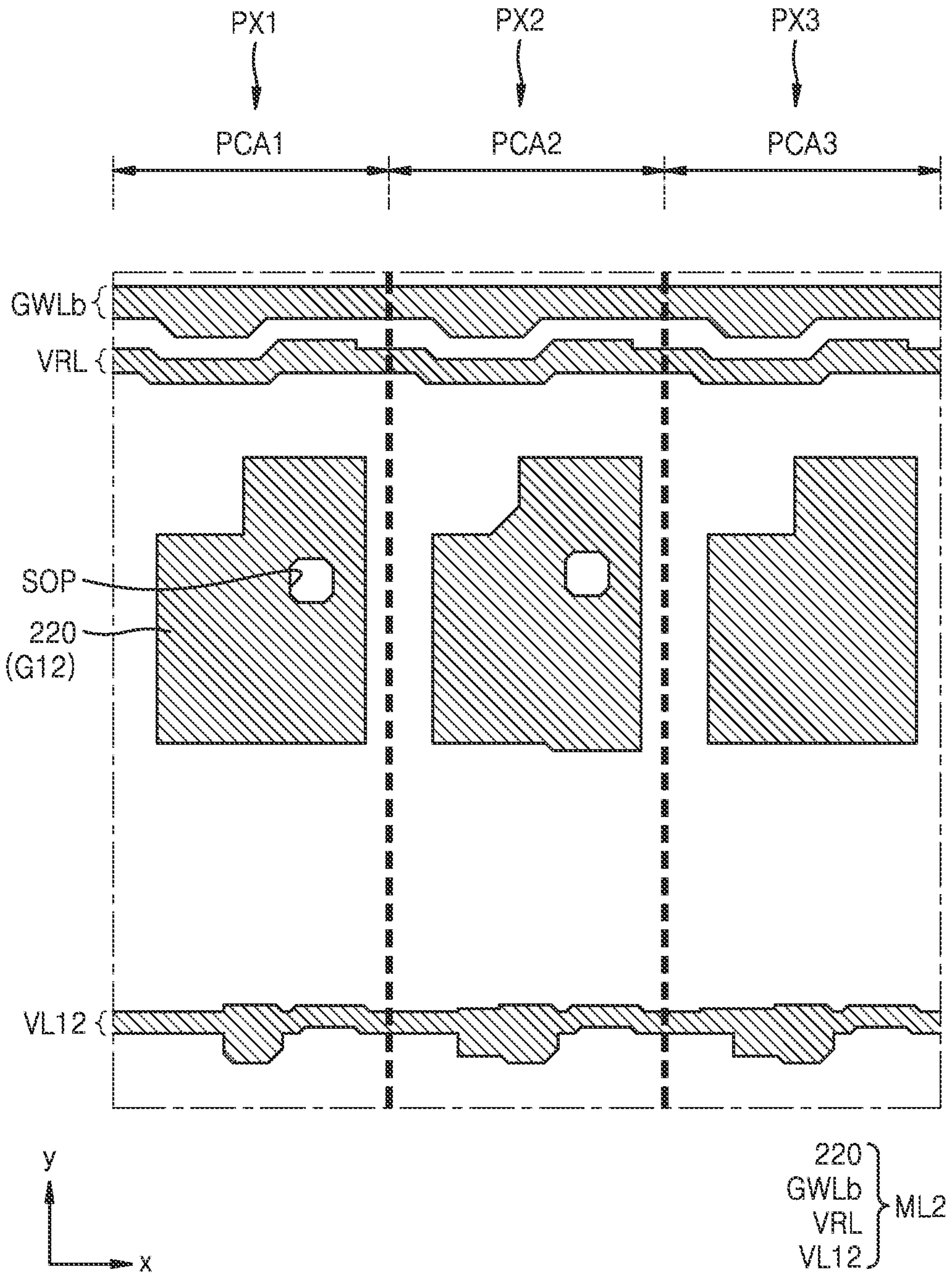

A first insulating layer 111 may be disposed on the substrate 100 and cover the first conductive layer ML1, and a second conductive layer ML2 may be disposed on the first insulating layer 111. As shown in FIG. 24, the second conductive layer ML2 may include a second electrode layer 220, a lower first gate line GWLb, the reference voltage line VRL, and the first-second initialization voltage line VL12.

The second electrode layer 220 may be provided in an island type. The second electrode layer 220 may overlap the first electrode layer 210, the main line PLa of the first driving voltage line PL, and the main line ELa of the second driving voltage line EL. An opening SOP overlapping the first electrode layer 210 may be defined in the second electrode layer 220 of the first circuit area PCA1 and the second circuit area PCA2. In the second electrode layer 220, a portion overlapping the first electrode layer 210 may include a lower second electrode C12*b* (refer to FIG. 35A) of the first capacitor C1. In the second electrode layer 220, a portion overlapping the main line PLa of the first driving voltage line PL may include a second electrode C22 (refer to FIG. 35A) of the second capacitor C2. In the second electrode layer 220, a portion overlapping the main line ELa of the second driving voltage line EL may include a second electrode C32 (refer to FIG. 35A) of the third capacitor C3.

The lower first gate line GWLb, the reference voltage line VRL, and the first-second initialization voltage line VL12 may extend in the x-axis direction, and may be arranged to cross the first circuit area PCA1, the second circuit area PCA2, and the third circuit area PCA3.

Figure 25:
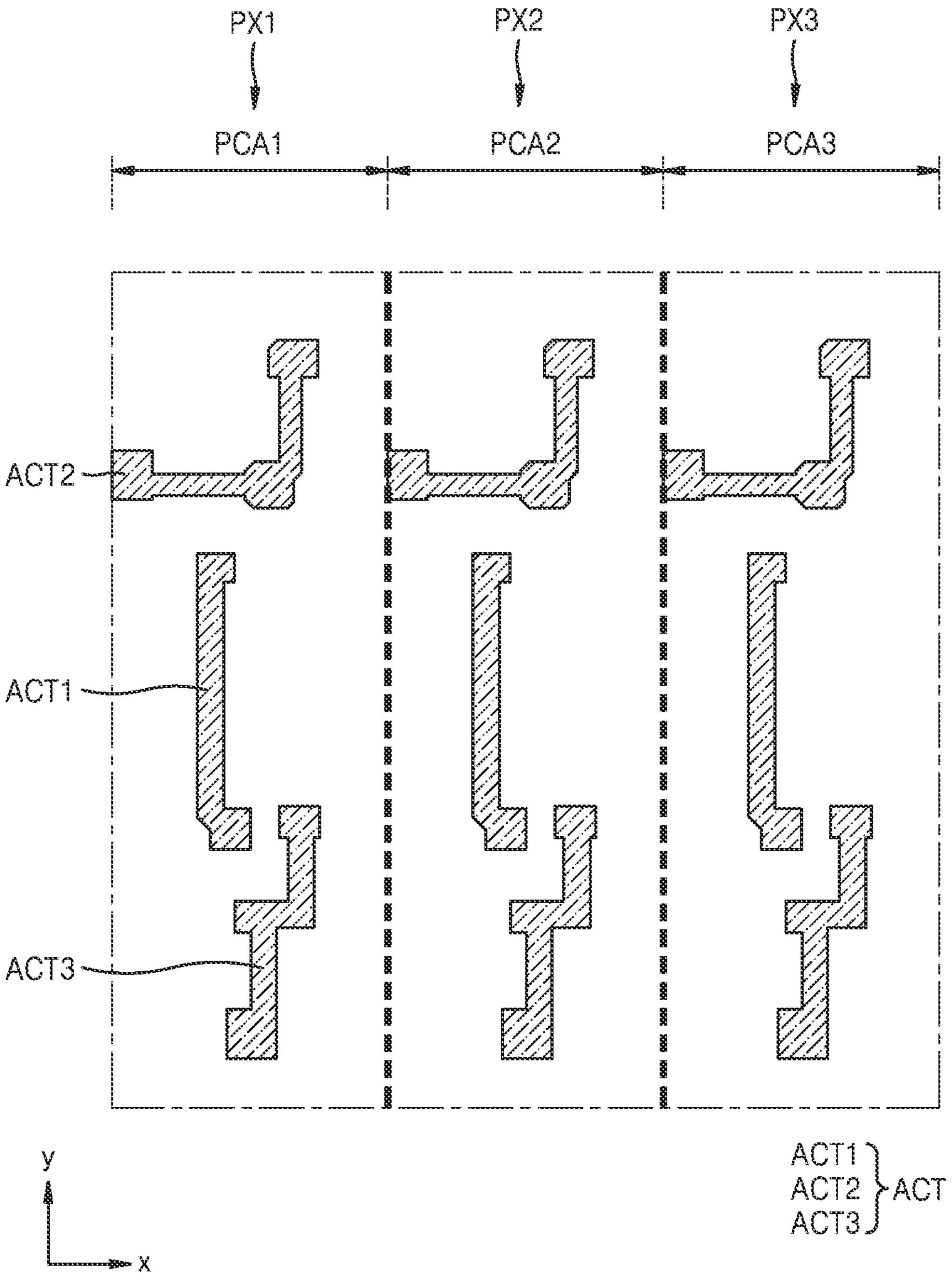

A second insulating layer 112 may be disposed on the first insulating layer 111 and cover the second conductive layer ML2, and a semiconductor layer ACT including an oxide semiconductor may be disposed on the second insulating layer 112 as shown in FIG. 25. The semiconductor layer ACT may include a first semiconductor layer ACT1, a second semiconductor layer ACT2, and a third semiconductor layer ACT3. The semiconductor layer ACT may include a channel area, a source area, and a drain area, which are respectively on both sides of the channel area, of each of first to third transistors T1 to T3 and fifth to seventh transistors T5 to T7. The source area or the drain area may be interpreted as a source electrode or a drain electrode of a transistor according to some cases.

Figure 27:
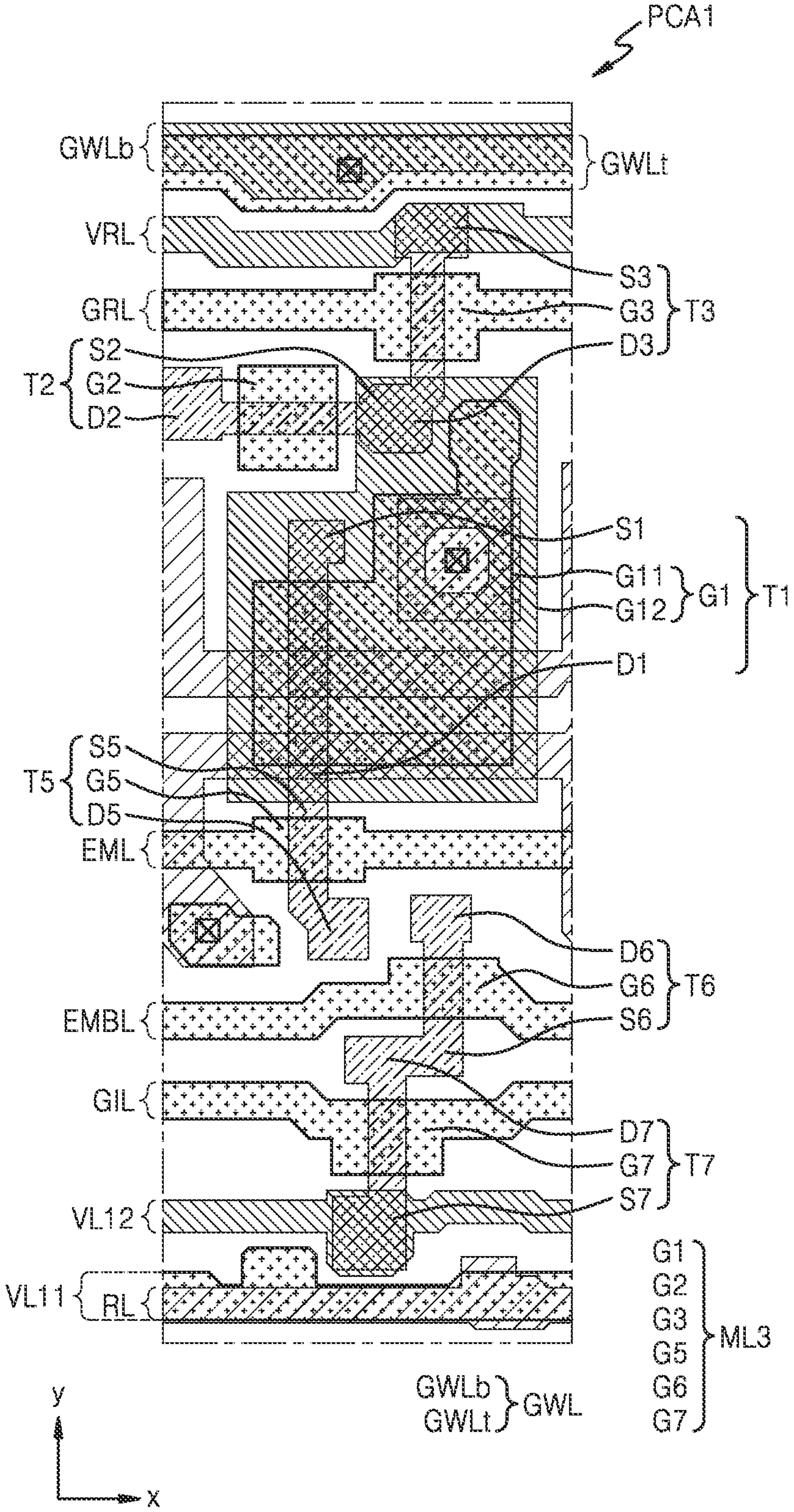

FIG. 27 shows transistors of the first circuit area PCA1. Referring to FIG. 27, the first semiconductor layer ACT1 may include a source area S1 and a drain area D1 of the first transistor T1 and a source area S5 and a drain area D5 of the fifth transistor T5. The second semiconductor layer ACT2 may include a source area S2 and a drain area D2 of the second transistor T2 and a source area S3 and a drain area D3 of the third transistor T3. The third semiconductor layer ACT3 may include a source area S6 and a drain area D6 of the sixth transistor T6 and a source area S7 and a drain area D7 of the seventh transistor T7.

Figure 26:
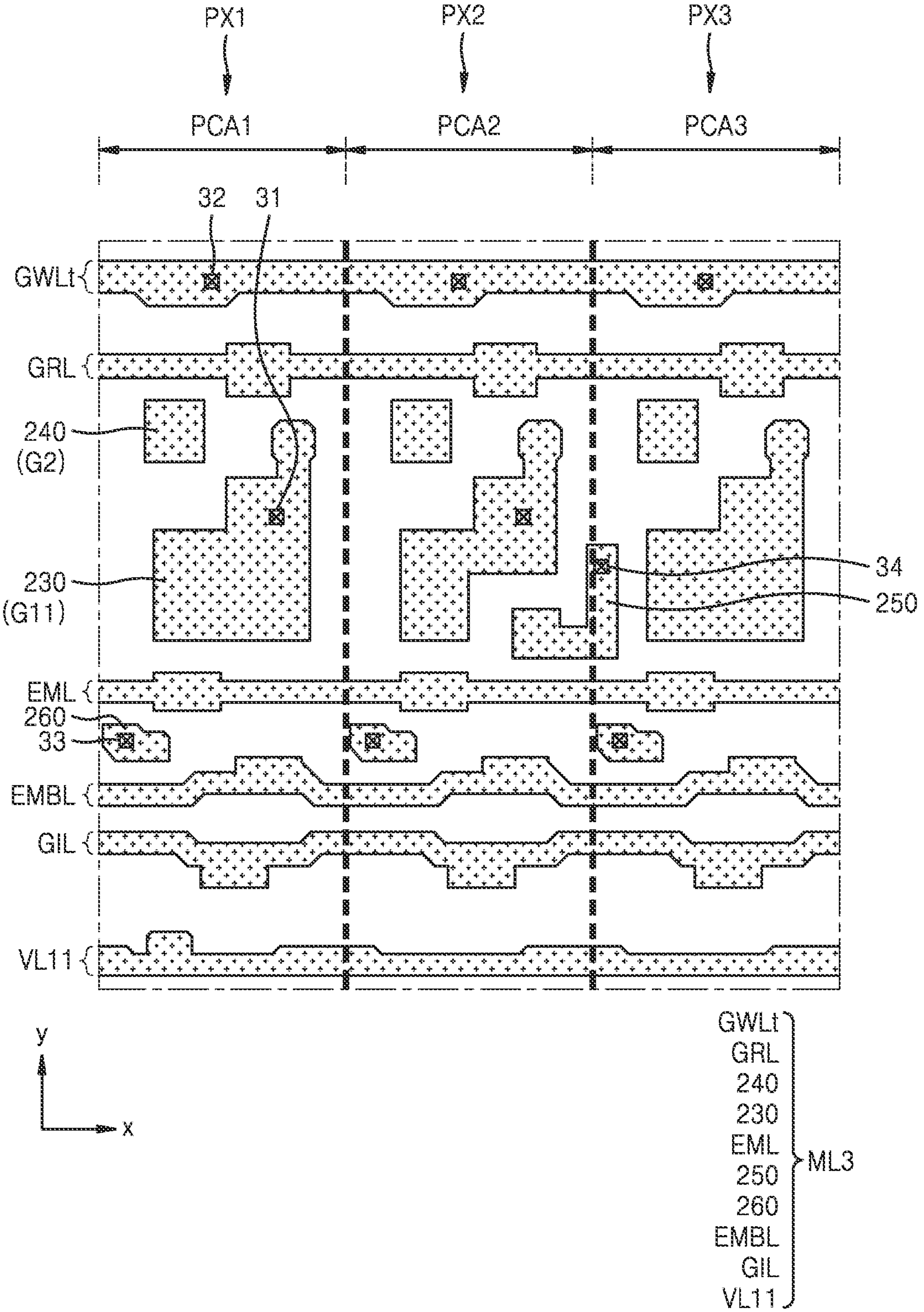

A third insulating layer 113 may be disposed on the second insulating layer 112 and cover the semiconductor layer ACT, and a third conductive layer ML3 may be disposed on the third insulating layer 113. As shown in FIG. 26, the third conductive layer ML3 may include a third electrode layer 230, a fourth electrode layer 240, connection electrodes 250 and 260, an upper first gate line GWLt, the second gate line GIL, the third gate line GRL, the fourth gate line EML, the fifth gate line EMBL, and the first-first initialization voltage line VL11.

The third electrode layer 230, the fourth electrode layer 240, and the connection electrodes 250 and 260 may each be formed in an island type. The third electrode layer 230, the fourth electrode layer 240, and the connection electrode 260 may be arranged in each of the first circuit area PCA1, the second circuit area PCA2, and the third circuit area PCA3. The connection electrode 250 may be arranged in some areas from among the first circuit area PCA1, the second circuit area PCA2, and the third circuit area PCA3. For example, as shown in FIG. 26, the connection electrode 250 may be arranged between the second circuit area PCA2 and the third circuit area PCA3.

In the first circuit area PCA1 and the second circuit area PCA2, the third electrode layer 230 may be connected (e.g., electrically connected) to the first electrode layer 210 through a contact hole 31 penetrating (or passing through) the first insulating layer 111, the second insulating layer 112, and the third insulating layer 113. The contact hole 31 may be insulated from the opening SOP of the second electrode layer 220 and positioned within the opening SOP.

The connection electrode 250 may be connected (e.g., electrically connected) to the second driving voltage line EL through a contact hole 34 penetrating (or passing through) the first insulating layer 111, the second insulating layer 112, and the third insulating layer 113.

In the first circuit area PCA1, the second circuit area PCA2, and the third circuit area PCA3, the connection electrode 260 may be connected (e.g., electrically connected) to the protruding portion PLb of the first driving voltage line PL through a contact hole 33 penetrating (or passing through) the first insulating layer 111, the second insulating layer 112, and the third insulating layer 113.

The upper first gate line GWLt, the second gate line GIL, the third gate line GRL, the fourth gate line EML, the fifth gate line EMBL, and the first-first initialization voltage line VL11 may extend in the x-axis direction, and may be arranged to cross the first circuit area PCA1, the second circuit area PCA2, and the third circuit area PCA3.

The upper first gate line GWLt may be connected (e.g., electrically connected) to the lower first gate line GWLb through a contact hole 32 penetrating (or passing through) the second insulating layer 112 and the third insulating layer 113.

As shown in FIG. 27, the third conductive layer ML3 may include gate electrodes G1 to G3 of the first to third transistors T1 to T3 and gate electrodes G5 to G7 of the fifth to seventh transistors T5 to T7. The gate electrodes G1 to G3 and G5 to G7 may overlap the channel areas of the semiconductor layer ACT.

Referring to FIG. 27, the third electrode layer 230 may include a first gate electrode G11 of the first transistor T1. The first gate electrode G11 may overlap the first semiconductor layer ACT1. A portion of the third electrode layer 230 may be an upper first electrode C11*t* (refer to FIG. 35A) of the first capacitor C1. The fourth electrode layer 240 may be the gate electrode G2 of the second transistor T2. The fourth electrode layer 240 may overlap the second semiconductor layer ACT2. The gate electrode G3 of the third transistor T3 may be a portion of the third gate line GRL overlapping the second semiconductor layer ACT2. The gate electrode G5 of the fifth transistor T5 may be a portion of the fourth gate line EML overlapping the first semiconductor layer ACT1. The gate electrode G6 of the sixth transistor T6 may be a portion of the fifth gate line EMBL overlapping the third semiconductor layer ACT3. The gate electrode G7 of the seventh transistor T7 may be a portion of the second gate line GIL overlapping the third semiconductor layer ACT3.

Figure 28:
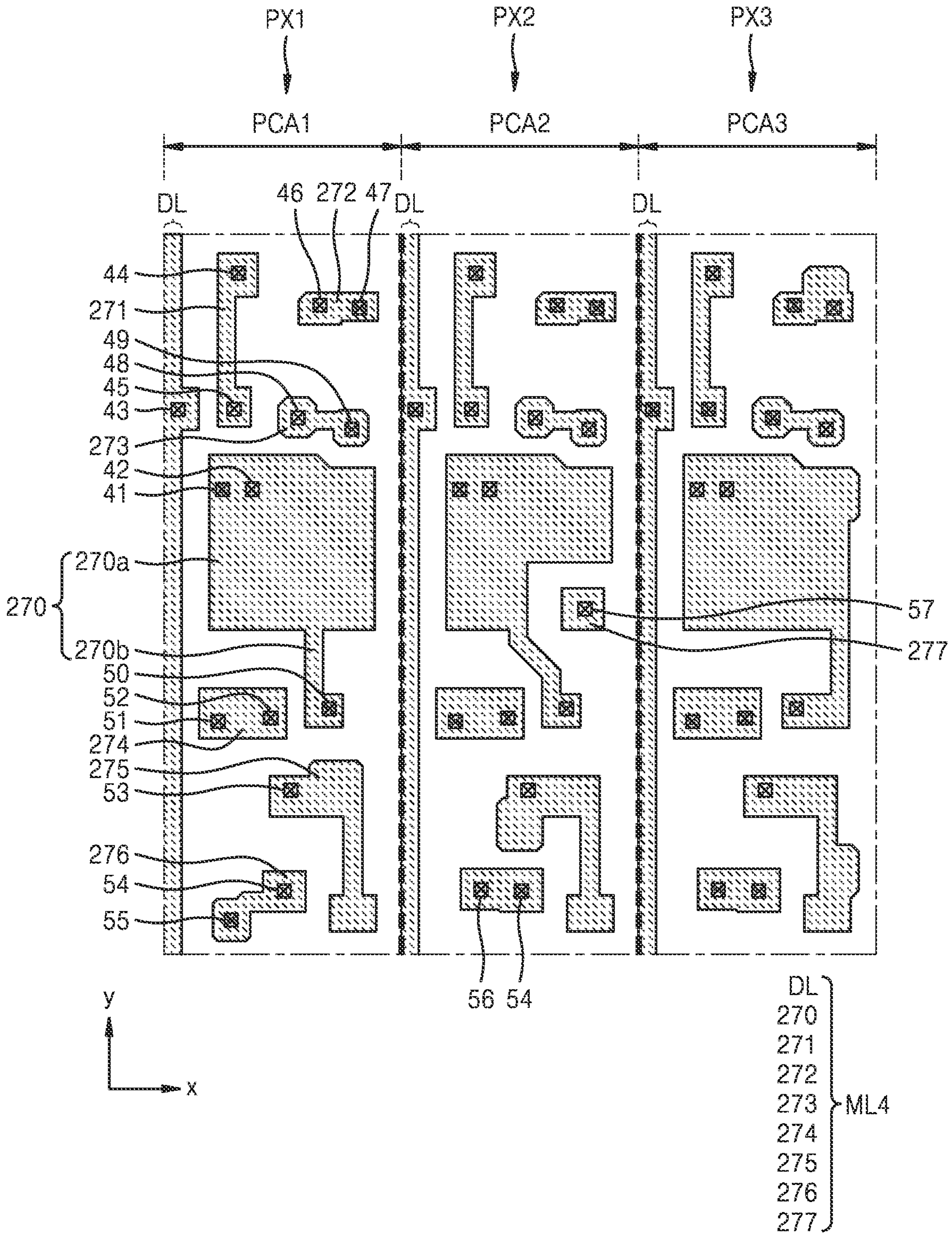

A fourth insulating layer 114 may be disposed on the third insulating layer 113 and cover the third conductive layer ML3, and a fourth conductive layer ML4 may be disposed on the fourth insulating layer 114. As shown in FIG. 28, the fourth conductive layer ML4 may include the data line DL and connection electrodes 270, 271, 272, 273, 274, 275, 276, and 277.

The data line DL may be arranged to extend in the y-axis direction in each circuit area. The data line DL may be connected (e.g., electrically connected) to the drain area D2 of the second transistor T2 through a contact hole 43 penetrating (or passing through) the third insulating layer 113 and the fourth insulating layer 114.

The connection electrode 270 may include a first area 270*a* overlapping the first electrode layer 210, the second electrode layer 220, and the third electrode layer 230, and a second area 270*b* protruding in the negative y-axis direction from the first area 270*a*. The connection electrode 270 may connect (e.g., electrically connect) the source area S1 of the first transistor T1 to the sixth transistor T6.

The first area 270*a* of the connection electrode 270 may be connected (e.g., electrically connected) to the source area S1 of the first transistor T1 through a contact hole 42 penetrating (or passing through) the third insulating layer 113 and the fourth insulating layer 114. The first area 270*a* of the connection electrode 270 may be connected (e.g., electrically connected) to the second electrode layer 220 through a contact hole 41 penetrating (or passing through) the second insulating layer 112, the third insulating layer 113, and the fourth insulating layer 114. Accordingly, the connection electrode 270 may be a source electrode connected (e.g., electrically connected) to the source area S1 of the first transistor T1. The second electrode layer 220 may be a second gate electrode G12 (refer to FIG. 35A) of the first transistor T1, which faces the first gate electrode G11 of the first transistor T1 and overlaps the channel area of the first transistor T1. The second area 270*b* of the connection electrode 270 may be connected (e.g., electrically connected) to the drain area D6 of the sixth transistor T6 through a contact hole 50 penetrating (or passing through) the third insulating layer 113 and the fourth insulating layer 114. A portion of the connection electrode 270 may be an upper second electrode C12*t* (refer to FIG. 35A) of the first capacitor C1.

The connection electrode 271 may be connected (e.g., electrically connected) to the gate electrode G2 of the second transistor T2 through a contact hole 45 penetrating (or passing through) the fourth insulating layer 114. The connection electrode 271 may be connected (e.g., electrically connected) to the upper first gate line GWLt through a contact hole 44 penetrating (or passing through) the fourth insulating layer 114.

The connection electrode 272 may be connected (e.g., electrically connected) to the source area S3 of the third transistor T3 through a contact hole 46 penetrating (or passing through) the third insulating layer 113 and the fourth insulating layer 114, and may be connected (e.g., electrically connected) to the reference voltage line VRL through a contact hole 47 penetrating (or passing through) the second insulating layer 112, the third insulating layer 113, and the fourth insulating layer 114.

The connection electrode 273 may be connected (e.g., electrically connected) to the source area S2 of the second transistor T2 and the drain area D3 of the third transistor T3 through a contact hole 48 penetrating (or passing through) the third insulating layer 113 and the fourth insulating layer 114. The connection electrode 273 may be connected (e.g., electrically connected) to the third electrode layer 230 through a contact hole 49 penetrating (or passing through) the fourth insulating layer 114 to be connected (e.g., electrically connected) to the first gate electrode G11 of the first transistor T1.

The connection electrode 274 may be connected (e.g., electrically connected) to the protruding portion PLb of the first driving voltage line PL through a contact hole 51 penetrating (or passing through) the first insulating layer 111, the second insulating layer 112, the third insulating layer 113, and the fourth insulating layer 114. The connection electrode 274 may be connected (e.g., electrically connected) to the drain area D5 of the fifth transistor T5 through a contact hole 52 penetrating (or passing through) the third insulating layer 113 and the fourth insulating layer 114. Accordingly, the drain area D5 of the fifth transistor T5 may be connected (e.g., electrically connected) to the first driving voltage line PL.

The connection electrode 275 may be connected (e.g., electrically connected) to the source area S6 of the sixth transistor T6 and the drain area D7 of the seventh transistor T7 through a contact hole 53 penetrating (or passing through) the third insulating layer 113 and the fourth insulating layer 114. The connection electrode 275 may overlap a portion of the repair line RL. The connection electrode 275 may be insulated from the repair line RL and may be connected (e.g., electrically connected) to the repair line RL in case that a defect occurs in a pixel circuit arranged in a corresponding circuit area.

In the first circuit area PCA1, the connection electrode 276 may be connected (e.g., electrically connected) to the source area S7 of the seventh transistor T7 through a contact hole 54 penetrating (or passing through) the third insulating layer 113 and the fourth insulating layer 114. The connection electrode 276 may be connected to the first-first initialization voltage line VL11 through a contact hole 55 penetrating (or passing through) the fourth insulating layer 114.

In the second circuit area PCA2 and the third circuit area PCA3, the connection electrode 276 may be connected (e.g., electrically connected) to the source area S7 of the seventh transistor T7 through the contact hole 54 penetrating (or passing through) the third insulating layer 113 and the fourth insulating layer 114. The connection electrode 276 may be connected (e.g., electrically connected) to the first-second initialization voltage line VL12 through a contact hole 56 penetrating (or passing through) the second insulating layer 112, the third insulating layer 113, and the fourth insulating layer 114.

In the second circuit area PCA2, the connection electrode 277 may be connected (e.g., electrically connected) to the connection electrode 250 through a contact hole 57 penetrating (or passing through) the fourth insulating layer 114 to be connected (e.g., electrically connected) to the second driving voltage line EL.

Figure 29:
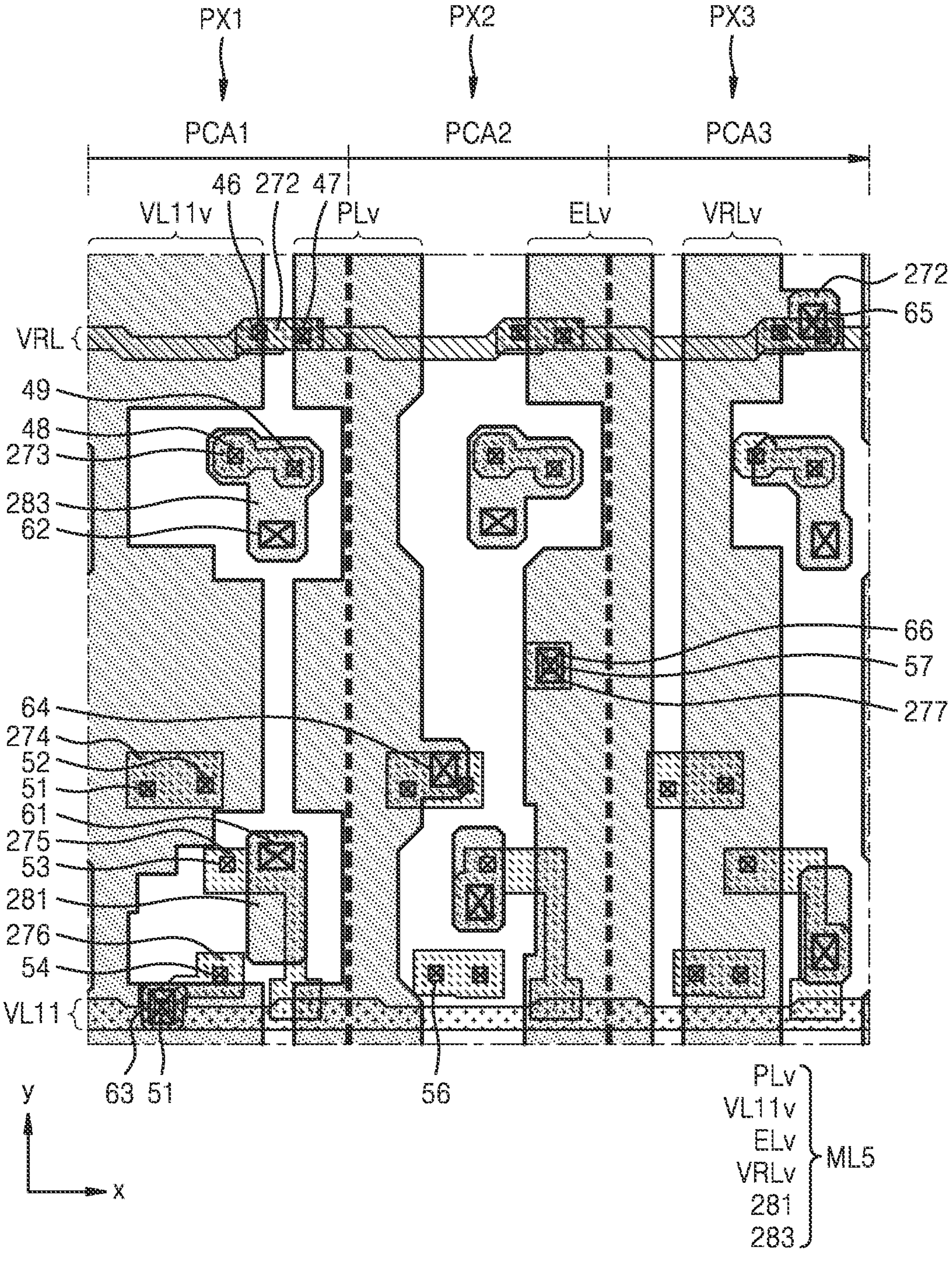
Figure 30:
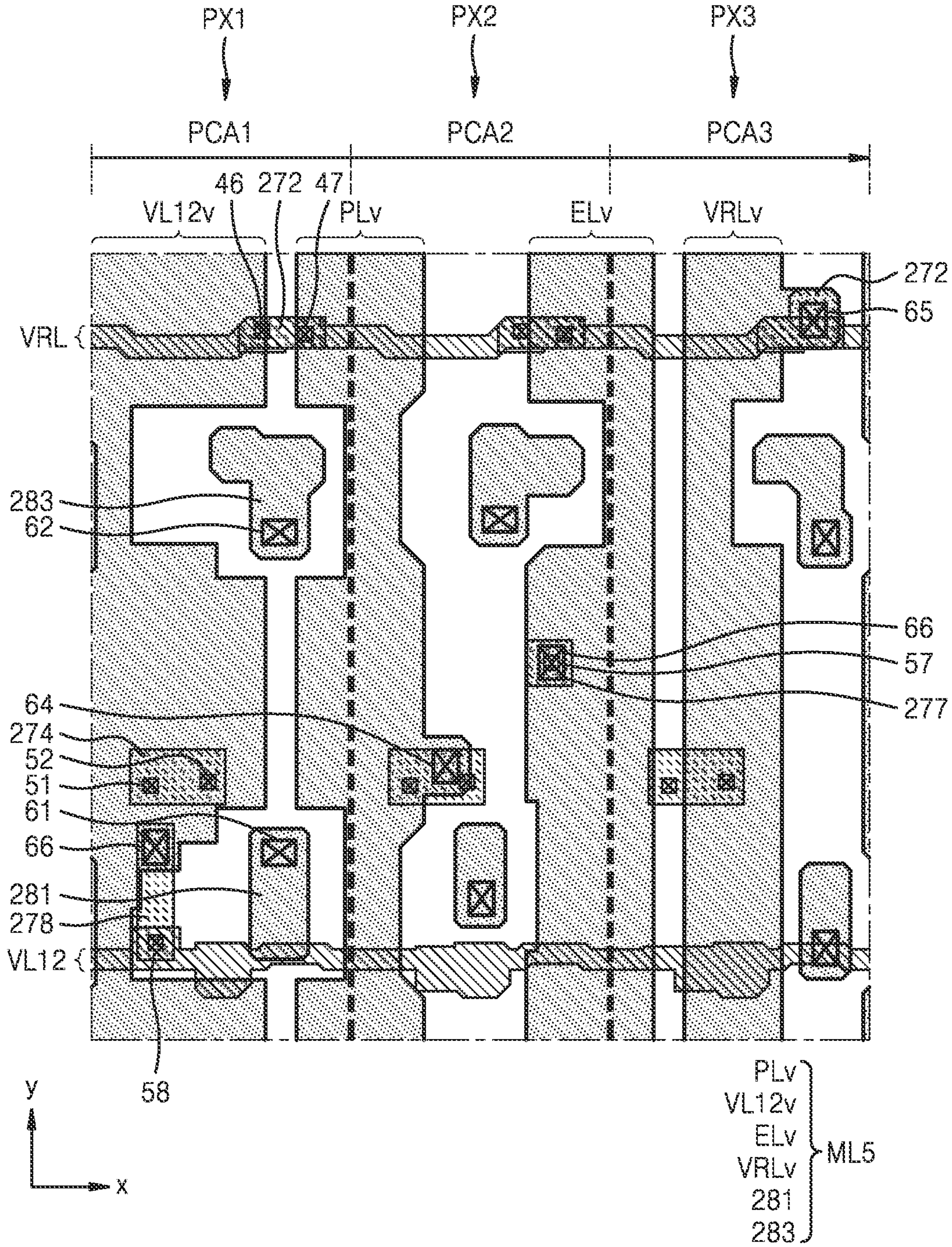

A fifth insulating layer 115 may be disposed on the fourth insulating layer 114 and cover the fourth conductive layer ML4, and a fifth conductive layer ML5 may be disposed on the fifth insulating layer 115. As shown in FIGS. 29 and 30, the fifth conductive layer ML5 may include vertical conductive lines and connection electrodes 281 and 283. FIGS. 29 and 30 show only a portion of the fourth conductive layer ML4 and the lower conductive layers for convenience of illustration and description.

The connection electrode 281 may be connected (e.g., electrically connected) to the connection electrode 275 through a contact hole 61 penetrating (or passing through) the fifth insulating layer 115 to be connected (e.g., electrically connected) to the source area S6 of the sixth transistor T6.

The connection electrode 283 may be connected (e.g., electrically connected) to the connection electrode 270 through a contact hole 62 penetrating (or passing through) the fifth insulating layer 115. The connection electrode 283 may be arranged to overlap a node where the source area S2 of the second transistor T2, the drain area D3 of the third transistor T3, and the first gate electrode G11 of the first transistor T1 are connected.

The vertical conductive lines may include a first vertical driving voltage line PLv, a first vertical initialization voltage line VL11*v*, a second vertical initialization voltage line VL12*v*, a second vertical driving voltage line ELv, and a vertical reference voltage line VRLv. The vertical lines may each extend in the y-axis direction, and may be arranged to be spaced apart each other in the x-axis direction in the first circuit area PCA1, the second circuit area PCA2, and the third circuit area PCA3.

Figure 31:
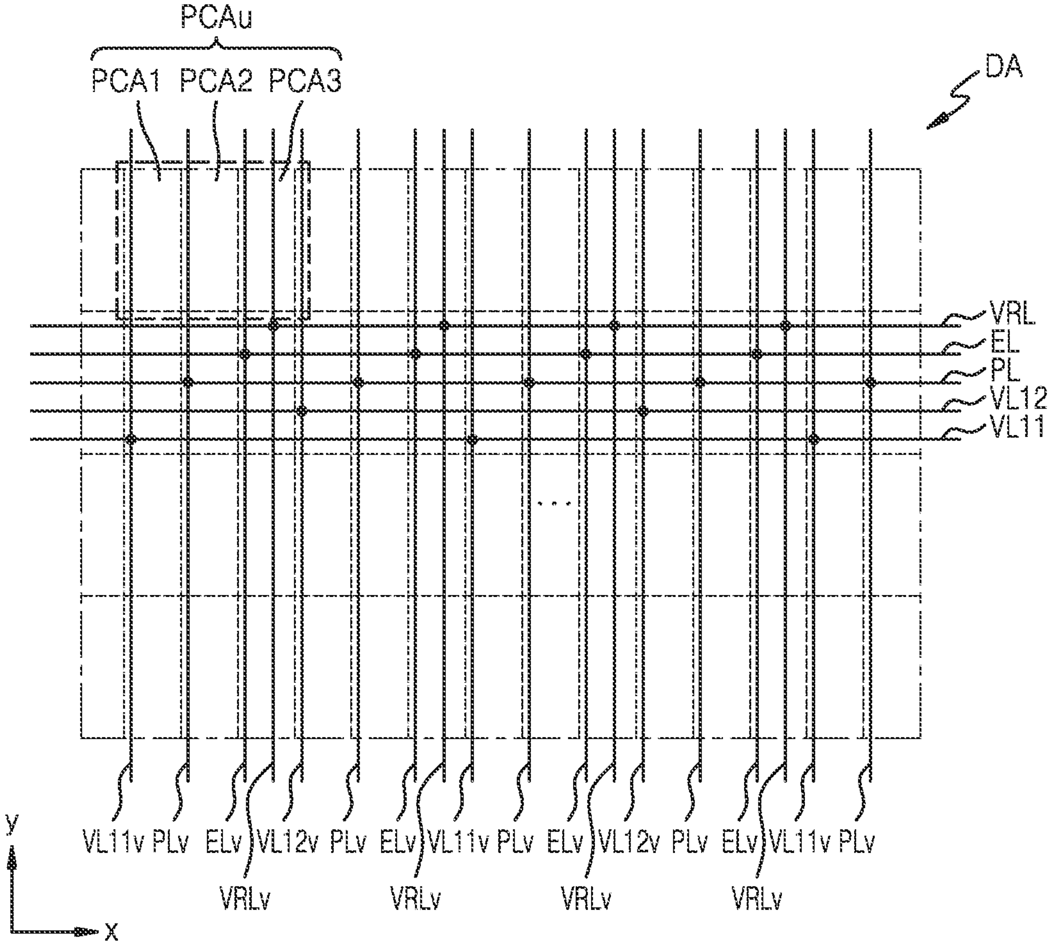

As shown in FIG. 31, four vertical lines, for example, one of the first vertical initialization voltage line VL11*v* and the second vertical initialization voltage line VL12*v*, the first vertical driving voltage line PLv, the second vertical driving voltage line ELv, and the vertical reference voltage line VRLv, may be sequentially and repeatedly arranged in the x-axis direction for each unit circuit area PCAu. The vertical conductive lines may be connected (e.g., electrically connected) to horizontal conductive lines extending in the x-axis direction. The horizontal conductive lines may include the first driving voltage line PL, the second driving voltage line EL, the first-first initialization voltage line VL11, the first-second initialization voltage line VL12, and the reference voltage line VRL.

FIG. 29 shows an example in which the first vertical initialization voltage line VL11*v*, the first vertical driving voltage line PLv, the second vertical driving voltage line ELv, and the vertical reference voltage line VRLv are sequentially arranged in the x-axis direction in the unit circuit area PCAu. FIG. 30 shows an example in which the second vertical initialization voltage line VL12*v*, the first vertical driving voltage line PLv, the second vertical driving voltage line ELv, and the vertical reference voltage line VRLv are sequentially arranged in the x-axis direction in the unit circuit area PCAu.

The first vertical initialization voltage line VL11*v* may overlap the data line DL arranged in the first circuit area PCA1. The first vertical initialization voltage line VL11*v* may be connected (e.g., electrically connected) to the connection electrode 276 arranged in the first circuit area PCA1 through a contact hole 63 penetrating (or passing through) the fifth insulating layer 115. Because the connection electrode 276 is connected (e.g., electrically connected) to the first-first initialization voltage line VL11, the first-first initialization voltage line VL11 may have a mesh structure in the display area DA.

The second vertical initialization voltage line VL12*v* may overlap the data line DL in the first circuit area PCA1. The second vertical initialization voltage line VL12*v* may be connected (e.g., electrically connected) to the connection electrode 278 arranged in the first circuit area PCA1 through a contact hole 66 penetrating (or passing through) the fifth insulating layer 115. Because the connection electrode 278 is connected (e.g., electrically connected) to the first-second initialization voltage line VL12, the first-second initialization voltage line VL12 may have a mesh structure in the display area DA. In the first circuit area PCA1 in which the second vertical initialization voltage line VL12*v* is arranged, the fourth conductive layer ML4 shown in FIG. 28 may further include the connection electrode 278 shown in FIG. 30. The connection electrode 278 may be connected (e.g., electrically connected) to the first-second initialization voltage line VL12 through a contact hole 58 penetrating (or passing through) the second insulating layer 112, the third insulating layer 113, and the fourth insulating layer 114.

The first vertical driving voltage line PLv may overlap the data line DL arranged in the second circuit area PCA2. The first vertical driving voltage line PLv may be connected (e.g., electrically connected) to the connection electrode 274 arranged in the second circuit area PCA2 through a contact hole 64 penetrating (or passing through) the fifth insulating layer 115. Because the connection electrode 274 is connected (e.g., electrically connected) to the first driving voltage line PL, the first driving voltage line PL may have a mesh structure in the display area DA.

The second vertical driving voltage line ELv may overlap the data line DL arranged in the third circuit area PCA3. The second vertical driving voltage line ELv may be connected (e.g., electrically connected) to the connection electrode 277 arranged in the second circuit area PCA2 through the contact hole 66 penetrating (or passing through) the fifth insulating layer 115. Because the connection electrode 277 is connected (e.g., electrically connected) to the second driving voltage line EL, the second driving voltage line EL may have a mesh structure in the display area DA. In an embodiment, the second vertical driving voltage line ELv may be connected (e.g., electrically connected) to the second driving voltage line arranged in the peripheral area PA.

The vertical reference voltage line VRLv may be arranged in the third circuit area PCA3. The vertical reference voltage line VRLv may be connected (e.g., electrically connected) to the connection electrode 272 arranged in the third circuit area PCA3 through a contact hole 65 penetrating (or passing through) the fifth insulating layer 115. Because the connection electrode 272 is connected (e.g., electrically connected) to the reference voltage line VRL, the reference voltage line VRL may have a mesh structure in the display area DA.

For example, voltage supply lines connected to the horizontal conductive lines and/or vertical conductive lines may be further arranged in the peripheral area PA. The voltage supply lines may be arranged on at least one of an upper side, a lower side, a left side, and a right side of the display area DA.

Corresponding connection electrodes of the first circuit area PCA1, the second circuit area PCA2, and the third circuit area PCA3, which have the same function, may have different shapes and positions depending on the positions of lines arranged in a circuit area.

A sixth insulating layer 116 may be disposed on the fifth insulating layer 115 and cover the fifth conductive layer ML5, and the organic light-emitting diode OLED as a display element may be disposed on the sixth insulating layer 116. The organic light-emitting diode OLED may include a pixel electrode 311, an opposite electrode 315, and an intermediate layer between the pixel electrode 311 and the opposite electrode 315.

Figure 32:
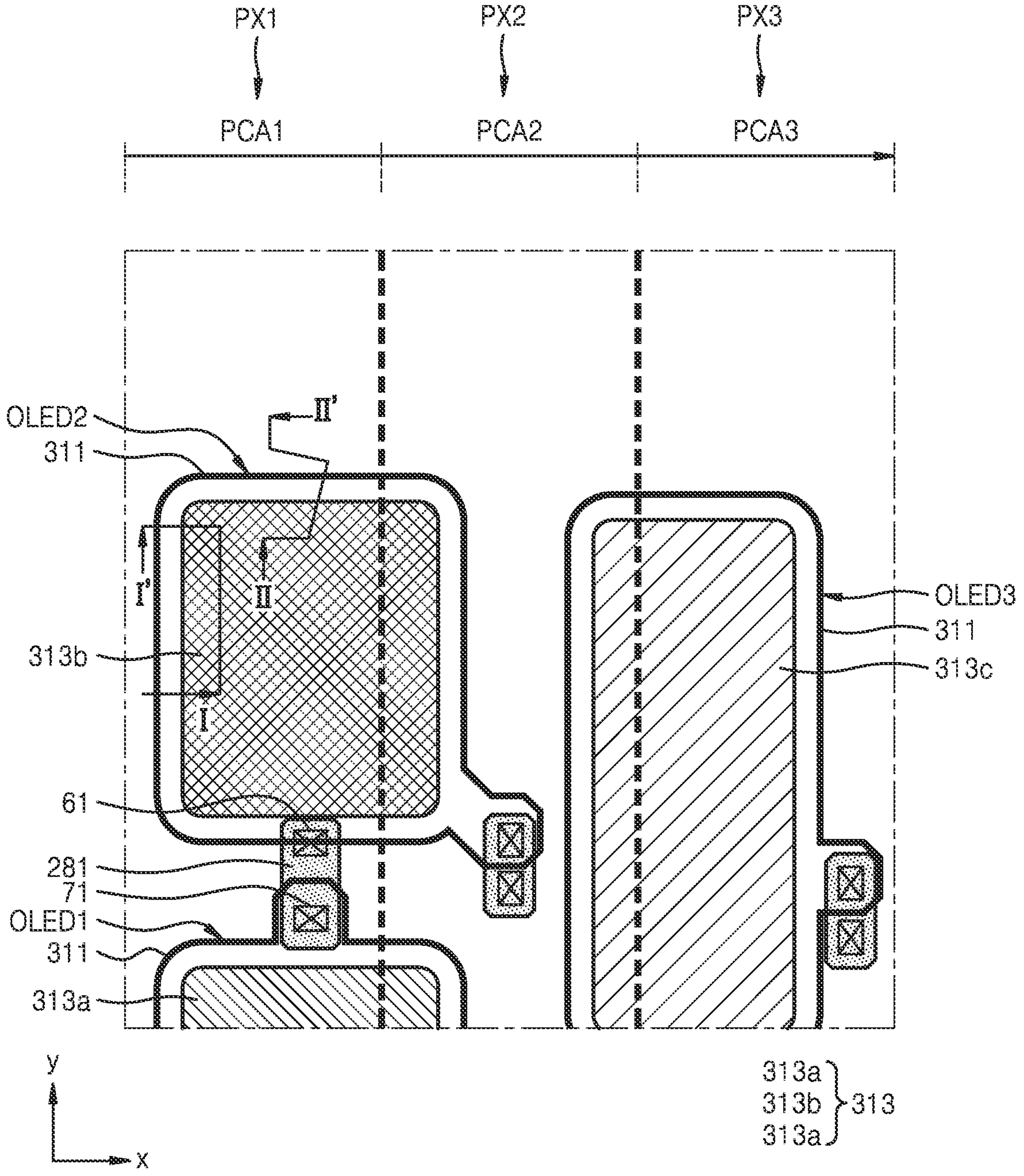

The pixel electrode 311 may be connected to the first transistor T1 by being connected (e.g., electrically connected) to the connection electrode 281, which is a lower conductive pattern, through a contact hole 71 of the sixth insulating layer 116. As shown in FIG. 32, the pixel electrode 311 connected to the pixel circuit of the first pixel PX1 may be connected to the first transistor T1 by being connected (e.g., electrically connected) to the connection electrode 281 arranged in the first circuit area PCA1. The pixel electrode 311 connected to the pixel circuit of the second pixel PX2 may be connected to the first transistor T1 by being connected (e.g., electrically connected) to the connection electrode 281 arranged in the second circuit area PCA2. The pixel electrode 311 connected to the pixel circuit of the third pixel PX3 may be connected to the first transistor T1 by being connected (e.g., electrically connected) to the connection electrode 281 arranged in the third circuit area PCA3.

Figure 33:
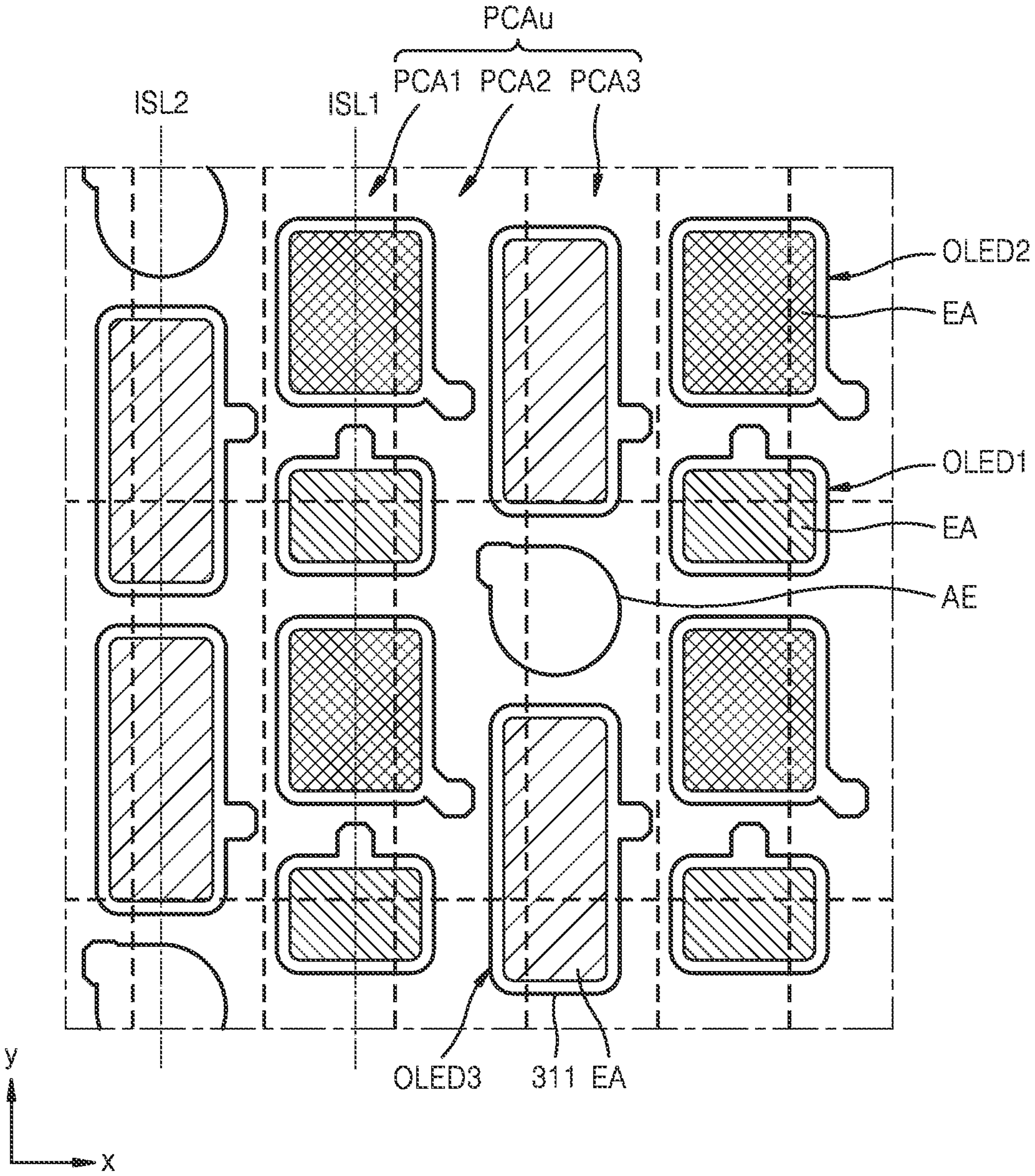
Figure 34:
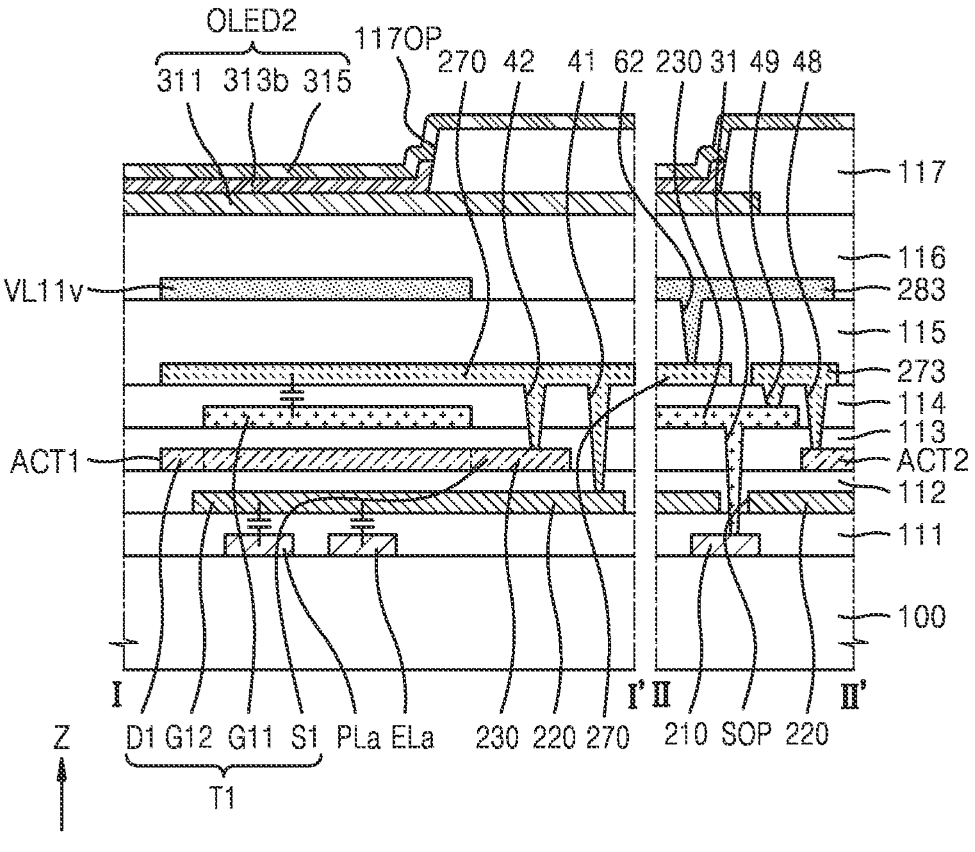
FIG. 34 shows schematic cross-sectional views respectively taken along lines I-I' and II-II' of FIGS. 22 and 32.

As shown in FIG. 33, auxiliary electrode layer AE may be further disposed on the same layer as the pixel electrode 311. The auxiliary electrode layer AE may be arranged between pixel electrodes 311 of the third pixel PX3. The auxiliary electrode layer AE may be in contact with the opposite electrode 315. In an embodiment, the auxiliary electrode layer AE may be connected (e.g., electrically connected) to the second vertical driving voltage line ELv.

As shown in FIG. 34, a seventh insulating layer 117, which is a pixel defining layer covering an edge portion of the pixel electrode 311, may be disposed on the pixel electrode 311. An opening 117OP exposing a portion of the pixel electrode 311 and defining an emission area may be defined in the seventh insulating layer 117. The seventh insulating layer 117 may be a single layer or multi-layer of an organic insulating layer and/or an inorganic insulating layer.

The intermediate layer may include an emission layer 313, a first functional layer on the emission layer 313, and/or a second functional layer below the emission layer 313. The first functional layer may be a hole transport layer (HTL). In another example, the first functional layer may include a hole injection layer (HIL) and an HTL. The second functional layer may include an electron transport layer (ETL) and/or an electron injection layer (EIL). The first functional layer and the second functional layer may be integrally formed to correspond to organic light-emitting diodes OLED included in the display area DA. The first functional layer or the second functional layer may be omitted. FIG. 32 shows an emission layer 313*a* of an organic light-emitting diode OLED1 connected (e.g., electrically connected) to the pixel circuit arranged in the first circuit area PCA1, an emission layer 313*b* of an organic light-emitting diode OLED2 connected (e.g., electrically connected) to the pixel circuit arranged in the second circuit area PCA2, and an emission layer 313*c* of an organic light-emitting diode OLED3 connected (e.g., electrically connected) to the third circuit area PCA3.

FIG. 33 shows the pixel electrode 311 and an emission area EA of each of the first pixel PX1, the second pixel PX2, and the third pixel PX3. The emission area EA may be an area in which the emission layer 313 of the organic light-emitting diode OLED is arranged. The emission area EA may be defined by the opening 117OP of the seventh insulating layer 117. Because the emission layer 313 is disposed on the pixel electrode 311, an arrangement of emission areas shown in FIG. 33 may represent an arrangement of pixel electrodes, or an arrangement of pixels.

The emission area EA may have a polygonal shape such as a rectangular shape or an octagonal shape, a circular shape, an elliptical shape, or the like, and the polygonal shape may include a shape with rounded corners (e.g., vertexes).

The emission area EA of the first pixel PX1 and the emission area EA of the second pixel PX2 may be arranged adjacent to each other in the y-axis direction, and the emission area EA of the third pixel PX3 may be arranged adjacent to the emission area EA of the first pixel PX1 and the emission area EA of the second pixel PX2 in the x-axis direction. Accordingly, the emission area EA of the first pixel PX1 and the emission area EA of the second pixel PX2 may be alternately arranged in the y-axis direction along a virtual straight line ISL1, and the emission area EA of the third pixel PX3 may be repeatedly arranged in the y-axis direction along a virtual straight line ISL2.

The emission area EA of the first pixel PX1, the emission area EA of the second pixel PX2, and the emission area EA of the third pixel PX3 may have the same or different lengths in the x-axis direction and lengths in the y-axis direction. For example, the emission area EA of the first pixel PX1 may have a square shape, and the emission area EA of the second pixel PX2 and the emission area EA of the third pixel PX3 may each have a rectangular shape having long sides in the y-axis direction. A length of the emission area EA of the third pixel PX3 in the y-axis direction may be substantially equal to or greater than a sum of a length of the emission area EA of the first pixel PX1 in the y-axis direction and a length of the emission area EA of the second pixel PX2 in the y-axis direction.

The emission area EA of the first pixel PX1, the emission area EA of the second pixel PX2, and the emission area EA of the third pixel PX3 may have different areas (or sizes). In an embodiment, the emission area EA of the third pixel PX3 may have a greater area than that of the emission area EA of the first pixel PX1. The emission area EA of the third pixel PX3 may have a greater area than that of the emission area EA of the second pixel PX2. The emission area EA of the second pixel PX2 may have a greater area than that of the emission area EA of the first pixel PX1.

The opposite electrode 315 may be integrally formed to correspond to the organic light-emitting diodes OLED included in the display area DA.

Figure 35A:
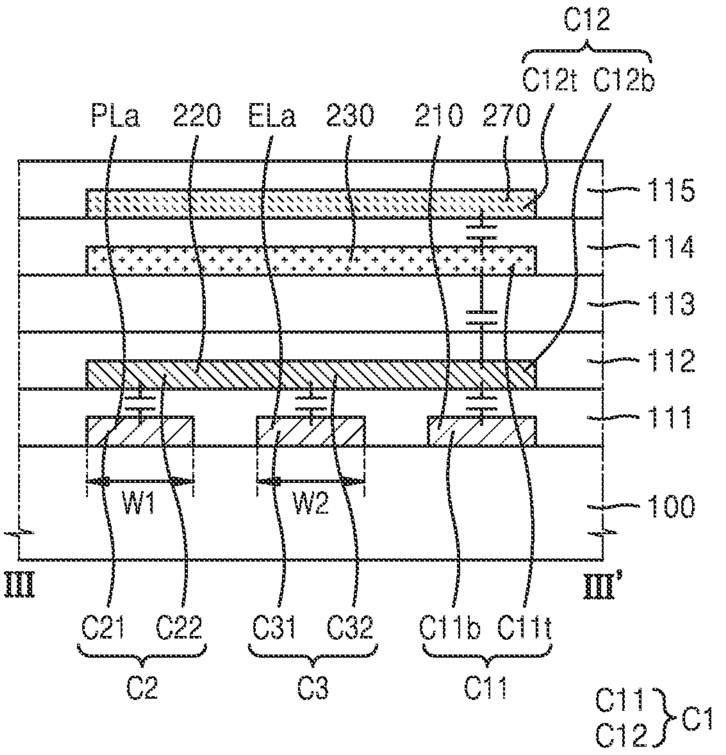
FIG. 35A is a schematic cross-sectional view illustrating capacitors of a first pixel, taken along line III-III' of FIG. 22.
Figure 35B:
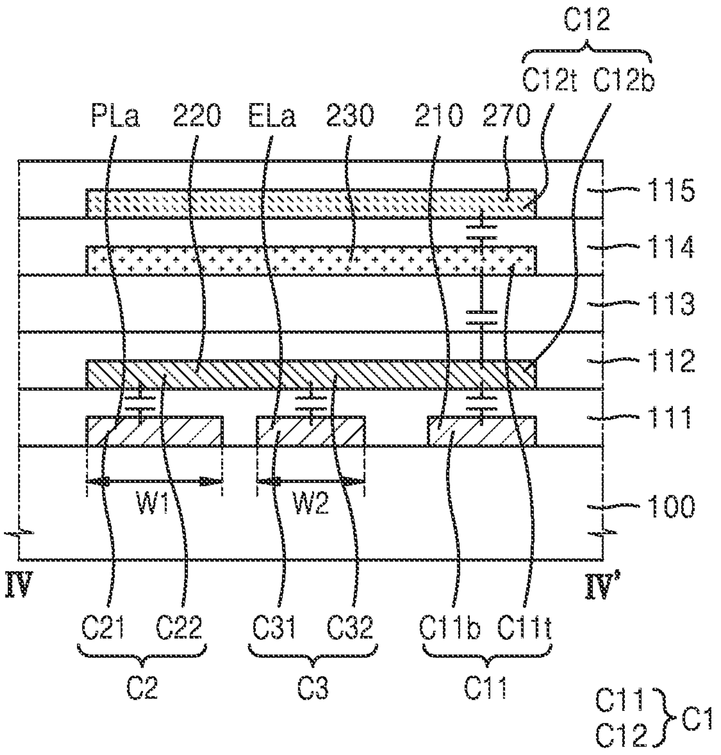
FIG. 35B is a schematic cross-sectional view of capacitors of a second pixel, taken along line IV-IV' of FIG. 22.
Figure 35C:
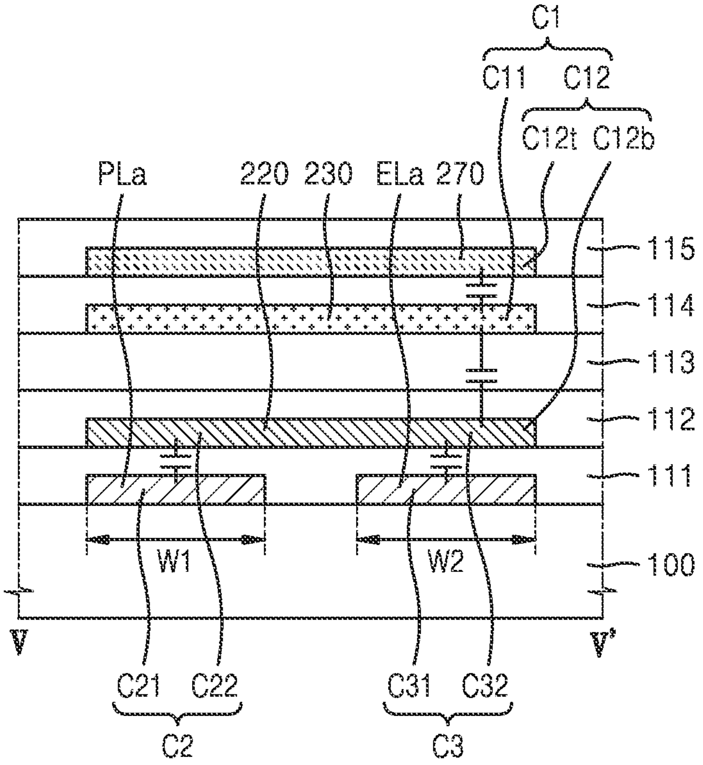
FIG. 35C is a schematic cross-sectional view of capacitors of a third pixel, taken along line V-V' of FIG. 22.

FIG. 35A is a schematic cross-sectional view illustrating capacitors of a first pixel, taken along line III-III' of FIG. 22. FIG. 35B is a schematic cross-sectional view of capacitors of a second pixel, taken along line IV-IV' of FIG. 22. FIG. 35C is a schematic cross-sectional view of capacitors of a third pixel, taken along line V-V' of FIG. 22.

Referring to FIGS. 35A and 35B, the first electrode layer 210, the main line ELa of the second driving voltage line EL, and the main line PLa of the first driving voltage line PL may be disposed on the substrate 100 and be spaced apart from each other in each of the first circuit area PCA1 and the second circuit area PCA2. The second electrode layer 220 may be disposed on the first insulating layer 111 and overlap the first electrode layer 210, the main line ELa of the second driving voltage line EL, and the main line PLa of the first driving voltage line PL. The third electrode layer 230 may be disposed on the third insulating layer 113 and overlap the second electrode layer 220. The connection electrode 270 may be disposed on the fourth insulating layer 114 and overlap the third electrode layer 230.

The first capacitor C1 of the first pixel PX1 and the second pixel PX2 may include a first electrode C11 and a second electrode C12. The first electrode C11 may include a lower first electrode C11*b* formed by the first electrode layer 210 and an upper first electrode C11*t* formed by a portion of the third electrode layer 230. As shown in FIG. 34, the lower first electrode C11*b* and the upper first electrode C11*t* may be connected (e.g., electrically connected) to each other through the contact hole 31. The second electrode C12 may include a lower second electrode C12*b* formed by a portion of the second electrode layer 220 and an upper second electrode C12*t* formed by a portion of the connection electrode 270. As shown in FIG. 34, the lower second electrode C12*b* and the upper second electrode C12*t* may be connected (e.g., electrically connected) to each other through a contact hole 41.

A capacitance of the first capacitor C1 may be a sum of a capacitance of a first sub-capacitor formed by the lower first electrode C11*b* and the lower second electrode C12*b*, a capacitance of a second sub-capacitor formed by the lower second electrode C12*b* and the upper first electrode C11*t*, and a capacitance of a third sub-capacitor formed by the upper first electrode C11*t* and the upper second electrode C12*t*. The capacitance may be increased (or secured/ensured) without increasing the area of the first capacitor C1 in the x-axis direction by vertically overlapping connecting sub-capacitors in parallel.

The second capacitor C2 of the first pixel PX1 and the second pixel PX2 may include a first electrode C21 formed by the main line PLa of the first driving voltage line PL and a second electrode C22 formed by a portion of the second electrode layer 220.

The third capacitor C3 of the first pixel PX1 and the second pixel PX2 may include a first electrode C31 formed by the main line ELa of the second driving voltage line EL and a second electrode C32 formed by a portion of the second electrode layer 220.

A width W1 of the first electrode C21 of the second capacitor C2 of the first pixel PX1 in the y-axis direction may be substantially equal to a width W2 of the first electrode C31 of the third capacitor C3 in the y-axis direction. The width W1 of the first electrode C21 of the second capacitor C2 of the second pixel PX2 in the y-axis direction may be greater than the width W2 of the first electrode C31 of the third capacitor C3 in the y-axis direction.

The first capacitor C1, the second capacitor C2, and the third capacitor C3 shown in FIGS. 35A and 35B may respectively correspond to the first capacitor CAP1, the second capacitor CAP2, and the third capacitor CAP3 shown in FIG. 4.

Referring to FIG. 35C, the main line ELa of the second driving voltage line EL and the main line PLa of the first driving voltage line PL may be disposed on the substrate 100 to be spaced apart from each other in the third circuit area PCA3. The second electrode layer 220 may be disposed on the first insulating layer 111 and overlap the main line ELa of the second driving voltage line EL and the main line PLa of the first driving voltage line PL. The third electrode layer 230 may be disposed on the third insulating layer 113 and overlap the second electrode layer 220. The connection electrode 270 may be disposed on the fourth insulating layer 114 and overlap the third electrode layer 230.

The first capacitor C1 of the third pixel PX3 may include the first electrode C11 and the second electrode C12. The first electrode C11 may be a portion of the third electrode layer 230. The second electrode C12 may include a lower second electrode C12*b* formed by a portion of the second electrode layer 220 and an upper second electrode C12*t* formed by a portion of the connection electrode 270. The lower second electrode C12*b* and the upper second electrode C12*t* may be connected (e.g., electrically connected) to each other through the contact hole 41. A capacitance of the first capacitor C1 may be a sum of a capacitance of a first sub-capacitor formed by the lower second electrode C12*b* and the first electrode C11 and a capacitance of a second sub-capacitor formed by the first electrode C11 and the upper second electrode C12*t*. The capacitance may be increased (or secured/ensured) without increasing the area of the first capacitor C1 in the x-axis direction by vertically overlapping connecting sub-capacitors in parallel.

The second capacitor C2 of the third pixel PX3 may include the first electrode C21 formed by the main line PLa of the first driving voltage line PL and the second electrode C22 formed by a portion of the second electrode layer 220.

The third capacitor C3 of the third pixel PX3 may include the first electrode C31 formed by the main line ELa of the second driving voltage line EL and the second electrode C32 formed by a portion of the second electrode layer 220.

A width W1 of the first electrode C21 of the second capacitor C2 of the third pixel PX3 in the y-axis direction may be greater than the width W1 of the first electrode C21 of the second capacitor C2 of the first pixel PX1 and the second pixel PX2 in the y-axis direction. A width W2 of the first electrode C31 of the third capacitor C3 of the third pixel PX3 in the y-axis direction may be greater than the width W2 of the first electrode C31 of the third capacitor C3 of the first pixel PX1 and the second pixel PX2 in the y-axis direction.

As shown in FIG. 35C, the first capacitor C1, the second capacitor C2, and the third capacitor C3 may respectively correspond to the first capacitor CAP1, the second capacitor CAP2, and the third capacitor CAP3 shown in FIG. 5.

FIGS. 36 to 40B are schematic diagrams of equivalent circuits of a pixel according to an embodiment.

A pixel PX shown in FIGS. 36 to 39 may differ from the pixel PX shown in FIG. 6 in that the second capacitor C2 or the third capacitor C3 is modified, and other configurations and operations are the same.

In an embodiment, the second capacitor C2 and/or the third capacitor C3 of the pixel PX may include sub-capacitors connected in series or may include sub-capacitors connected in parallel.

Figure 36:
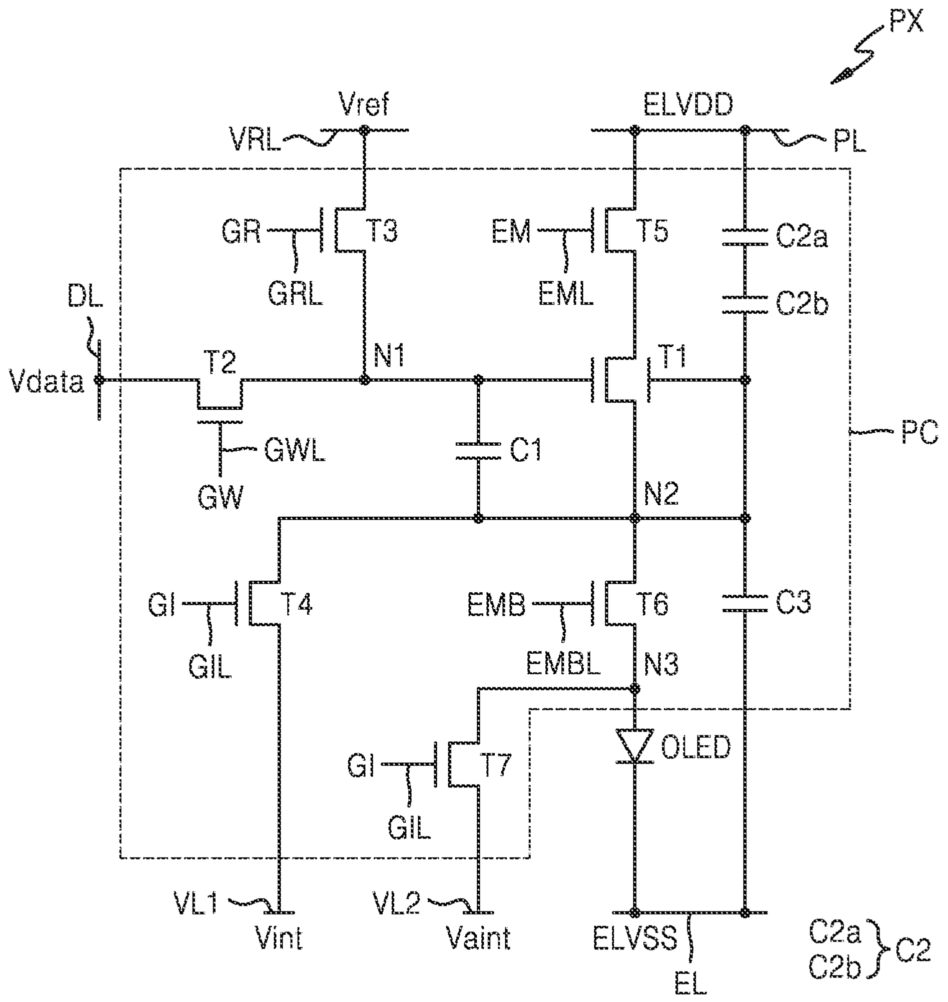
FIGS. 36, 37, 38, 39, 40A, and 40B are schematic diagrams of equivalent circuits of a pixel according to an embodiment.
Figure 37:
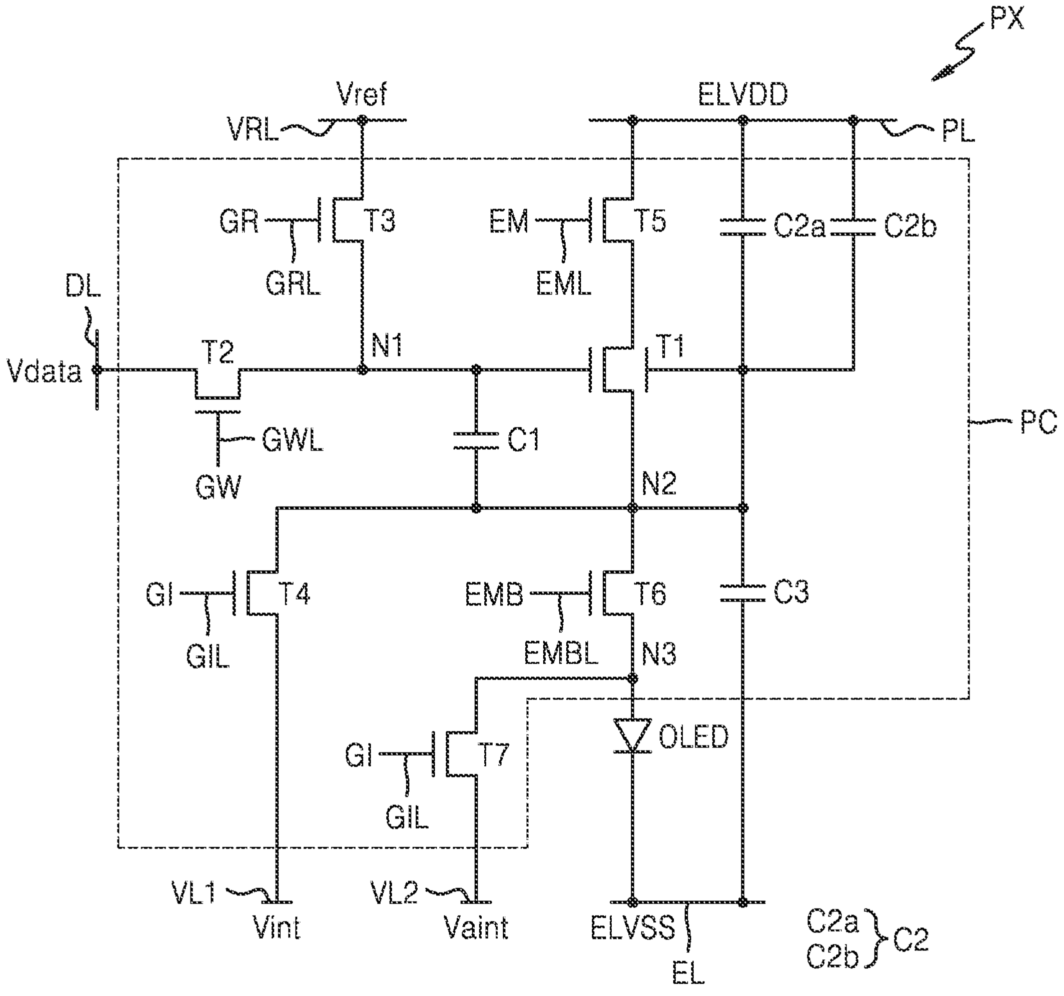

As shown in FIG. 36, the second capacitor C2 may include sub-capacitors connected in series. For example, the second capacitor C2 may include a first sub-capacitor C2*a* and a second sub-capacitor C2*b*, which are connected in series. In another example, as shown in FIG. 37, the second capacitor C2 may include sub-capacitors connected in parallel. For example, the second capacitor C2 may include the first sub-capacitor C2*a* and the second sub-capacitor C2*b*, which are connected in parallel. In another example, the second capacitor C2 may include sub-capacitors connected in series and sub-capacitors connected in parallel.

Figure 38:
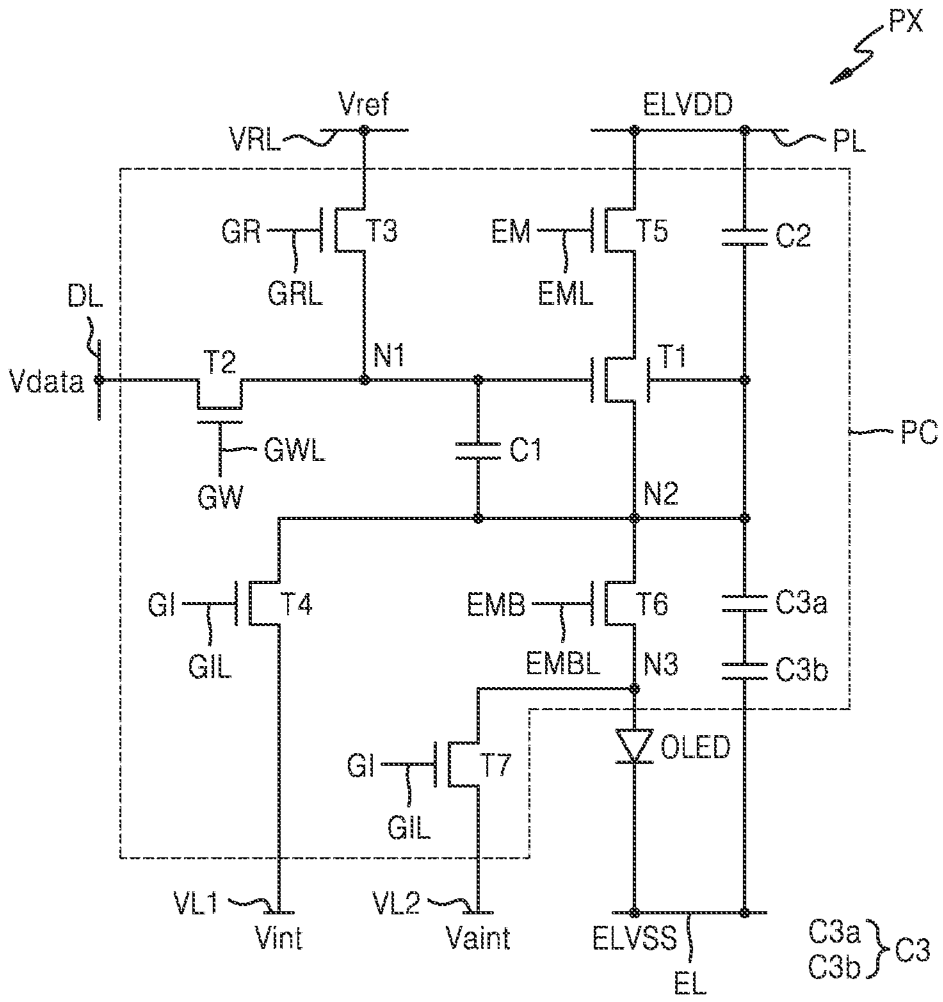
Figure 39:
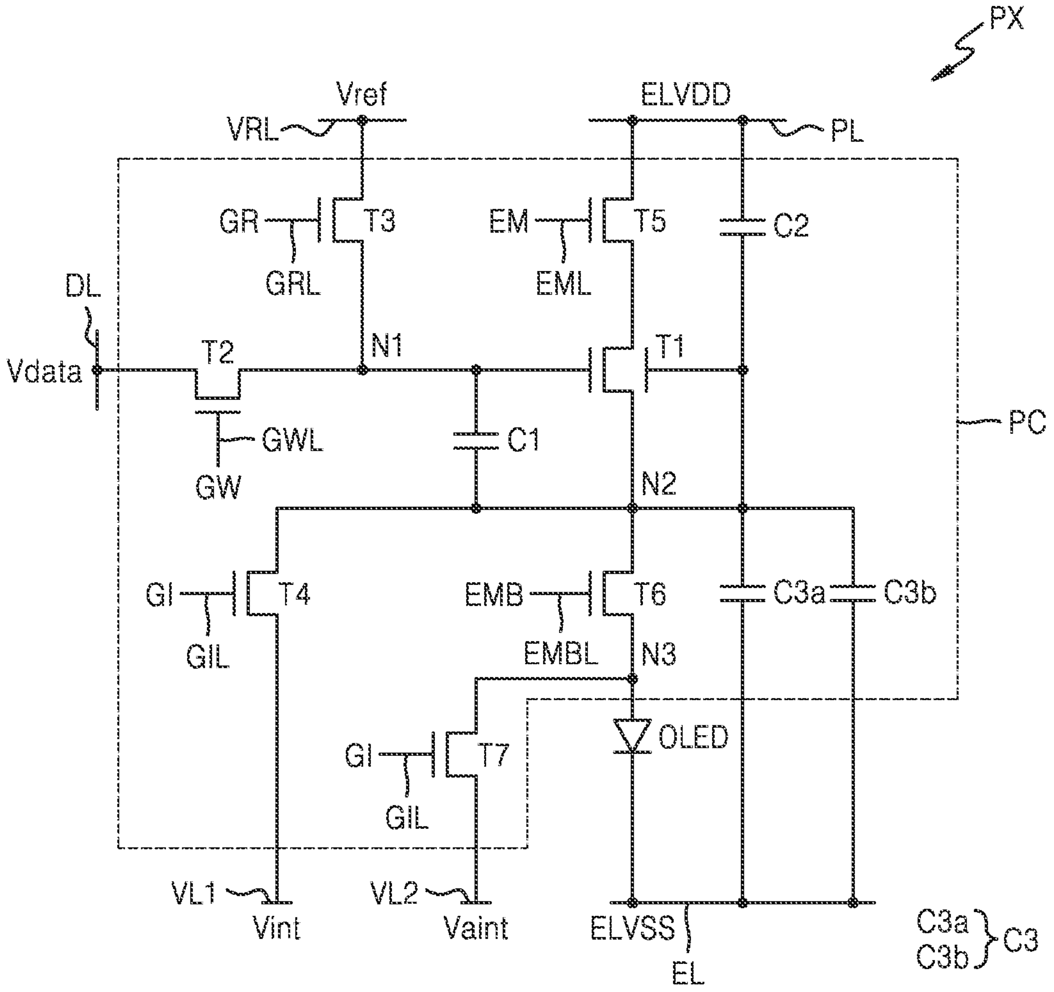

As shown in FIG. 38, the third capacitor C3 may include sub-capacitors connected in series. For example, the third capacitor C3 may include a first sub-capacitor C3*a* and a second sub-capacitor C3*b*, which are connected in series. As shown in FIG. 39, the third capacitor C3 may include sub-capacitors connected in parallel. For example, the third capacitor C3 may include a first sub-capacitor C3*a* and a second sub-capacitor C3*b*, which are connected in parallel. In another example, the third capacitor C3 may include sub-capacitors connected in series and sub-capacitors connected in parallel.

Although not illustrated in the drawings, the second capacitor C2 and/or the third capacitor C3 shown in FIGS. 15, 18, and 19 may include sub-capacitors connected in series and/or sub-capacitors connected in parallel.

Figure 40A:
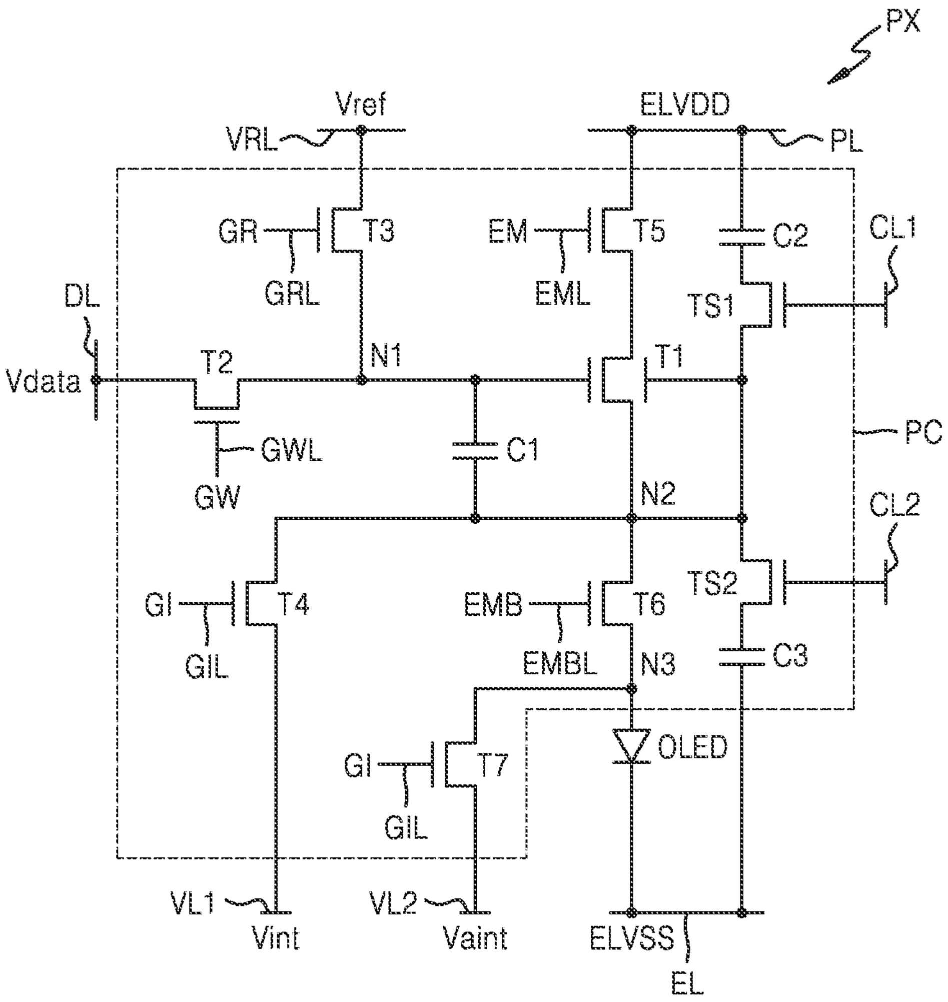
Figure 40B:
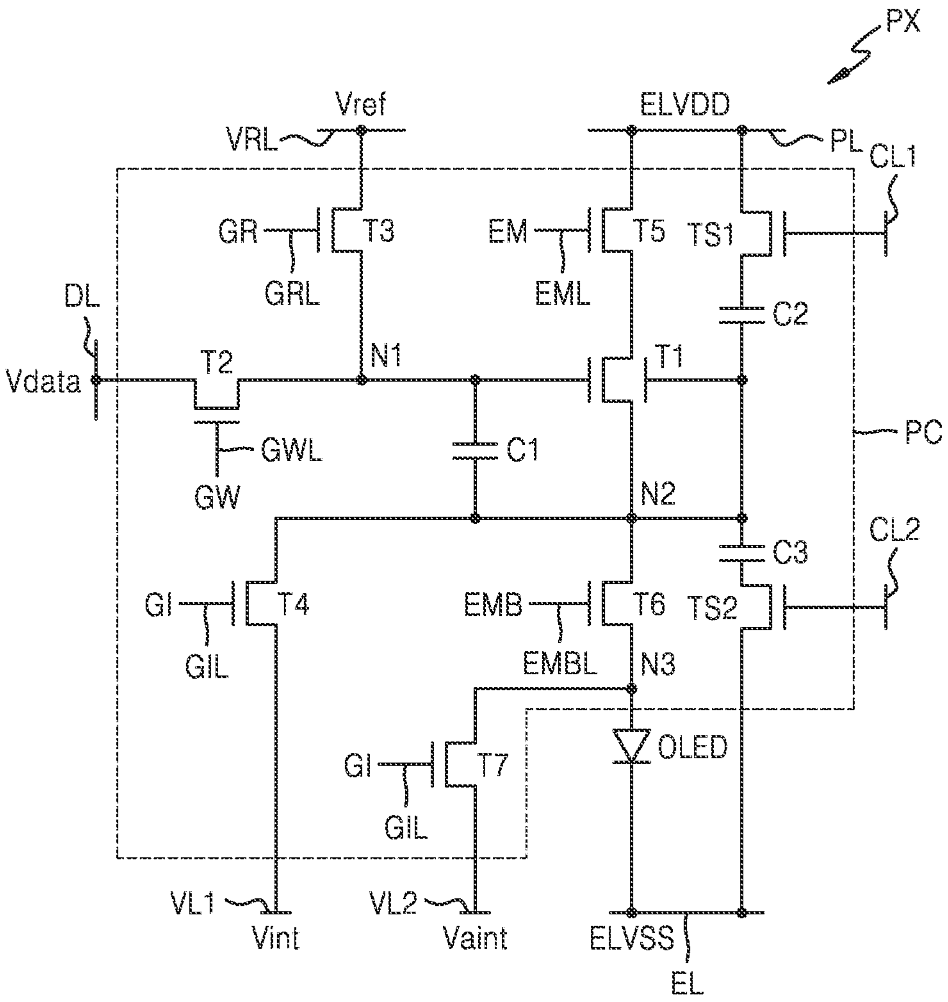

A pixel PX shown in FIGS. 40A and 40B differ from the pixel PX shown in FIG. 6 in that a control transistor may be connected to the second capacitor C2 and/or the third capacitor C3, and other configurations and operations are the same.

In an embodiment, the pixel PX may further include a first control transistor TS1 controlling an electrical connection of the second capacitor C2 between the first capacitor C1 and the first driving voltage line PL and/or a second control transistor TS2 controlling an electrical connection of the third capacitor C3 between the first capacitor C1 and the second driving voltage line EL.

For example, as shown in FIG. 40A, the first control transistor TS1 may be connected between the second capacitor C2 and the second node N2, and the second control transistor TS2 may be connected between the second node N2 and the third capacitor C3. Turning on and off of the first control transistor TS1 and the second control transistor TS2 may be independently controlled according to a gate control signal supplied to the gates thereof. The turning on and off of the first control transistor TS1 may be controlled according to a control signal supplied from a first control line CL1 connected to the gate of the first control transistor TS1. The turning on and off of the second control transistor TS2 may be controlled according to a control signal supplied from a second control line CL2 connected to the gate of the second control transistor TS2.

A timing of supplying a gate-on voltage of the control signal supplied to the first control transistor TS1 may be same as or different from a timing of supplying a gate-on voltage of the control signal supplied to the second control transistor TS2. Through the first control transistor TS1 and the second control transistor TS2, the second capacitor C2 and the third capacitor C3 may function as variable transistors of which on/off is controlled.

In an embodiment, at least one of the first control transistor TS1 and the second control transistor TS2 may be turned on for at least the third period P3 by turning on and off of the first control transistor TS1 and the second control transistor TS2, and may be turned off at other periods. In another example, at least one of the first control transistor TS1 and the second control transistor TS2 may be turned on for at least the second period P2 and the third period P3 by turning on and off the first control transistor TS1 and the second control transistor TS2, and may be turned off at other periods.

In another example as shown in FIG. 40B, the first control transistor TS1 may be connected between the first driving voltage line PL and the second capacitor C2, and the second control transistor TS2 may also be connected between the third capacitor C3 and the second driving voltage line EL.

Although not illustrated in the drawings, the first control transistor TS1 and/or the second control transistor TS2 may be connected to the second capacitor C2 and/or the third capacitor C3 of the pixel PX shown in FIGS. 15, 18, and 19.

FIGS. 41A to 42B are schematic cross-sectional views each illustrating a structure of a display element according to an embodiment.

The organic light-emitting diode OLED as a display element according to an embodiment may include the pixel electrode 311, the opposite electrode 315, and an intermediate layer 313*m* between the pixel electrode 311 (e.g., first electrode or anode) and the opposite electrode 315 (e.g., second electrode or cathode).

The pixel electrode 311 may include a transparent conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 311 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 311 may have a three-layered structure of ITO/Ag/ITO.

The opposite electrode 315 may be disposed on the intermediate layer 313*m*. The opposite electrode 315 may include a metal having a low work function, an alloy, an electrically conductive compound, or any combination thereof. For example, the opposite electrode 315 may include lithium (Li), Ag, Mg, Al, Al—Li, calcium (Ca), Mg-indium (In), Mg—Ag, ytterbium (Yb), Ag—Yb, ITO, IZO, or any combination thereof. The opposite electrode 315 may be a transparent electrode, a semi-transparent electrode, or a reflective electrode.

The intermediate layer 313*m* may include a polymer organic material or a low-molecular-weight organic material, which emits light of a certain color. The intermediate layer 313*m* may further include a metal-containing compound such as an organometallic compound, an inorganic material such as quantum dots, or the like, in addition to various organic materials.

In an embodiment, the intermediate layer 313*m* may include one emission layer, a first functional layer, and a second functional layer, wherein the first functional layer and the second functional layer may be respectively positioned below and on the emission layer. The first functional layer may include, for example, an HTL or may include an HTL and an HIL. The second functional layer may include an ETL and/or an EIL. The first functional layer or the second functional layer may be omitted. The first functional layer and the second functional layer may be integrally formed to correspond to organic light-emitting diodes OLED included in the display area DA.

In an embodiment, the intermediate layer 313*m* may include two or more emitting units sequentially stacked between the pixel electrode 311 and the opposite electrode 315, and a charge generation layer CGL arranged between two emitting units. In case that the intermediate layer 313*m* includes the emitting units and the charge generation layer CGL, the organic light-emitting diode OLED may be a tandem light-emitting element. The organic light-emitting diode OLED may have improved color purity and emission efficiency by having a stacked structure of emitting units.

One emitting unit may include an emission layer, and a first functional layer and a second functional layer respectively below and on the emission layer. The charge generation layer CGL may include a negative charge generation layer and a positive charge generation layer. The emission efficiency of the organic light-emitting diode OLED, which is a tandem light-emitting element having emission layers, may be further increased by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 41A:
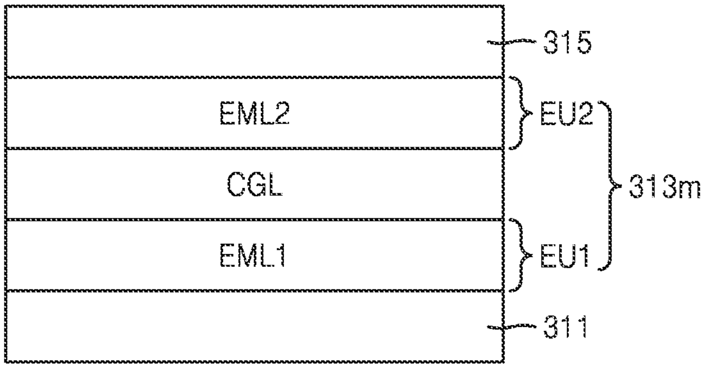
FIGS. 41A, 41B, 41C, 41D, 42A, and 42B are cross-sectional views each illustrating a structure of a display element according to an embodiment.

In an embodiment, as shown in FIG. 41A, the organic light-emitting diode OLED may include a first emitting unit EU1 including a first emission layer EML1 and a second emitting unit EU2 including a second emission layer EML2, which are sequentially stacked. The charge generation layer CGL may be provided between the first emitting unit EU1 and the second emitting unit EU2. For example, the organic light-emitting diode OLED may include the pixel electrode 311, the first emission layer EML1, the charge generation layer CGL, the second emission layer EML2, and the opposite electrode 315, which are sequentially stacked. The first functional layer and the second functional layer may be respectively included below and on the first emission layer EML1. The first functional layer and the second functional layer may be respectively included below and on the second emission layer EML2. The first emission layer EML1 may be a blue emission layer, and the second emission layer EML2 may be a yellow emission layer.

Figure 41B:
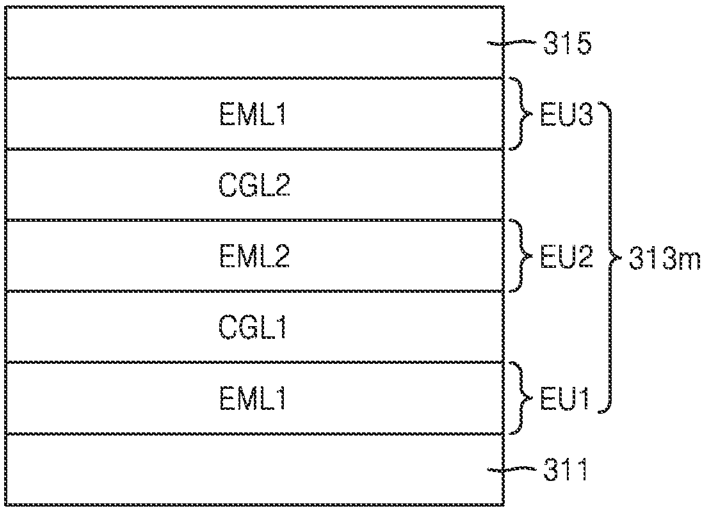

In an embodiment, as shown in FIG. 41B, the organic light-emitting diode OLED may include the first emitting unit EU1 and a third emitting unit EU3 each including the first emission layer EML1 and the second emitting unit EU2 including the second emission layer EML2. A first charge generation layer CGL1 may be provided between the first emitting unit EU1 and the second emitting unit EU2, and a second charge generation layer CGL2 may be provided between the second emitting unit EU2 and the third emitting unit EU3. For example, the organic light-emitting diode OLED may include the pixel electrode 311, the first emission layer EML1, the first charge generation layer CGL1, the second emission layer EML2, the second charge generation layer CGL2, the first emission layer EML1, and the opposite electrode 315, which are sequentially stacked. The first functional layer and the second functional layer may be respectively included below and on the first emission layer EML1. The first functional layer and the second functional layer may be respectively included below and on the second emission layer EML2. The first emission layer EML1 may be a blue emission layer, and the second emission layer EML2 may be a yellow emission layer.

In an embodiment, in the organic light-emitting diode OLED, the second emitting unit EU2 may further include a third emission layer EML3 and/or a fourth emission layer EML4, which are in contact with (e.g., in direct contact with) and positioned below and/or on the second emission layer EML2, in addition to the second emission layer EML2. For example, a direct contact means that other layers are not arranged between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 41C:
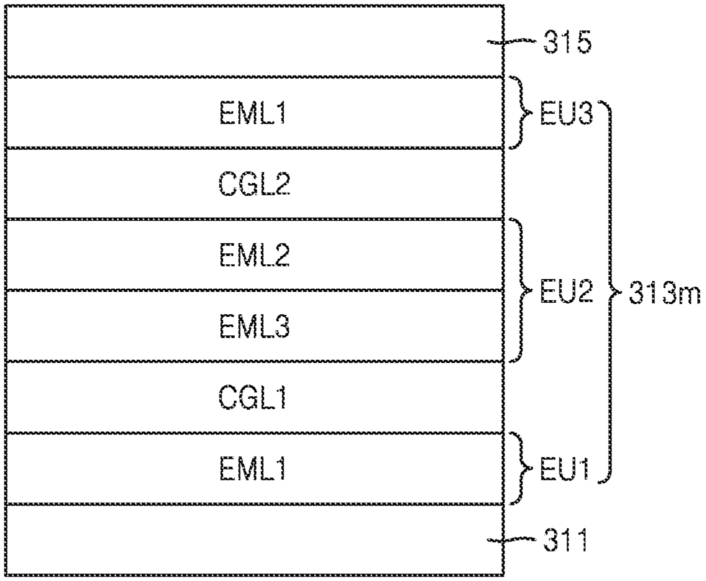

For example, as shown in FIG. 41C, the organic light-emitting diode OLED may include the pixel electrode 311, the first emission layer EML1, the first charge generation layer CGL1, the third emission layer EML3, the second emission layer EML2, the second charge generation layer CGL2, the first emission layer EML1, and the opposite electrode 315, which are sequentially stacked. In another example, as shown in FIG. 41D, the organic light-emitting diode OLED may include the pixel electrode 311, the first emission layer EML1, the first charge generation layer CGL1, the third emission layer EML3, the second emission layer EML2, the fourth emission layer EML4, the second charge generation layer CGL2, the first emission layer EML1, and the opposite electrode 315, which are sequentially stacked.

Figure 41D:
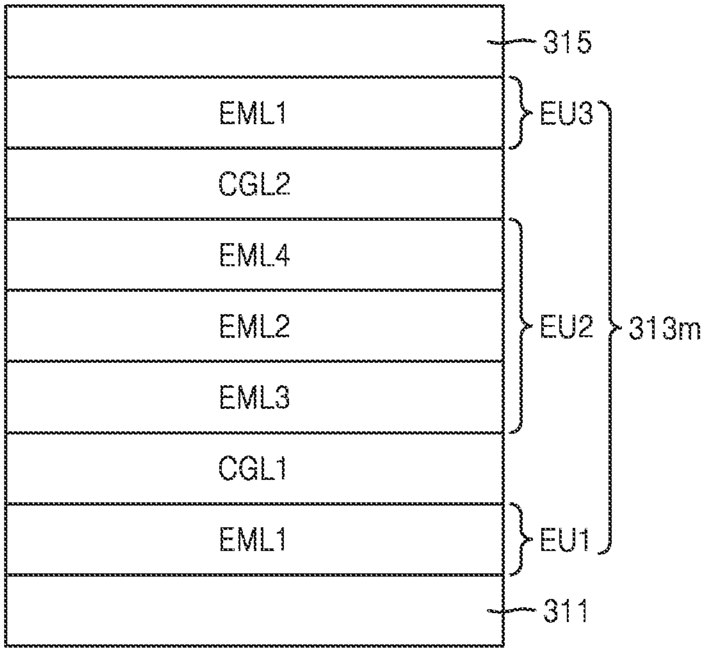
Figure 42A:
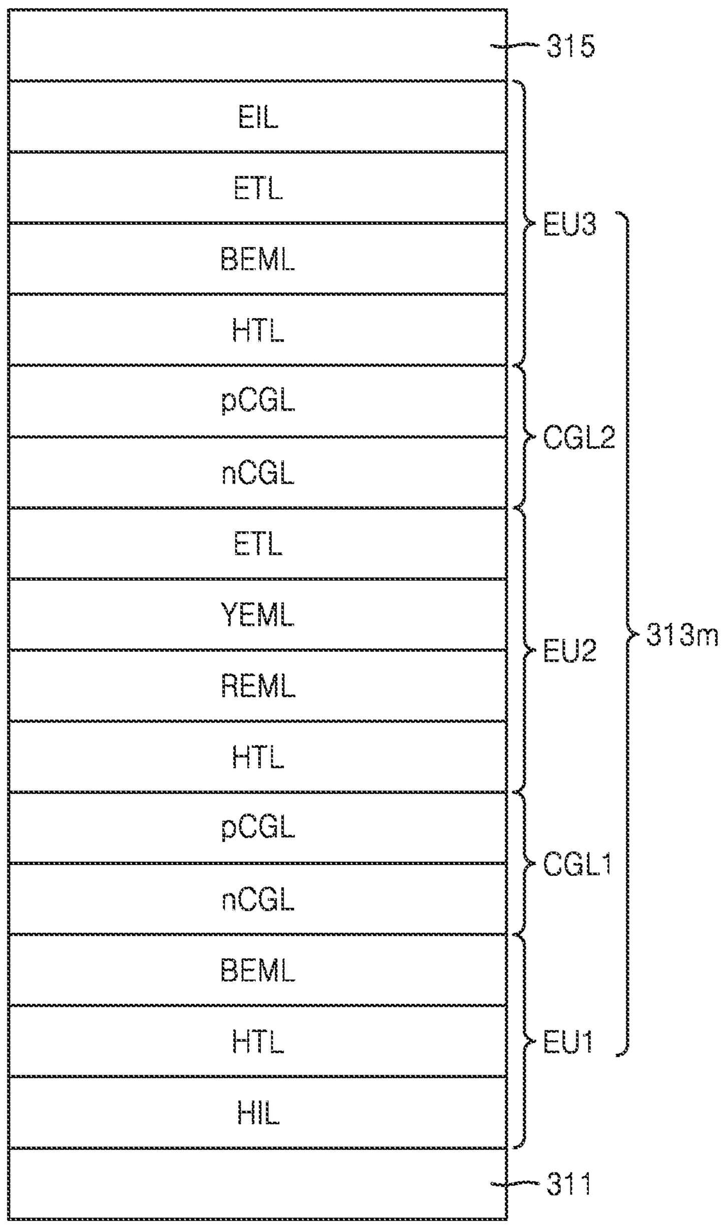
Figure 42B:
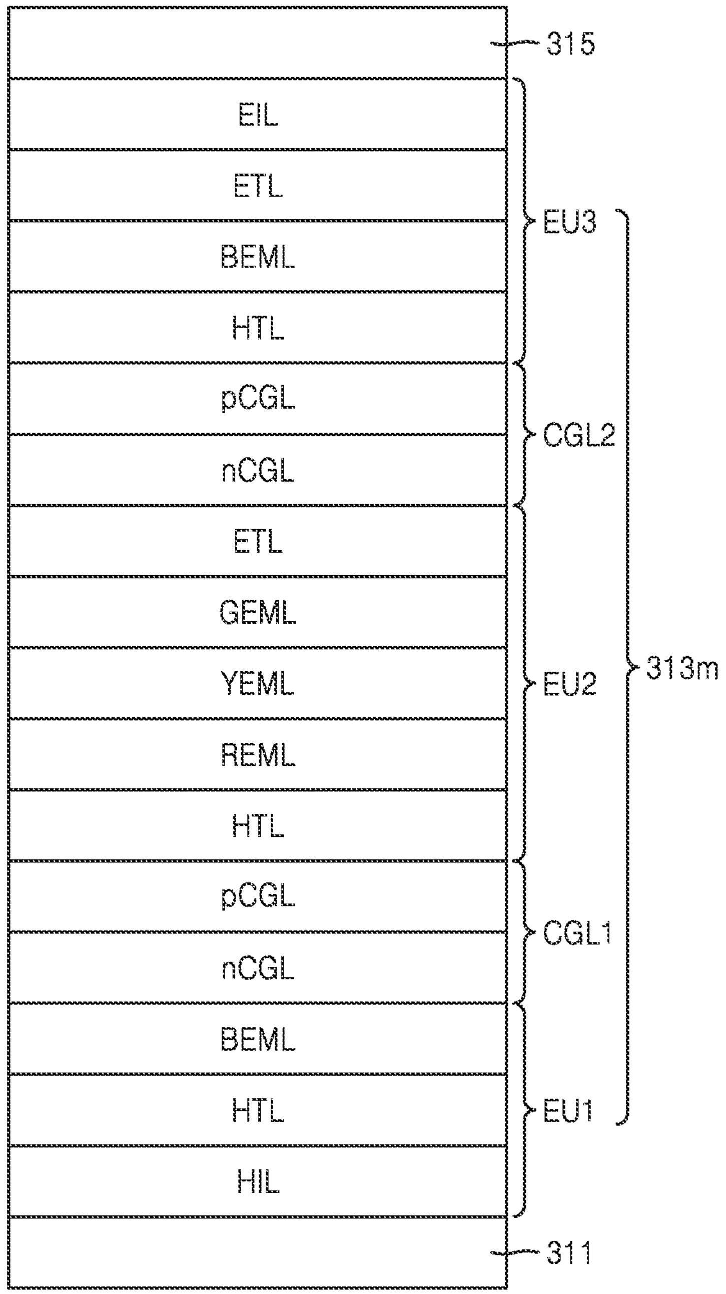

FIG. 42A is a schematic cross-sectional view of an example of the organic light-emitting diode of FIG. 41C, and FIG. 42B is a schematic cross-sectional view of an example of the organic light-emitting diode of FIG. 41D.

Referring to FIG. 42A, the organic light-emitting diode OLED may include the first emitting unit EU1, the second emitting unit EU2, and the third emitting unit EU3, which are sequentially stacked. The first charge generation layer CGL1 may be provided between the first emitting unit EU1 and the second emitting unit EU2, and the second charge generation layer CGL2 may be provided between the second emitting unit EU2 and the third emitting unit EU3. The first charge generation layer CGL1 and the second charge generation layer CGL2 may each include a negative charge generation layer nCGL and a positive charge generation layer pCGL.

The first emitting unit EU1 may include a blue emission layer BEML. The first emitting unit EU1 may further include a hole injection layer HIL and a hole transport layer HTL between the pixel electrode 311 and the blue emission layer BEML. In an embodiment, a p-dopant layer may be further included between the hole injection layer HIL and the hole transport layer HTL. The p-dopant layer may be formed by doping the hole injection layer HIL with a p-type doping material. In an embodiment, at least one of a blue light auxiliary layer, an electron blocking layer, and a buffer layer may be further included between the blue emission layer BEML and the hole transport layer HTL. The blue light auxiliary layer may increase the emission efficiency of the blue emission layer BEML. The blue light auxiliary layer may increase the emission efficiency of the blue emission layer BEML by adjusting a hole charge balance. The electron blocking layer may prevent injection of electrons into the hole transport layer HTL. The buffer layer may compensate for a resonance distance according to a wavelength of light emitted from an emission layer.

The second emitting unit EU2 may include a yellow emission layer YEML and a red emission layer REML which is in contact with (e.g., in direct contact with) the yellow emission layer YEML and positioned below the yellow emission layer YEML. The second emitting unit EU2 may further include the hole transport layer HTL between the positive charge generation layer pCGL of the first charge generation layer CGL1 and the red emission layer REML, and may further include an electron transport layer ETL between the yellow emission layer YEML and the negative charge generation layer nCGL of the second charge generation layer CGL2.

The third emitting unit EU3 may include the blue emission layer BEML. The third emitting unit EU3 may further include the hole transport layer HTL between the positive charge generation layer pCGL of the second charge generation layer CGL2 and the blue emission layer BEML. The third emitting unit EU3 may further include the electron transport layer ETL and an electron injection layer EIL between the blue emission layer BEML and the opposite electrode 315. The electron transport layer ETL may be a single layer or a multi-layer. In an embodiment, at least one of a blue light auxiliary layer, an electron blocking layer, and a buffer layer may be further included between the blue emission layer BEML and the hole transport layer HTL. At least one of a hole blocking layer and a buffer layer may be further included between the blue emission layer BEML and the electron transport layer ETL. The hole blocking layer may prevent injection of holes into the electron transport layer ETL.

The organic light-emitting diode OLED shown in FIG. 42B may differ from the organic light-emitting diode OLED shown in FIG. 42A in a stacked structure of the second emitting unit EU2, and other configurations are the same. Referring to FIG. 42B, the second emitting unit EU2 may include the yellow emission layer YEML, the red emission layer REML which is in contact with (e.g., in direct contact with) the yellow emission layer YEML and positioned below the yellow emission layer YEML, and a green emission layer GEML which is in contact with (e.g., in direct contact with) the yellow emission layer YEML and positioned on the yellow emission layer YEML. The second emitting unit EU2 may further include the hole transport layer HTL between the positive charge generation layer pCGL of the first charge generation layer CGL1 and the red emission layer REML, and may further include the electron transport layer ETL between the green emission layer GEML and the negative charge generation layer nCGL of the second charge generation layer CGL2.

Figure 43:
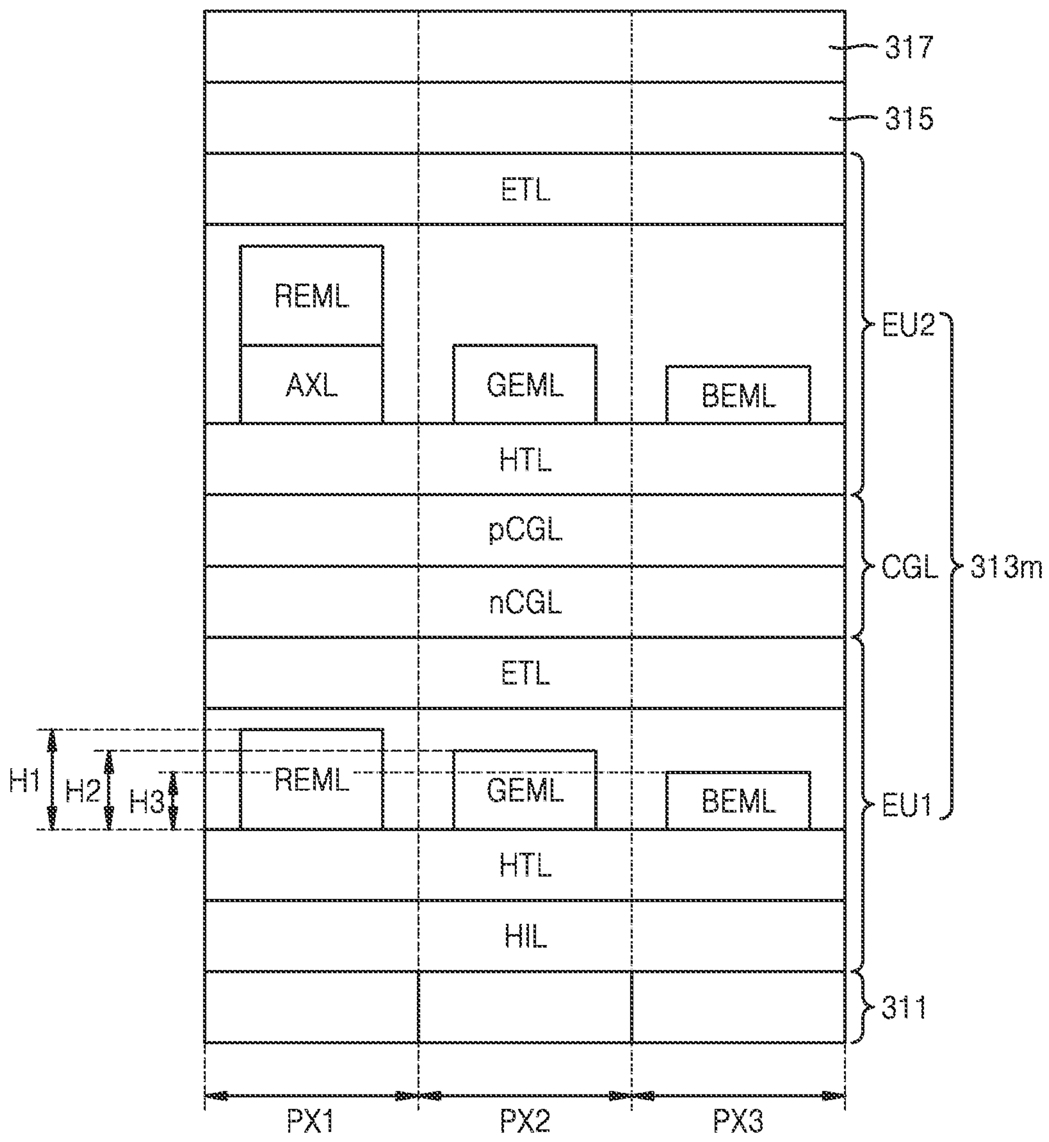
FIG. 43 is a schematic cross-sectional view illustrating a structure of a pixel of a display apparatus according to an embodiment.

FIG. 43 is a schematic cross-sectional view illustrating a structure of a pixel of a display apparatus according to an embodiment.

Referring to FIG. 43, the display apparatus may include pixels. The pixels may include the first pixel PX1, the second pixel PX2, and the third pixel PX3. The first pixel PX1, the second pixel PX2, and the third pixel PX3 may each include the pixel electrode 311, the opposite electrode 315, and the intermediate layer 313*m*. In an embodiment, the first pixel PX1 may be a red pixel, the second pixel PX2 may be a green pixel, and the third pixel PX3 may be a blue pixel. For example, the pixel may include the organic light-emitting diode OLED as a display element, and the organic light-emitting diode OLED of each pixel may be connected (e.g., electrically connected) to a pixel circuit.

The pixel electrode 311 may be independently provided in each of the first pixel PX1, the second pixel PX2, and the third pixel PX3.

The intermediate layer 313*m* of the organic light-emitting diode OLED of each of the first pixel PX1, the second pixel PX2, and the third pixel PX3 may include the first emitting unit EU1 and the second emitting unit EU2, which are sequentially stacked, and the charge generation layer CGL between the first emitting unit EU1 and the second emitting unit EU2. The charge generation layer CGL may include the negative charge generation layer nCGL and the positive charge generation layer pCGL. The charge generation layer CGL may be a common layer continuously formed in the first pixel PX1, the second pixel PX2, and the third pixel PX3.

The first emitting unit EU1 of the first pixel PX1 may include the hole injection layer HIL, the hole transport layer HTL, the red emission layer REML, and the electron transport layer ETL, which are sequentially stacked on the pixel electrode 311. The first emitting unit EU of the second pixel PX2 may include the hole injection layer HIL, the hole transport layer HTL, the green emission layer GEML, and the electron transport layer ETL, which are sequentially stacked on the pixel electrode 311. The first emitting unit EU1 of the third pixel PX3 may include the hole injection layer HIL, the hole transport layer HTL, the blue emission layer BEML, and the electron transport layer ETL, which are sequentially stacked on the pixel electrode 311. Each of the hole injection layer HIL, the hole transport layer HTL, and the electron transport layer ETL of the first emitting units EU1 may be a common layer continuously formed in the first pixel PX1, the second pixel PX2, and the third pixel PX3.

The second emitting unit EU2 of the first pixel PX1 may include the hole transport layer HTL, an auxiliary layer AXL, the red emission layer REML, and the electron transport layer ETL, which are sequentially stacked on the charge generation layer CGL. The second emitting unit EU2 of the second pixel PX2 may include the hole transport layer HTL, the green emission layer GEML, and the electron transport layer ETL, which are sequentially stacked on the charge generation layer CGL. The second emitting unit EU2 of the third pixel PX3 may include the hole transport layer HTL, the blue emission layer BEML, and the electron transport layer ETL, which are sequentially stacked on the charge generation layer CGL. Each of the hole transport layer HTL and the electron transport layer ETL of the second emitting units EU2 may be a common layer continuously formed in the first pixel PX1, the second pixel PX2, and the third pixel PX3. In an embodiment, in the second emitting unit EU2 of the first pixel PX1, the second pixel PX2, and the third pixel PX3, at least one of a hole blocking layer and a buffer layer may be further included in an emission layer and the electron transport layer ETL.

A thickness H1 of the red emission layer REML, a thickness H2 of the green emission layer GEML, and a thickness H3 of the blue emission layer BEML may be determined according to a resonance distance. The auxiliary layer AXL may be an additional layer for adjusting the resonance distance, and may include a resonance auxiliary material. For example, the auxiliary layer AXL may include the same material as the hole transport layer HTL.

Although FIG. 43 shows that the auxiliary layer AXL is only provided in the first pixel PX1, embodiments are not limited thereto. For example, the auxiliary layer AXL may be provided in at least one of the first pixel PX1, the second pixel PX2, and the third pixel PX3 to adjust a resonance distance of each of the first pixel PX1, the second pixel PX2, and the third pixel PX3.

The display apparatus may further include a capping layer 317 arranged outside the opposite electrode 315. The capping layer 317 may improve emission efficiency by a principle of constructive interference. Accordingly, the light extraction efficiency of the organic light-emitting diode OLED may be increased to improve the emission efficiency of the organic light-emitting diode OLED.

According to an embodiment, a display apparatus with improved display quality may be provided. The scope of the disclosure is limited by these effects.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:
- a first electrode and a second electrode on a same layer, the first electrode and the second electrode being spaced apart from each other;
- a third electrode on the first electrode, the third electrode overlapping the first electrode and the second electrode;
- a fourth electrode on the third electrode and overlapping the third electrode; and
- a fifth electrode on the fourth electrode and overlapping the fourth electrode, the fifth electrode being electrically connected to the third electrode for receiving a same voltage.

2. The display apparatus of claim 1, wherein
- the first electrode is connected to a first driving voltage line configured to provide a voltage of a first level; and
- the second electrode is connected to a second driving voltage line configured to provide a voltage of a second level lower than the first level.

3. The display apparatus of claim 2, further comprising:
- a thin-film transistor including a semiconductor layer and a gate electrode, the third electrode being connected to the semiconductor layer.

4. The display apparatus of claim 3, wherein the semiconductor layer on a layer between the third electrode and the fourth electrode.

5. The display apparatus of claim 1, wherein an area of the first electrode overlapping the third electrode is different from an area of the second electrode overlapping the third electrode.

6. The display apparatus of claim 3, further comprising:
- a sixth electrode spaced apart from the first electrode, the sixth electrode being electrically connected to the fourth electrode, the sixth electrode and the first electrode being on a same layer, and the third electrode overlapping the sixth electrode.

7. The display apparatus of claim 6, wherein the sixth electrode is connected to the gate electrode.

8. A display apparatus comprising:
- a substrate including,
  - a first circuit area including a pixel circuit of a first pixel, and
  - a second circuit area including a pixel circuit of a second pixel;
- a first electrode, a second electrode and a third electrode on a same layer in the first circuit area, the first electrode, the second electrode and the third electrode being spaced apart from each other;
- a fourth electrode on the first electrode, the fourth electrode overlapping the first electrode, the second electrode, and the third electrode;
- a fifth electrode on the fourth electrode and overlapping the fourth electrode, the fifth electrode being electrically connected to the first electrode; and
- a sixth electrode on the fifth electrode and overlapping the fifth electrode, the sixth electrode being electrically connected to the fourth electrode for receiving a same voltage.

9. The display apparatus of claim 8, wherein
- the second electrode is connected to a first driving voltage line configured to provide a voltage of a first level; and
- the third electrode is connected to a second driving voltage line configured to provide a voltage of a second level lower than the first level.

10. The display apparatus of claim 9, further comprising:
- a thin-film transistor including a semiconductor layer and a gate electrode, the first electrode being connected to the gate electrode, and the fourth electrode being connected to the semiconductor layer.

11. The display apparatus of claim 10, wherein the semiconductor layer on a layer between the fourth electrode and the fifth electrode.

12. The display apparatus of claim 8, wherein an area of the second electrode overlapping the fourth electrode is different from an area of the third electrode overlapping the fourth electrode.

13. The display apparatus of claim 9, further comprising:
- a seventh electrode and an eighth electrode in the second circuit area and spaced apart from each other;
- a ninth electrode on the seventh electrode, the ninth electrode overlapping the seventh electrode and the eighth electrode;
- a tenth electrode on the ninth electrode and overlapping the ninth electrode, the tenth electrode being electrically connected to the seventh electrode; and
- an eleventh electrode on the tenth electrode and overlapping the tenth electrode, the eleventh electrode being electrically connected to the ninth electrode.

14. The display apparatus of claim 13, wherein
- the seventh electrode is connected to the second electrode; and
- the eighth electrode is connected to the third electrode.

15. The display apparatus of claim 13, wherein
- the ninth electrode and the fourth electrode are disposed on a same layer;
- the tenth electrode and the fifth electrode are disposed on a same layer; and
- the eleventh electrode and the sixth electrode are disposed on a same layer.

16. The display apparatus of claim 15, wherein
- an area of the seventh electrode overlapping the ninth electrode is different from an area of the second electrode overlapping the fourth electrode; and
- an area of the eighth electrode overlapping the ninth electrode is different from an area of the third electrode overlapping the fourth electrode.

17. A display apparatus comprising:
- a plurality of pixels, each of the plurality of pixels including,
  - a light-emitting diode including a pixel electrode and an opposite electrode overlapping the pixel electrode,
  - a driving transistor including a semiconductor layer, the semiconductor layer including a first end portion electrically connected to a first driving voltage line and a second end portion electrically connected to the pixel electrode, a first capacitor electrically connected to the second end portion and a gate electrode of the driving transistor, a second capacitor electrically connected to the first driving voltage line and the second end portion, a third capacitor electrically connected to a second driving voltage line and the second end portion, the second driving voltage line being electrically connected to the opposite electrode, and at least one of, a first control transistor configured to control an electrical connection of the second capacitor between the first capacitor and the first driving voltage line, or a second control transistor configured to control an electrical connection of the third capacitor between the first capacitor and the second driving voltage line.

18. The display apparatus of claim 17, wherein the plurality of pixels include a first pixel configured to emit light of a first color and a second pixel configured to emit light of a second color;

a capacitance of the first capacitor of the first pixel is different from a capacitance of the first capacitor of the second pixel;

a capacitance of the second capacitor of the first pixel is different from a capacitance of the second capacitor of the second pixel; and a capacitance of the third capacitor of the first pixel is different from a capacitance of the third capacitor of the second pixel.

19. The display apparatus of claim 17, wherein at least one of the second capacitor or the third capacitor includes a plurality of sub-capacitors connected in series.

20. The display apparatus of claim 17, wherein at least one of the second capacitor or the third capacitor includes a plurality of sub-capacitors connected in parallel.

* * * * *